(12) United States Patent
Hamamoto

(10) Patent No.: US 7,123,093 B2
(45) Date of Patent: Oct. 17, 2006

(54) SEMICONDUCTOR INTEGRATED CIRCUIT

(75) Inventor: Takashi Hamamoto, Osaka (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 28 days.

(21) Appl. No.: 10/911,530

(22) Filed: Aug. 5, 2004

(65) Prior Publication Data

US 2005/0179490 A1 Aug. 18, 2005

(30) Foreign Application Priority Data

Feb. 13, 2004 (JP) .............................. 2004-036659

(51) Int. Cl.
*H03F 3/45* (2006.01)
(52) U.S. Cl. ...................... 330/253; 330/307; 330/310
(58) Field of Classification Search ................ 330/253, 330/261, 310; 327/359
See application file for complete search history.

(56) References Cited

U.S. PATENT DOCUMENTS 5,652,545 A * 7/1997 Miyashita et al. .......... 330/253

FOREIGN PATENT DOCUMENTS

JP 03-278110 12/1991

* cited by examiner

*Primary Examiner*—Khanh Van Nguyen
(74) *Attorney, Agent, or Firm*—Nixon Peabody LLP; Donald R. Studebaker

(57) ABSTRACT

The output of a differential amplifier circuit group (PA) that amplifies signals inputted to input PINs is connected to a final-stage differential amplifier circuit (PAn). The output of the differential amplifier circuit (PAn) is connected to a detection (DET) circuit. A detect signal sent from the DET circuit is outputted to the (−) side input of a comparator. A bias signal (BP) outputted from a bias circuit is inputted to the base of a PMOS transistor of a source follower circuit. An output signal (SFOUT) outputted from a source terminal thereof is inputted to the (+) side input of the comparator. A result of comparison between the bias signal (BP) and the output signal (SFOUT) is outputted from the comparator as an output signal (COMPOUT).

4 Claims, 25 Drawing Sheets

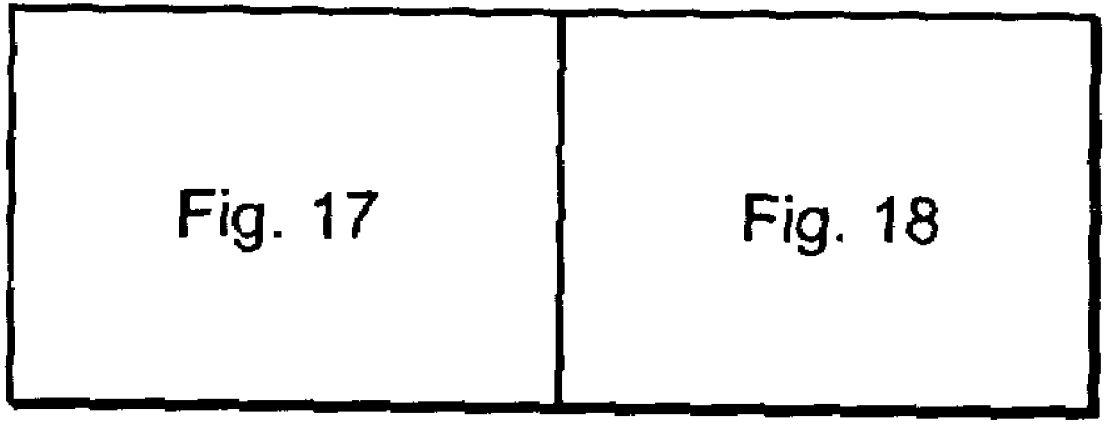 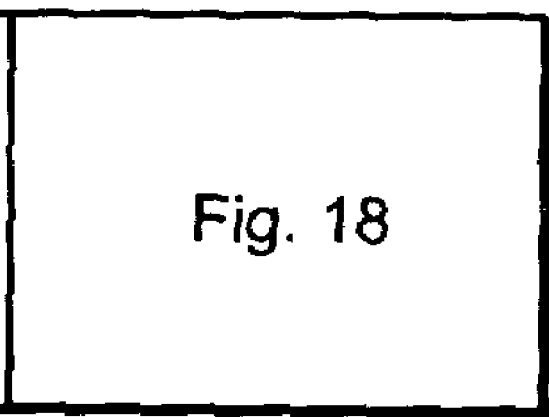

| Fig. 23 | Fig. 24 |

Fig. 25

SEMICONDUCTOR INTEGRATED CIRCUIT

BACKGROUND OF THE INVENTION

1. Field of the Invention

The present invention relates to a semiconductor integrated circuit including differential amplifying means for amplifying input signals.

This application is counterpart of Japanese patent application, Serial Number 36659/2004, filed Feb. 13, 2004, the subject matter of which is incorporated herein by reference.

2. Description of the Related Art

A configuration of a differential amplifier circuit having a conventional constitution will be explained with reference to FIG. 13. The circuit 1300 shown in the same figure includes a differential amplifier circuit group 1310 and a final-stage differential amplifier circuit 1320, a detection (DET) circuit 1330 that detects an output 1320 of the differential amplifier circuit, and a bias circuit 1340. The output of the bias circuit 1340 is connected to a comparator 1350.

The differential amplifier circuit group 1310 is a circuit group in which a circuit similar to the differential amplifier circuit 1320 is included thereinside and connected in plural form. Therefore, an internal configuration of the differential amplifier circuit 1320 will be described. In the differential amplifier circuit 1320, a constant current circuit (PTn) connected to a power supply VDD is connected to respective source terminals of a PMOS transistor P(n1) and a PMOS transistor P(n2). Drain terminals of these transistors are connected to a ground GND via a resistor PR(n1) and a resistor PR(n2) respectively. Incidentally, "n" indicates the whole number indicative of the number of connecting stages of the differential amplifier circuits 1320.

An input PIN(1) or an output P0(n1) from a pre-stage circuit is connected to the PMOS transistor P(n1) and an input PIN(2) or an output P0(n2) from a pre-stage circuit is connected to the PMOS transistor P(n2).

Connecting points of the drain terminals of the PMOS transistors P(n1) and P(n2) and the resistors PR(n1) and PR(n2) respectively form the outputs P0(n1) and P0(n2) of each differential amplifier circuit and are connected to the input of the nest-stage differential amplifier circuit. An output P0(n2) of the differential amplifier circuit placed in the final stage is connected to the detection circuit 1330.

In the detection (DET) circuit 1330, a source follower circuit is formed by both a constant current circuit (PT) 1332 connected to the power supply VDD, and a PMOS transistor 1334 having a source terminal to which the constant current circuit (PT) 1332 is connected, a gate terminal to which the output signal P0(n2) of the differential amplifier circuit PAn is connected and a drain terminal connected to the ground GND. An output 1336 for outputting a detect signal DET is outputted from the source terminal of the PMOS transistor 1334. Also the output 1336 is connected to the ground GND via a condenser 1338. The output (DET) 1336 of the detection circuit 1330 is connected to the comparator 1350.

The bias circuit 1340 includes a constant current circuit 1342 connected to the power supply VDD and a resistor 1344 connected between the output of the constant current circuit 1342 and the ground GND. The bias circuit 1340 outputs a bias signal BP from a connecting point 1346 at which the potential is determined by a current value of the constant current circuit 1342 and the resistance value of the resistor 1344. The bias signal BP is sent to the comparator 1350 where it serves as a reference potential of the comparator 1350. In the comparator 1350, the bias signal BP of the bias circuit 1340 is inputted to the input thereof on the plus (+) side, and the output signal DET of the DET circuit 1330 is inputted to the input thereof on the minus (−) side. The comparator 1350 compares these inputs and outputs an output signal (COMPOUT) to an output 1360.

A circuit, which comprises these differential amplifier circuit group (PA) 1310, differential amplifier circuit (PAn) 1320, detection (DET) circuit 1330, bias circuit 1340 and comparator 1350, has the relationship of a positive phase and a negative phase with respect to the input PIN(1) and the input PIN(2). When an amplitude-modulated signal is inputted thereto, output signals (P0n1) and (P0n2) amplified by the differential amplifier circuit group (PA) 1310 and the differential amplifier circuit (PAn) 1320 are outputted. The output signal (P0n2) delivered from the detection (DET) circuit 1330 is peak-detected on the amplitude Low side by the source follower circuit of the detection (DET) circuit 1330 and the condenser 1338 thereof, followed by demodulation. The demodulated signal is sent to the comparator 1350 as a detect signal (DET). The bias circuit 1340 generates a bias-signal (BP) corresponding to an intermediate potential between an "H" signal of the detect signal (DET) and an "L" signal thereof and supplies it to the comparator 1350. In the comparator 1350, a signal antiphase to the detect signal (DET) is brought to a signal between the power supply VDD and the ground GND.

A conventional configuration of a differential amplifier circuit shown in FIGS. 14 and 15 made use of a configuration wherein a plurality of differential amplifier circuits PA1 through PAn (where n: the number of connecting stages of differential amplifier circuits) were connected and a final-stage differential amplifier circuit was connected to an automatic gain control (AGC) circuit. Incidentally, both figures are combined together as shown in FIG. 16.

Described specifically, the differential amplifier circuits PA1, PA2, . . . , PAn respectively include PMOS transistors (Pn) each having a source terminal to which a power supply VDD is connected and a gate terminal to which a bias signal input (PB) 1410 is connected, and PMOS transistors (Pn1), (Pn2), (Pn3) and (Pn4) each having a source terminal to which a drain terminal of the PMOS transistor (Pn) is connected.

The drain terminals of the PMOS transistors (Pn1) and (Pn3) are interconnected with each other and connected to the ground GND via a resistor (PRn1). Also the drain terminals of the PMOS transistors (Pn1) and (Pn4) are interconnected with each other and connected to the ground GND via a resistor (PRn2). The gate terminals of the PMOS transistors (Pn3) and (Pn4) are interconnected with each other and connected with a connecting line 1420 for inputting an AGC signal.

The differential amplifier circuits PA1 through PAn configured of these PMOS transistors (P1(P2 through Pn)), (P11(P21 through Pn1)), (P12(P22 through Pn2)), (P13(P23 through Pn3)), (P14(P24 through Pn4)) and resistors (PR11 (PR21 through PRn1)) and (PR12(PR22 through PRn2)) output outputs P011(P021 through P0n1) from nodes to which the drain terminals of the PMOS transistors (P11(P21 through Pn1)) and (P13(P23 through Pn3)) are connected, and output outputs P012(P022 through P0n2) from nodes to which the drain terminals of the PMOS transistors (P12(P22 through Pn2)) and (P14(P24 through Pn4)) are connected, respectively.

An input PIN(1) for inputting an input signal PIN(1) is connected to the gate of the PMOS transistor (P11) of the first-stage differential amplifier circuit PA1. An input PIN(2) for inputting an input signal PIN(2) is connected to the gate terminal of the PMOS transistor (P12).

Outputs P0l1 through P0(n-1)1 of the pre-stage differential amplifier circuits are connected to their corresponding gate terminals of the PMOS transistors (P21) through (Pn1) of the second-stage and later differential amplifier circuits PA2 through PAn. Outputs P0l2 through P0(n-1)2 of the pre-stage differential amplifier circuits are connected to their corresponding gate terminals of the PMOS transistors (P22) through (Pn2). An output signal P0n2 outputted from the output of the final-stage differential amplifier circuit PAn is inputted to the AGC circuit 1430.

The automatic gain control (AGC) circuit 1430 includes a PMOS transistor 1432 having a source terminal to which the power supply VDD is connected and a gate terminal to which a bias signal input (PB) is connected, and a PMOS transistor 1434 connected to a drain terminal of the PMOS transistor 1432. The output P0n2 of the differential amplifier circuit PAn is connected to its corresponding gate terminal of the PMS transistor 1434, and its drain terminal is connected to the ground.

A node at which the drain terminal of the PMOS transistor 1432 and the source terminal of the PMOS transistor 1434 are connected, constitutes an output 1440 that outputs a gain control signal (AGC). The output 1440 is also connected to the ground GND via a condenser 1450. The gain control signal (AGC) outputted to the output 1440 is supplied to the respective differential amplifier circuits PA1 through PAn.

In the circuit comprising these differential amplifier circuits PA1 through PAn and the AGC circuit 1430, a sine wave is inputted to the input PIN(1) and a sine wave antiphase to that at the input PIN(1) is inputted to the input PIN(2). A signal amplified by each of the differential amplifier circuits PA1 through PAn is transmitted to the AGC circuit 1430 as an output signal P0n2 of the final-stage differential amplifier circuit PAn. The output signal P0n2 is inputted to the gate terminal of the PMOS transistor 1434 of the AGC circuit 1430 and raised by a VT potential of the PMOS transistor. The Low-side peak of the amplified sine wave is detected by the condenser 1450 so that a gain control signal (AGC) is outputted. The gain control signal (ABC) is inputted to the gate terminals of the PMOS transistors (P13(P23 through Pn3)) and (P14(P24 through Pn4)) of the differential amplifier circuits PA1(PA2 through PAn), respectively.

When the potential of the gain control signal (AGC) is sufficiently higher than the potentials of the signals inputted to the gate terminals of the PMOS transistors (P11(P21 through Pn1)) and (P12(P22 through Pn2)) in the differential amplifier circuits PA1(PA2 through PAn), the currents equivalent to ½ of current values defined by the PMOS transistors (P1(P2 through Pn)) respectively flow into the PMOS transistors (P11(P21 through Pn1)) and (P12(P22 through Pn2)). The gains and potentials of the output signals P0l1(P021 through P0n1) and P0l2(P022 through P0n2) are respectively determined based on the current values of the PMOS transistors (P11(P21 through Pn1)) and (P12(P22 through Pn2)) and the resistance values of the resistors (PR11(PR21 through PRn1)) and (PR12(PR22 through PRn2).

When the gain control signal (AGC) becomes low, the current flows into each of the PMOS transistors (P13(P23 through Pn3)) and (P14(P24 through Pn4)). Therefore, the currents that flow through the PMOS transistors (P11(P21 through Pn1)) and (P12(P22 through Pn2)) become small and hence the gains of the output signals P0l1(P021 through P0n1) and P0l2(P022 through P0n2) become low. At this time, their output potentials remain unchanged.

Thus, when the amplitudes of the input signal PIN(1) and the input signal PIN(2) has changed, the potential of the gain control signal (AGC) varied correspondingly, thereby changing the gains of the differential amplifier circuits PA1 through PAn, whereby a stable output signal could be obtained.

Patent Document 1

Japanese Unexamined Patent Publication No. Hei 3(1991)-278110

In such a conventional circuit configuration shown in FIG. 13, however, when, for example, the total gain of the differential amplifier circuits of n stages is 80 [dB] and a very small ASK-modulated wave which is 30 [μV] at the maximum amplitude and 3 [μV] at the minimum amplitude with respect to each of the input PIN(1) and the input PIN(2), is inputted, a signal amplified to a maximum amplitude of 300 [mV] and a minimum amplitude of 30 [mV] is outputted to the output P0n2 of the differential amplifier circuit (PAn). In this case, the output signal P0n2 sent to the detection (DET) circuit 1330 is peak-detected by the source follower circuit and the condenser 1338 and raised by the VT potential of the PMOS transistor 1334, after which it is demodulated into a signal having an amplitude of 135 [mV], which in turn is outputted as a detect signal (DET).

In the bias circuit 1340, the current value of the constant current circuit 1342 and the resistor 1344 are set in such a manner that an intermediate potential of the amplitude 135 [mV] of the detect signal DET is reached, whereby a bias (BP) signal is outputted. When, at this time, a VT variation range of the PMOS transistor is ±100 [mV], for example, the VT potential of the PMOS transistor 1334 varies. Therefore, the DET signal of the detection (DET) circuit 1330 is affected by the VT variations and hence the output potential of the DET signal varies within the range of ±100 [mV].

On the other hand, since the output signal of the bias circuit 1340 is not affected by the VT variations of the PMOS transistor, the output signal results in a constant value even where the VT variations of the PMOS transistor take place.

A problem arises in that the detect signal (DET) varies within the range of ±100 [mV] when the VT variations take place in these ways, whereas since the amplitude of the detect signal (DET) is 135 [mV], the bias (BP) signal does not fall into the middle of the amplitude of the detect signal (DET) so that the output signal (CMPOUT) of the comparator 1350 can not provide or reach an expected value.

In the circuit configuration of the prior art shown in FIGS. 14 and 15, the output voltage of each of the differential amplifier circuits PA1 (PA2 through PAn) remains unchanged where the VT value of the PMOS transistor varies, whereas the potential of the gain control signal (AGC) changes by the VT variations as a result of the PMOS transistor 1434 provided within the AGC circuit 1430 being affected by the VT variations. Therefore, a problem arises in that when the VT variations of the PMOS transistor take place, the gain of each of the differential amplifier circuits PA1 (PA2 through PAn) inputted with the gain control signal AGC changes, so that a stable output signal is not obtained.

SUMMARY OF THE INVENTION

The present invention aims to provide a semiconductor integrated circuit capable of resolving the drawbacks of such a prior art and obtaining a stable output signal regardless of the influence of VT variations.

According to one aspect of the present invention, for achieving the above object, there is provided a semiconductor integrated circuit, comprising:

a plurality of differential amplifier circuits which amplify input signals, the differential amplifier circuits being connected in series respectively;

a detection which detects an output signal outputted from the final-stage differential amplifier circuit of the plurality of differential amplifier circuits and outputs a detect signal therefrom;

a bias circuit which generates a bias signal;

a source follower circuit which inputs the bias signal and outputs a signal for compensating for a variation in threshold value of the detection circuit; and a comparator which compares the detect signal outputted from the detection circuit and the output signal of the source follower circuit.

In this case, preferably, the detection circuit includes a first constant current source circuit and a first transistor both series-connected between a power supply node and a ground node via a first common connecting node, a capacitive element is connected between the first common connecting node and the ground node, the first common connecting node forms the output of the detection circuit and outputs the detect signal, the output signal of the final-stage differential amplifier circuit is supplied to the first transistor, and the source follower circuit includes a second constant current source circuit and a second transistor of the same conduction type as that of the first transistor, which are connected in series between the power supply node and the ground node via a second common connecting node, and the second common connecting node forms the output of the source follower circuit and outputs an output signal to the comparator.

Further, in this case, preferably, the first constant current source circuit is connected between the power supply node and the first common connecting node, the first transistor is a P channel type MOS transistor having a first control electrode supplied with the output signal of the final-stage differential amplifier circuit, a first electrode connected to the first common connecting node, and a second electrode connected to the ground node, the second constant current source circuit is connected between the power supply node and the second common connecting node, and the second transistor is a P channel type MOS transistor having a second control electrode supplied with the bias signal, a third electrode connected to the second common connecting node and a fourth electrode connected to the ground node. More preferably, the first constant current source circuit is connected between the ground node and the first common connecting node, the first transistor is an N channel type MOS transistor having a third control electrode supplied with the output signal of the final-stage differential amplifier circuit, a fifth electrode connected to the first common connecting node and a sixth electrode connected to the power supply node, the second constant current source circuit is connected between the ground node and the second common connecting node, and the second transistor is an N channel type MOS transistor having a fourth control electrode supplied with the bias signal, a seventh electrode connected to the second common connecting node and an eighth electrode connected to the power supply node.

According to another aspect of the present invention, for achieving the above object, there is provided a semiconductor integrated circuit having a plurality of differential amplifier circuits arranged therein, comprising:

a plurality of the differential amplifier circuits which amplify input signals;

a detection circuit which is connected to an output of the final-stage differential amplifier circuit of the plurality of differential amplifier circuits and detects a signal outputted from the output thereof;

a reference potential circuit which is connected to the output of the final-stage differential amplifier circuit and outputs a reference signal for compensating for a variation in threshold value; and a comparator which compares the output signal of the detection circuit and the output signal of the reference potential circuit.

In this case, the plurality of differential amplifier circuits, the detection circuit and the reference potential circuit may preferably be formed of P channel type MOS transistors respectively. The plurality of differential amplifier circuits, the detection circuit and the reference potential circuit may preferably be formed of N channel type MOS transistors respectively. Preferably, the detection circuit is connected to a first output of the final-stage differential amplifier circuit and detects a signal outputted from the first output thereof, and the reference potential circuit is connected to a second output of the final-stage differential amplifier circuit and outputs the reference signal, based on a signal outputted from the second output thereof.

Preferably, the detection circuit is connected to a second output of the final-stage differential amplifier circuit and detects a signal outputted from the second output thereof, and the reference potential circuit is connected to the second output of the final-stage differential amplifier circuit and outputs the reference signal, based on a signal outputted from the second output.

Preferably, the output of the final-stage differential amplifier circuit is further divided into a third output and a fourth output, the detection circuit is connected to the third output and detects a signal outputted from the third output, and the reference potential circuit is connected to the fourth output and outputs the reference signal, based on a signal outputted from the fourth output.

Preferably, the output of the final-stage differential amplifier circuit is further divided into a third output and a fourth output, the detection circuit is connected to the third output and detects a signal outputted from the third output, and the reference potential circuit is connected to the first output of the final-stage differential amplifier circuit and outputs the reference signal, based on a signal outputted from the first output.

According to a further aspect of the present invention, for achieving the above object, there is provided a semiconductor integrated circuit, comprising:

a plurality of differential amplifier circuits;

a plurality of gain stabilizing circuits which are respectively connected to inputs of the plurality of differential amplifier circuits and output output signals corresponding to input signals to the differential amplifier circuits; and gain control means which is connected to the final-stage differential amplifier circuit of the plurality of differential amplifier circuits and outputs a gain control signal for controlling gains of the plurality of differential amplifier circuits to the plurality of differential amplifier circuits, wherein the plurality of gain stabilizing circuits respectively output threshold-varied outputs to the plurality of differential amplifier circuits in a manner similar to a threshold variation in the gain control signal, and wherein the plurality of differential amplifier circuits respectively amplify the outputs of the gain stabilizing circuits in accordance with the gain control signal.

In this case, the plurality of differential amplifier circuits, the plurality of gain stabilizing circuits and the gain control circuit preferably comprise P channel type MOS transistors respectively. The plurality of differential amplifier circuits, the plurality of gain stabilizing circuits and the gain control circuit preferably comprise N channel type MOS transistors respectively.

According to a still further aspect of the present invention, for achieving the above object, there is provided a semiconductor integrated circuit, comprising:

an amplifying section including differential amplifier circuits, which amplifies and outputs a first difference input signal comprising a first signal and a second signal; and a gain control circuit which outputs a gain control signal for controlling gains of the differential amplifier circuits to the differential amplifier circuits, wherein the amplifying section includes gain stabilizing circuits each of which outputs the first difference input signal for stabilizing the gain of the differential amplifier circuit to a predetermined value in accordance with a second difference input signal comprising a third signal and a fourth signal.

In this case, preferably, each of the gain stabilizing circuits includes a first constant current circuit and a first transistor series-connected between a power supply node and a ground node via a first common connecting node, and a second constant current circuit and a second transistor series-connected between the power supply node and the ground node via a second common connecting node. Preferably, the gain control circuit includes a third constant current circuit and a third transistor series-connected between the power supply node and the ground node via a third common connecting node, and a capacitive element connected between the third common connecting node and the ground node.

Preferably, the first transistor is a P channel type MOS transistor having a first control electrode supplied with the third signal, a first electrode connected to the first common connecting node and a second electrode connected to the ground node, the second transistor is a P channel type MOS transistor having a second control electrode supplied with the fourth signal, a first electrode connected to the second common connecting node and a second electrode connected to the ground node, and the third transistor is a P channel type MOS transistor having a third control electrode connected to the corresponding differential amplifier circuit, a third electrode connected to the third common connecting node of the gain control circuit and a fourth electrode connected to the ground node.

Preferably, the first transistor is an N channel type MOS transistor having a third control electrode supplied with the third signal, a fifth electrode connected to the first common connecting node and a sixth electrode connected to the power supply node, the second transistor is an N channel type MOS transistor having a fourth control electrode supplied with the fourth signal, a seventh electrode connected to the second common connecting node and an eighth electrode connected to the power supply node, and the third transistor is an N channel type MOS transistor having a fifth control electrode connected to the corresponding differential amplifier circuit, a ninth electrode connected to the third common connecting node of the gain control circuit and a tenth electrode connected to the power supply node. Preferably, the semiconductor integrated circuit is configured such that the amplifying section is connected in series in plural form.

Even when, for example, a variation in the threshold of a transistor occurs in a semiconductor integrated circuit, the output of comparing means can provide or bring about an expected value. Further, gain stabilizing circuits, differential amplifier circuits inputted with a gain control signal and a gain control circuit compensate for the variation in the threshold to thereby obtain or provide a stable output signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 19 is a diagram showing a combined state of FIGS. 17 and 18;

FIG. 25 is a diagram showing a combined state of FIGS. 23 and 24;

DETAILED DESCRIPTION OF THE PREFERRED EMBODIMENTS

Figure 1:
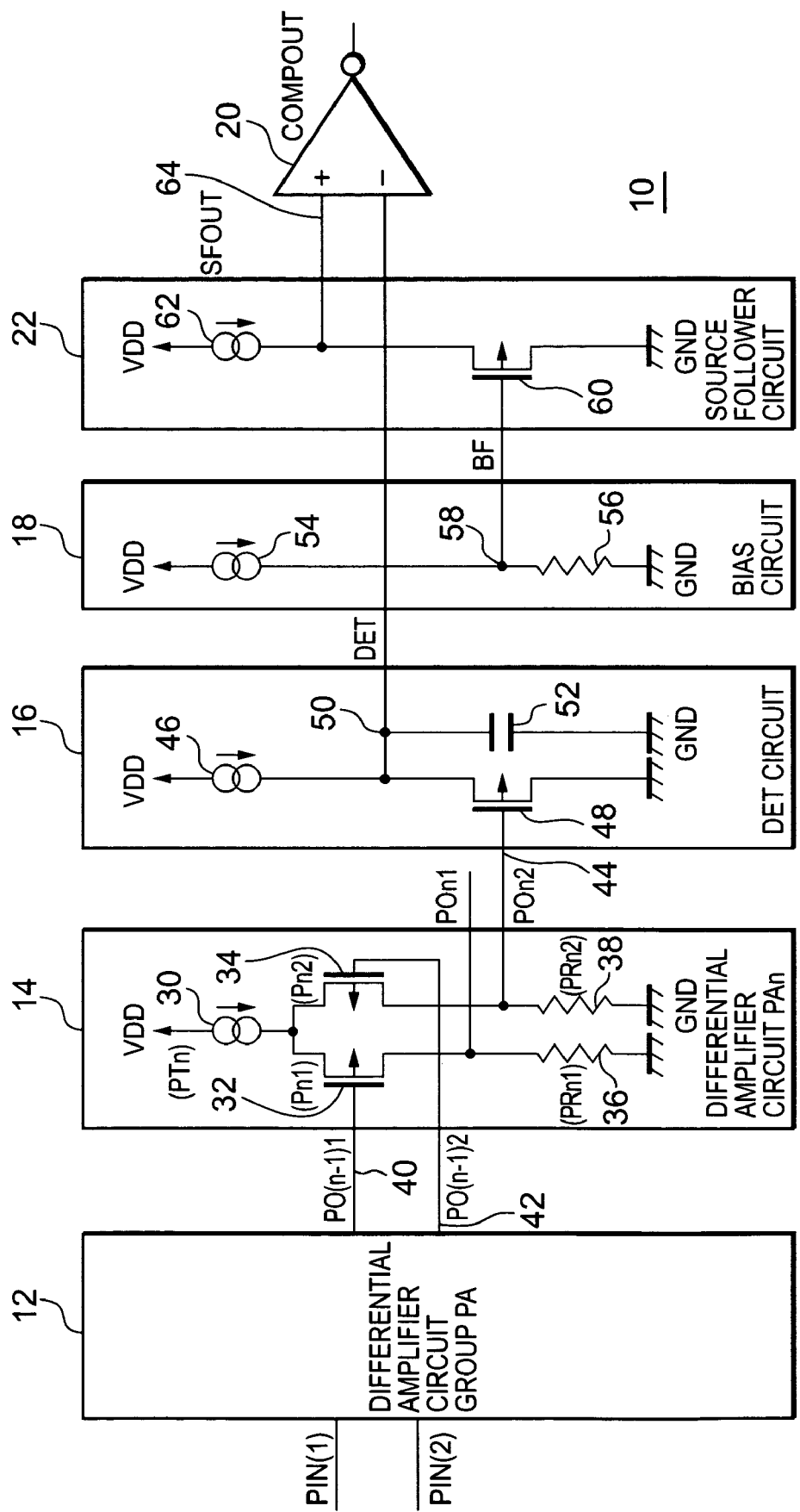
FIG. 1 is a circuit diagram showing an embodiment of a semiconductor integrated circuit to which the present invention is applied.

Preferred embodiments of semiconductor integrated circuits according to the present invention will hereinafter be described in detail with reference to the accompanying drawings. Referring to FIG. 1, a semiconductor integrated circuit 10 according to the present invention includes a differential amplifier circuit group (PA) 12 and a configuration provided with a source follower circuit 22, which includes a final stage differential amplifier circuit (PAn) 14, a detection (DET) circuit 16 connected to an output (P0n2) of the final stage differential amplifier circuit (PAn) 14, a bias circuit 18 and a comparator 20. Incidentally, the illustrations and description of sections directly unrelated to the present invention in the following description are omitted and reference numerals indicative of signals are respectively identified by reference numerals of connecting lines that appear in the figures.

Figure 2:
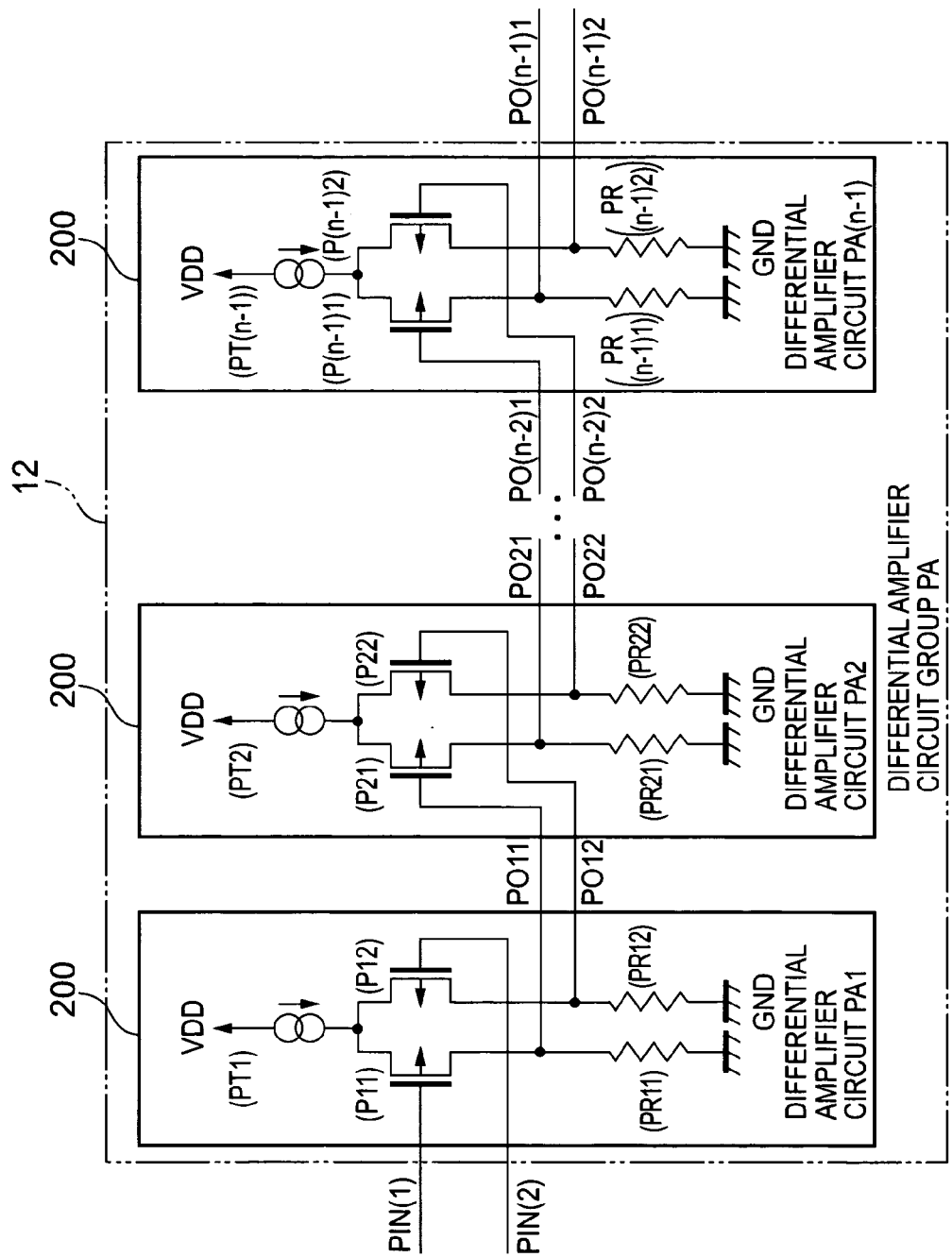
FIG. 2 is a circuit diagram illustrating a configurational example of a differential amplifier circuit group (PA) shown in FIG. 1.

As shown in FIG. 2, the differential amplifier circuit group (PA) 12 is a circuit group in which circuits (PA1 through PA(n-1)) each similar to the differential amplifier circuit 14 (see FIG. 1) are connected to one another with being included thereinside in plural form. Incidentally, "n" is a whole number indicative of the number of connecting stages in the differential amplifier circuit group (PA). As shown in FIG. 2, the plurality of differential amplifier circuits ((PA1) through (PA(n-1)) are provided within the differential amplifier circuit group (PA) 12. Each of the differential amplifier circuits ((PA1) through (PA(n-1)) 200 has an internal configuration similar to the differential amplifier circuit 14 shown in FIG. 1. Therefore, the differential amplifier circuit 14 (see FIG. 1) located at the final stage will be explained as a representative of the respective stages. In the differential amplifier circuit 14, a constant current circuit (PTn) 30 connected to a power supply VDD is connected to source terminals of a PMOS transistor P(n1) 32 and a PMOS transistor P(n2) 34 both formed in a P-type MOS configuration. The drains of these transistors are respectively connected to a ground GND via a resistor PR(n1) 36 and a resistor PR(n2) 38. An output P0n(n-1) 40 from the previous stage circuit is connected to the PMOS transistor P(n1) 32, and an output P0(n2) 42 from the previous stage circuit is connected to the PMOS transistor P(n2) 34.

Points where the drain terminals of the PMOS transistors P(n1) 32 and P(n2) 34 and the resistors PR(n1) 36 and PR(n2) 38 are respectively connected to one another, respectively form outputs P0(n1) and P0(n2) of each individual differential amplifier circuit and are connected to their corresponding inputs of the next-stage differential amplifier circuit. An output P0(n2) 44 of the differential amplifier circuit 14 laid out at the final stage is connected to the detection (DET) circuit 16.

The detection (DET) circuit 16 includes a source follower circuit configured of a constant current circuit (PT) 46 connected to the power supply VDD, and a PMOS transistor 48 having a source terminal to which the constant current circuit (PT) 46 is connected, a gate terminal to which the output P0(n2) 44 is connected, and a drain terminal connected to the ground GND. An output 50 used to output a detect signal (DET) from the source terminal of the PMOS transistor 48 is formed. The output (DET) 50 is connected to the ground GND via a condenser 52. Further, the output (DET) 50 is connected to the input on the minus (−) side of the comparator 20.

The bias circuit 18 includes a constant current circuit 54 connected to the power supply VDD and a resistor 56 connected between the output of the constant current circuit 54 and the ground GND. The bias circuit 18 outputs a bias signal (BP) from a connecting point 58 at which the potential is determined by a current value of the constant current circuit 54 and a resistance value of the resistor 56. The output 50 of the bias signal (BP) is connected to a gate terminal of a PMOS transistor 60 disposed within the source follower circuit 22.

The PMOS transistor 60 provided within the source follower circuit 22 includes a source terminal to which a constant current circuit 62 connected to the power supply VDD is connected, and a drain terminal connected to the ground GND. The source terminal of the PMOS transistor 60 is connected to the input on the plus (+) side of the comparator 20, and an output signal (SFOUT) 64 is supplied to the comparator 20. The comparator 20 compares these inputs and outputs an output signal (COMPOUT) to an output 1360.

A circuit, which comprises these differential amplifier circuit group (PA) 12, differential amplifier circuit (PAn) 14, detection (DET) circuit 16, bias circuit 18 and comparator 20, has the relationship of a positive phase and a negative phase with respect to an input PIN(1) and an input PIN(2). When an amplitude-modulated signal is inputted thereto, output signals (P0n1) and (P0n2) amplified by the differential amplifier circuit group (PA) 12 and the differential amplifier circuit (PAn) 14 are outputted. The output signal (P0n2) delivered from the detection (DET) circuit 16 is peak-detected on the amplitude Low side by the source follower circuit of the detection (DET) circuit 16 and the condenser 52 thereof, followed by demodulation. The demodulated signal is sent to the comparator 20 as a detect signal (DET). The bias circuit 18 generates a bias signal (BP) corresponding to an intermediate potential between an "H" signal of the detect signal (DET) and an "L" signal thereof and supplies it to the source follower circuit 22.

When, for example, the total gain of the differential amplifier circuit group (PA) 12 and the differential amplifier circuit (PAn) 14 is set as 80 [dB], an ASK-modulated sine wave having a maximum amplitude of 30 [μV] and a minimum amplitude of 3 [μV] is inputted to the input PIN(1), and a signal antiphase to the signal at the input PIN(1) is inputted to the input PIN(2) under the above configuration, a signal waveform amplified to a maximum amplitude of 300 [mV] and a minimum amplitude of 30 [mV] is outputted as the output signal (P0n2) 44 of the differential amplifier circuit (PAn). The output signal (P0n2) is inputted to the gate terminal of the PMOS transistor 48 of the detection (DET) circuit 16.

Owing to the source follower circuit of the detection (DET) circuit 16 and the condenser 52 thereof, the output signal (P0n2) is raised by a VT potential of the PMOS transistor 48 and demodulated into a signal having an amplitude of 135 [mV], which in turn is outputted as the detect signal (DET) 50. At this time, the output potential of the detect signal (DET) 50 results in the output signal (P0n2) 44 of the differential amplifier circuit (PAn) 14, i.e., ((gate potential of PMOS transistor 48)+(VT voltage of PMOS transistor)). The detect signal (DET) is inputted to the input on the minus (−) side of the comparator 20.

The potential of an output signal (BP) 58 of the bias circuit 18 is determined by the current value of the constant current circuit 54 and the resistance value of the resistor 56. The output signal is transmitted to the source follower circuit 22. The signal (BP) 58 sent to the source follower circuit 22 is raised by a VT potential of the PMOS transistor 60 and outputted as an SFOUT signal, followed by being inputted to the input on the plus (+) side of the comparator 20. At this time, the bias circuit 18 and the source follower circuit 22 are configured in such a manner that the output signal (SFOUT) 64 of the source follower circuit 22 reaches the middle of the amplitude 135 [mV] of the detect signal (DET).

Therefore, the source follower circuit 22 and the source follower circuit of the detection (DET) circuit 16 are made identical in circuit configuration. The potential of the output signal (BP) of the bias circuit 18 is set so as to reach, for example, a potential reduced by 67.5 [mV] from the potential of the output signal (P0n2) 44 of the differential amplifier circuit (PAn) 14. When the current value of the constant current circuit (PTn) 30 of the differential amplifier circuit (PAn) 14 is set to 1 [μA] and the current value of the constant current circuit 54 of the bias circuit 18 is set to 0.5 μA, the currents that flow through the resistor (PRn2) 38 of the differential amplifier circuit (PAn) 14 and the resistor 56 of the bias circuit 18 are both 0.5 [μA]. Since the potential of the output signal (P0n2) 44 of the differential amplifier circuit (PAn) 14 and the potential of the output signal (BP) of the bias circuit 18 are determined by the (current value× resistance value), the resistance value of the resistor 56 is set to (resistance value of resistor (PRn2) 38)−(135 kΩ)) in order to cause the potential of the output signal (BP) of the bias circuit 18 to reach the potential reduced by 67.5 [mV] from the potential of the output signal (P0n2) of the differential amplifier circuit (PAn) 14.

The output signal (DET) 50 of the detection (DET) circuit 16 and the output signal (SFOUT) 64 of the source follower circuit 22 are delivered to the comparator 20, where a signal antiphase to the detect signal (DET) results in a signal between the power supply VDD and the ground GND, which in turn is outputted as a COMPOUT signal.

That is, since the potential of the output signal (DET) of the detection (DET) circuit 16 is determined according to ((output signal (P0n2) 44 of differential amplifier circuit (PAn) 14)+(VT voltage of PMOS transistor)), and the potential of the output signal (SFOUT) 64 of the source follower circuit 22 is determined according to ((output signal (BP) 58 of bias circuit 18)+(VT voltage of PMOS transistor)), the output signal (DET) 50 of the detection (DET) circuit 16 and the output signal (SFOUT) 64 of the source follower circuit 22 are similarly affected by VT variations of the PMOS transistor even when the VT variations (threshold variation) of the PMOS transistor take place. Therefore, the output signal (SFOUT) 64 of the source follower circuit 22 is always brought to an intermediate value of the amplitude of the output signal (DET) 50 of the detection (DET) circuit 16 so that the output signal (COMPOUT) of the comparator 20 is compensated, thus making it possible to obtain an expected value.

As described above, the source follower circuit 22 is connected to the output 58 of the bias circuit and provided on the semiconductor integrated circuit. Thus, even when the VT variations of the PMOS transistor happens, the output signal (DET) 50 of the detection (DET) circuit 16 and the output signal (SFOUT) 64 of the source follower circuit 22 are both affected by similar VT variations. Therefore, the output signal (SFOUT) 64 of the source follower circuit 22 always reaches the intermediate value of the amplitude of the output signal (DET) 50 of the detection (DET) circuit 16. Even when the amplitude of the signal inputted to each of the input PIN(1) and PIN(2) is small, the output signal (COMPOUT) of the comparator 22 can provide or bring about an expected value.

Incidentally, the output (P0n2) 44 of the differential amplifier circuit (PAn) 14 is connected to the gate terminal of the PMOS transistor 48 provided in the detection (DET) circuit 16 in the present embodiment. However, the output P0n1 of the differential amplifier circuit (PAn) 14 may be connected to the gate terminal of the PMOS transistor 48 as an alternative to above.

Figure 3:
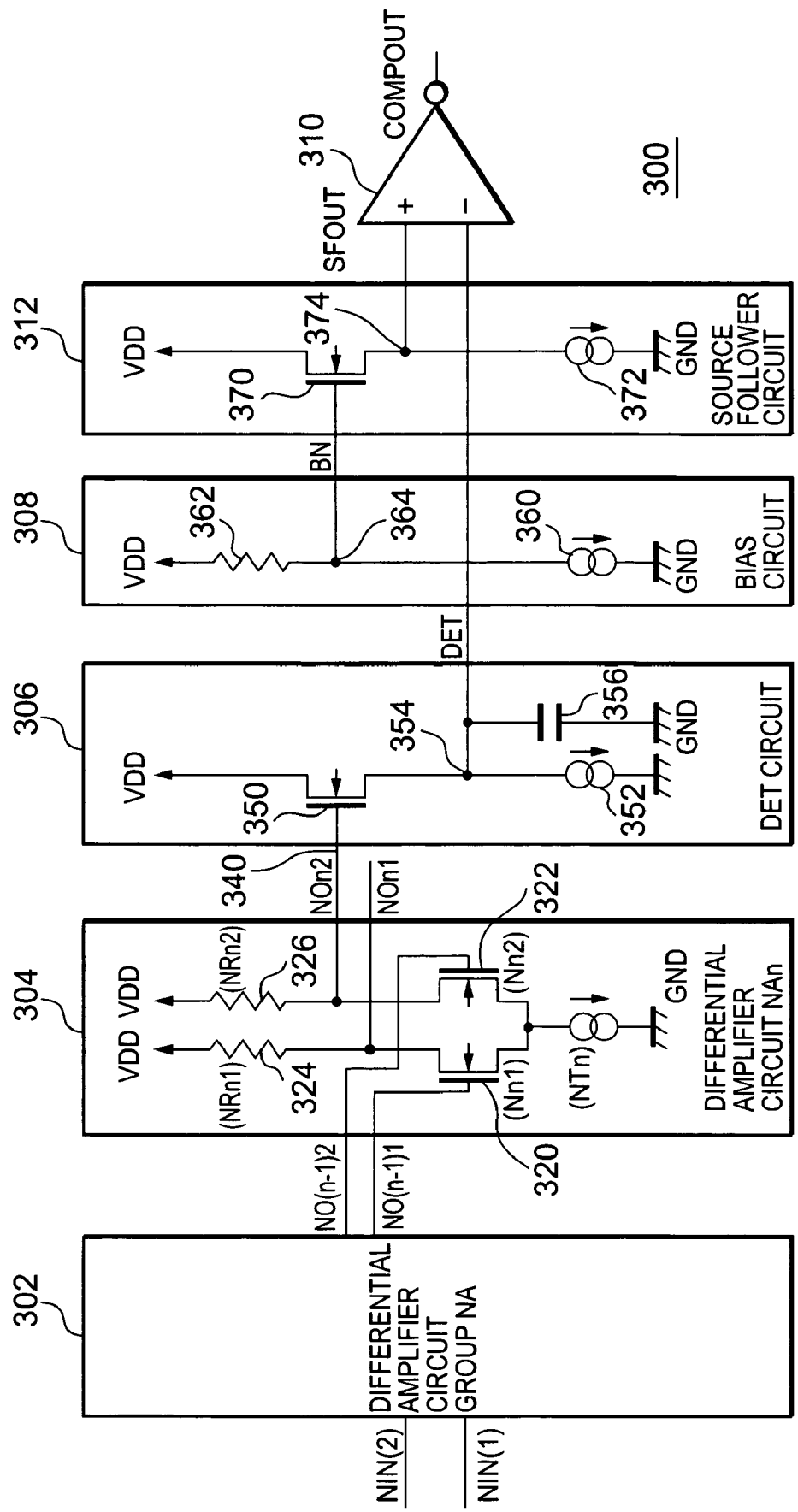
FIG. 3 is a circuit diagram depicting another embodiment of a semiconductor integrated circuit.

Another embodiment will next be explained with reference to FIG. 3. Referring to FIG. 3, a semiconductor integrated circuit 300 according to the present invention includes a differential amplifier circuit group (NA) 302 and a configuration provided with a source follower circuit 312, which includes a final stage differential amplifier circuit (NAn) 304, a detection (DET) circuit 306 connected to an output (N0n2) of the final stage differential amplifier circuit (NAn) 304, a bias circuit 308 and a comparator 310.

Figure 4:
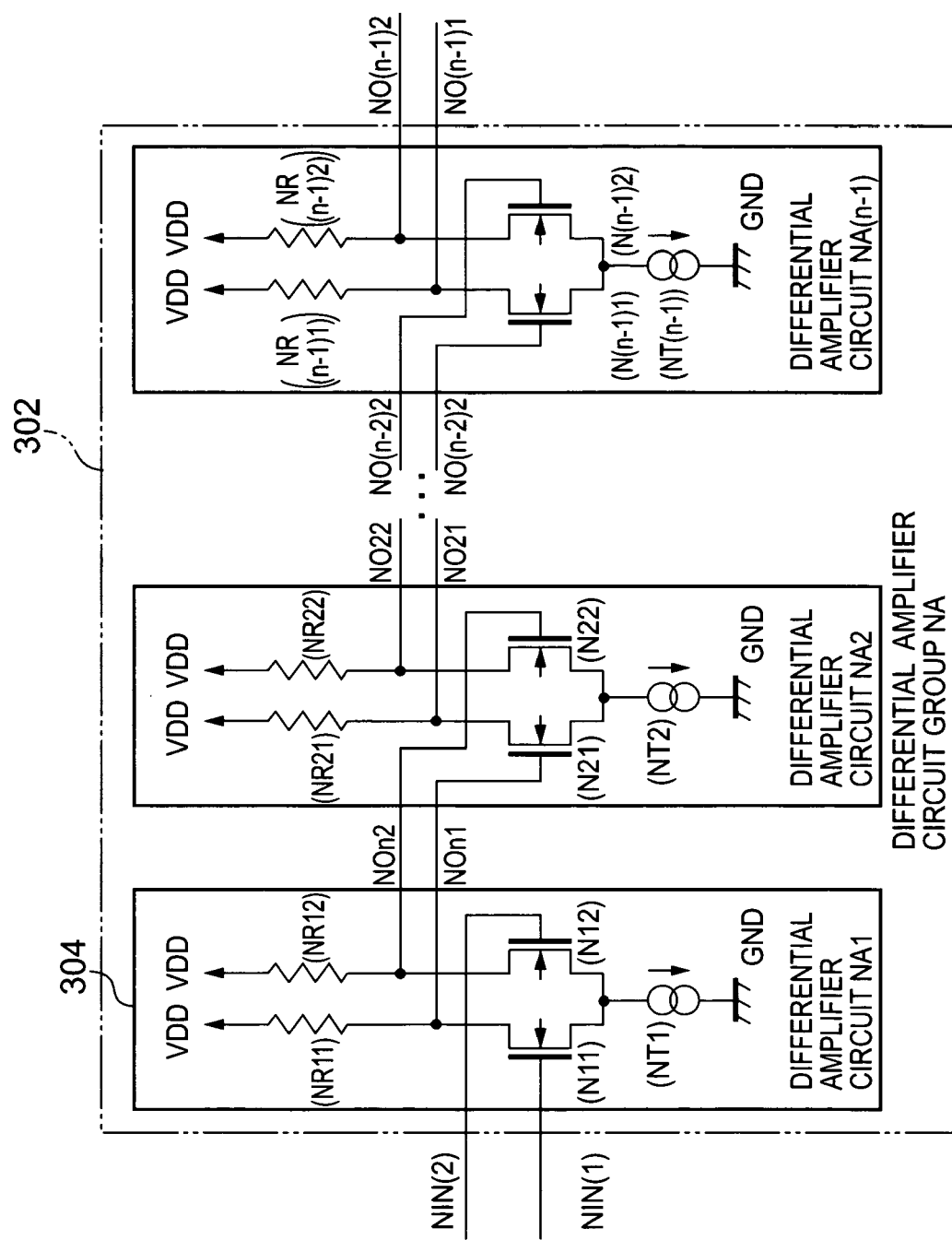
FIG. 4 is a circuit diagram showing a configurational example of a differential amplifier circuit group (NA) shown in FIG. 3.

The differential amplifier circuit group (NA) 302 according to the present embodiment includes a plurality of differential amplifier circuits (NA1) through (NA(n−1)) as its detained configuration is shown in FIG. 4. The differential amplifier circuits (NA1) through (NA(n-1)) are respectively similar in configuration and configured in a manner similar to the differential amplifier circuit (NAn) shown in FIG. 3. Therefore, the differential amplifier circuit (NA1) 304 will be explained. The differential amplifier circuit (NAn) 304 has a constant current circuit (NTn) of which one terminal is connected to a ground GND and the other terminal is connected to source terminals of NMOS transistors (Nn1) and (Nn2). Drain terminals of NMOS transistors N(n1) 320 and N(n2) 322 each formed in an N-type MOS configuration are respectively connected to a power supply VDD through resistors (NRn1) 324 and (NRn2) 326. Connecting points of the drain terminals of the NMOS transistors N(n1) 320 and N(n2) 322 and the resistors (NRn1) 324 and (NRn2) 326 respectively form an output (N0n1) and an output (N0n2) 340.

Incidentally, inputs NIN(1) and NIN(2) are respectively connected to gate terminals of NMOS transistors (N11) and (N12) of the first-stage differential amplifier circuit (NA1) 304 shown in FIG. 4. Outputs (N011) through (N0(n-2)1) and outputs (N012) through (N0(n-2)2) of the pre-stage differential amplifier circuits are connected to their corresponding gate terminals of NMOS transistors N21 through N(n-1)1 and N22 through N(n-1)2 of the second-stage and later differential amplifier circuits NA2 through NA(n-1).

Outputs (N0(n-1)1) and (N0(n-1)2) of the differential amplifier circuit NA(n-1) form outputs of the differential amplifier circuit group (NA) 302 and are connected to the differential amplifier circuit (NAn) 304 shown in FIG. 3.

Referring back to FIG. 3, the output (N0n2) 340 of the differential amplifier circuit (NAn) 304 is connected to a gate terminal of an NMOS transistor 350 disposed in the detection (DET) circuit 306. The detection (DET) circuit 306 includes a source follower circuit configured of a constant current circuit 352 whose one terminal is connected to the ground GND, and an NMOS transistor 350 having a source terminal to which the other terminal of the constant current circuit 352 is connected, and a drain terminal connected to the power supply VDD. A point 354 where the source terminal of the NMOS transistor 350 and the constant current circuit 352 are connected, forms an output of the detection circuit 306, from which an output signal (DET) is outputted. A condenser 356 is connected between the output signal (DET) 354 and the ground GND. The output 354 of the detection circuit 306 is connected to the comparator 310.

The bias circuit 308 includes a constant current circuit 360 whose one terminal is connected to the ground GND, and a resistor 362 connected between the other terminal of the constant current circuit 360 and the power supply VDD. A connecting point 364 of the constant current circuit 360 and the resistor 362 forms an output 364 of the bias circuit 308. The output 364 outputs a bias signal (BN) whose potential is determined according to the current value of the constant current circuit 360 and the resistance value of the resistor 362, and is connected to the source follower circuit 312.

The source follower circuit 312 includes a constant current circuit 372 whose one terminal is connected to the ground GND, and an NMOS transistor 370 having a source terminal to which the other terminal of the constant current circuit 372 is connected, a gate terminal to which the output (BN) 364 of the bias circuit 308 is connected, an a drain terminal connected to the power supply VDD. The source terminal of the NMOS transistor 370 forms an output 374 of the source follower circuit 312, from which an output signal (SFOUT) is outputted. The output 374 is connected to an input on the plus (+) side of the comparator 310.

The comparator 310 inputs the output signal (SFOUT) 374 of the source follower circuit 312 at the plus (+) input thereof and inputs the output signal (DET) 354 of the detection (DET) circuit 306 at the minus (−) input thereof. The comparator 310 compares these signals and outputs an output signal (COMPOUT) therefrom.

When, for example, the total gain of the differential amplifier circuit group (NA) 302 and the differential amplifier circuit (NAn) 304 is set as 80 [dB], an ASK-modulated sine wave having a maximum amplitude of 30 [μV] and a minimum amplitude of 3 [μV] is inputted to the input NIN(1), and a signal antiphase to the signal at the NIN(1) is inputted to the NIN(2) under the above configuration, a signal waveform amplified to a maximum amplitude of 300 [mV] and a minimum amplitude of 30 [mV] is outputted as the output signal (N0n2) 340 of the differential amplifier circuit (NAn) 340. The output signal (N0n2) 340 is inputted to the gate terminal of the NMOS transistor 350 of the detection (DET) circuit 306.

Owing to the source follower circuit of the detection (DET) circuit 306 and the condenser 356 thereof, the input signal is reduced by a VT potential of the NMOS transistor 350 and demodulated into a signal having an amplitude of 135 [mV], which in turn is outputted to the output 354 as a detect signal (DET). At this time, the output potential of the detect signal (DET) results in the output signal (N0n2) 340 of the differential amplifier circuit (NAn) 304, i.e., ((gate potential of NMOS transistor 350)−(VT voltage of NMOS transistor)). The detect signal (DET) is inputted to the minus (−) side input of the comparator 310.

The potential of an output signal (BN) 364 of the bias circuit 308 is determined by the current value of the constant current circuit 360 and the resistance value of the resistor 362. The output signal (BN) 364 is supplied to the source follower circuit 312. The signal (BN) 364 sent to the source follower circuit 312 is reduced by a VT potential of the NMOS transistor 370 and inputted to the plus (+) input of the comparator 310 as an SFOUT signal.

At this time, the bias circuit 308 and the source follower circuit 312 are configured in such a manner that the output signal (SFOUT) 374 of the source follower circuit 312 reaches the middle of the amplitude 135 [mV] of the detect signal (DET).

Therefore, the source follower circuit 312 and the source follower circuit of the detection (DET) circuit 306 are made identical in circuit configuration. The potential of the output signal (BN) of the bias circuit 308 is set so as to reach, for example, a potential raised by 67.5 [mV] from the potential of the output signal (N0n2) of the differential amplifier circuit (NAn) 304. When the current value of the constant current circuit (NTn) of the differential amplifier circuit (NAn) 304 is set to 2 [μA] and the current value of the constant current circuit 360 of the bias circuit 308 is set to 1 [μA], the currents that flow through the resistor (NRn2) of the differential amplifier circuit (NAn) 304 and the resistor 362 of the bias circuit 308 are both 1 [μA]. Since the potential of the output signal (N0n2) 340 of the differential amplifier circuit (NAn) 304 and the potential of the output signal (BN) 364 of the bias circuit 308 are determined by the (current value×resistance value), the resistance value of the resistor 362 is set to (resistance value of resistor (NRn2))−(67.5 kΩ)) in order to cause the potential of the output signal (BN) of the bias circuit 308 to reach the potential raised by 67.5 [mV] from the potential of the output signal (N0n2) of the differential amplifier circuit (NAn).

The output signal (DET) of the detection (DET) circuit 306 and the output signal (SFOUT) 374 of the source follower circuit 312 are delivered to the comparator 310, where a signal antiphase to the detect signal (DET) results in a signal between the power supply VDD and the ground GND, which in turn is outputted as a CMPOUT signal. That is, since the potential of the output signal (DET) 354 of the detection (DET) circuit 306 is determined according to ((output signal (N0n2) 340 of differential amplifier circuit (NAn) 304)−(VT voltage of NMOS transistor)), and the potential of the output signal (SFOUT) 374 of the source follower circuit 312 is determined according to ((output signal (BN) 364 of bias circuit 308)−(VT voltage of NMOS transistor)), the output signal (DET) 354 of the detection (DET) circuit 306 and the output signal (SFOUT) 374 of the source follower circuit 312 are both affected by similar VT variations even when the VT variations of the NMOS transistor take place. Accordingly, the output signal (SFOUT) 374 of the source follower circuit 312 is always brought to an intermediate value of the amplitude of the output signal (DET) 354 of the detection (DET) circuit 306 so that the output signal (COMPOUT) of the comparator 310 can provide or bring about an expected value.

As described above, the source follower circuit 312 is connected to the output 364 of the bias circuit 308 and provided on the semiconductor integrated circuit. Thus, even when the VT variations of the NMOS transistor take place, the output signal (DET) 354 of the detection (DET) circuit 306 and the output signal (SFOUT) 374 of the source follower circuit 312 are both affected by similar VT variations. Therefore, the output signal (SFOUT) 312 of the source follower circuit 312 always reaches the intermediate value of the amplitude of the output signal (DET) 354 of the detection (DET) circuit 306. Even when the amplitude of the signal inputted to each of the inputs NIN(1) and NIN(2) is small, the output signal (COMPOUT) of the comparator 310 is compensated, thus making it possible to provide or bring about an expected value.

Incidentally, the output (N0n2) 340 of the differential amplifier circuit (NAn) 304 is connected to the gate terminal of the NMOS transistor 350 provided in the detection (DET) circuit 306 in the present embodiment. However, the output signal (N0n1) of the differential amplifier circuit (NAn) 304 may be inputted to the gate terminal of the NMOS transistor 350 as an alternative to above.

Figure 5:
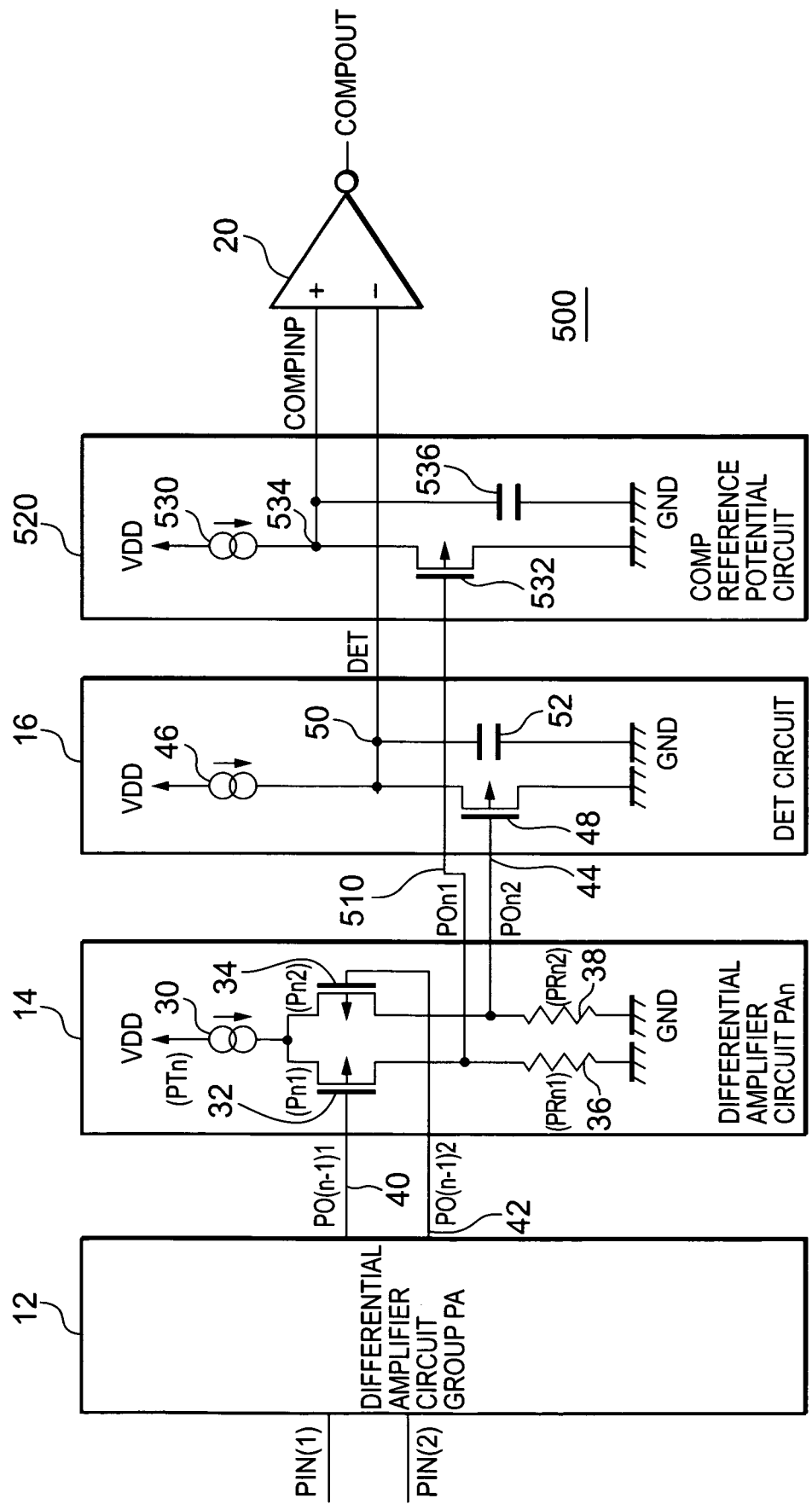
FIG. 5 is a circuit diagram illustrating a further embodiment of a semiconductor integrated circuit.

A further embodiment of a semiconductor integrated circuit will next be described. Referring to FIG. 5, the semiconductor integrated circuit 500 includes a differential amplifier circuit group (PA) 12 and a final-stage differential amplifier circuit (PAn) 14, a detection (DET) circuit 16 connected to an output (P0n2) of the final-stage differential amplifier circuit (PAn) 14 and a comparator 20. Their configurations may be identical to those identified by the same reference numerals shown in FIG. 1. Further, the present embodiment is different from the embodiment shown in FIG. 1 in that a COMP reference potential circuit 520 is connected to an output (P0n1) 510 of the differential amplifier circuit (PAn) 14, and the output of the COMP reference potential circuit 520 is connected to its corresponding input on the plus (+) side of the comparator 20. Since the present embodiment may be similar in other configuration, the description of its details is omitted.

The COMP reference potential circuit 520 includes a constant current circuit 530 having one terminal to which a power supply VDD is connected. The other terminal of the constant current circuit 530 is connected to its corresponding source terminal of a PMOS transistor 532. A gate terminal of the PMOS transistor 532 is connected to the output (P0n1) 510 of the differential amplifier circuit (PAn) 14 and a drain terminal thereof is connected to a ground GND to thereby form a source follower circuit. A connecting point 534 of the source terminal of the PMOS transistor 532 and the constant current circuit 530 forms the output 534 of the COMP reference potential circuit 520, which outputs an output signal (COMPINP), and is connected to the ground GND via a condenser 536. The output 534 of the COMP reference potential circuit 520 is connected to the input on the plus (+) side of the comparator 20. The output signal (COMPINP) results in a reference potential of the comparator 20.

At this time, the output signal (DET) of the detection (DET) circuit 16 is a signal having levels "H" and "L", which is obtained by inputting the output signal (P0n2) 44 of the differential amplifier circuit (PAn) 14 and detecting the peak on its amplitude Low side, whereas the output signal (COMPINP) of the COMP reference potential circuit 520 is configured such that the condenser 536 lying in the COMP reference potential circuit 520 has a capacitance value larger than that of a condenser 52 provided in the detection circuit 16 and thereby only the large amplitude-side peak on the amplitude Low side of the output signal (P0n1) 510 of the differential amplifier circuit (PAn) 14 is detected.

When, for example, the total gain of the differential amplifier circuit group (PA) 12 and the differential amplifier circuit (PAn) 14 is set as 80 [dB], an ASK-modulated sine wave having a maximum amplitude of 30 [μV] and a minimum amplitude of 3 [μV] is inputted to its corresponding input PIN(1), and a signal antiphase to the signal at the input PIN(1) is inputted to its corresponding input PIN(2) under the above configuration, waveforms amplified to a maximum amplitude of 300 [mV] and a minimum amplitude of 30 [mV] are respectively outputted to the output (P0n1) 510 and (P0n2) 44 of the differential amplifier circuit (PAn) 14. The output signal (P0n2) 44 is inputted to a gate terminal of a PMOS transistor 48 of the detection (DET) circuit 16.

Owing to the source follower circuit of the detection (DET) circuit 16 and the condenser 52 thereof, the input signal is raised by a VT potential of the PMOS transistor 48 and demodulated into a signal having an amplitude of 135 [mV], which in turn is outputted as a detect signal (DET) 50. At this time, the output potential of the detect signal (DET) 50 results in the output signal (P0n2) 44 of the differential amplifier circuit (PAn) 14, i.e., ((gate potential of PMOS transistor 48)+(VT voltage of PMOS transistor)). The detect signal (DET) 50 is inputted to the minus (−) side input of the comparator 20.

The output signal (P0n1) 510 delivered from the differential amplifier circuit (PAn) 14 is inputted to the gate terminal of the PMOS transistor 532 of the COMP reference potential circuit 520. By virtue of the source follower circuit of the COMP reference potential circuit 520 and the condenser 536 thereof, the Low-side peak of the large amplitude signal of the output signal (P0n1) 510 is detected and raised by a VT potential of the PMOS transistor 532, after which a COMPINP signal having a constant potential is outputted to the output 534.

At this time, the current value of the constant current circuit 530 of the COMP reference potential circuit 520 and the dimensions of the PMOS transistor 532 are adjusted to thereby reduce the VT potential of the PMOS transistor 532 by 67.5 [mV] from the VT potential of the PMOS transistor 48 of the detection (DET) circuit 16. Consequently, the output signal (COMPINP) of the COMP reference potential circuit 520 falls into the middle of the amplitude of the output signal (DET) 50 of the detection (DET) circuit 16. The detect signal (DET) 50 of the detection (DET) circuit 16 and the output signal (COMPINP) 534 of the COMP reference potential circuit 520 are sent to the comparator 20, where a signal antiphase to the detect signal (DET) 50 is brought to a signal between the power supply VDD and the ground GND, which in turn is outputted as a COMPOUT signal.

Owing to the configurations set in these ways, even when VT variations of the PMOS transistor occur, the output signal (DET) 50 of the detection (DET) circuit 16 and the output signal (COMPINP) 534 of the COMP reference potential circuit 520 are both affected by similar VT variations. Therefore, the output signal (COMPINP) 534 of the COMP reference potential circuit 520 is always brought to an intermediate value of the amplitude of the output signal (DET) 50 of the detection (DET) circuit 16 so that the output signal COMPOUT of the comparator 20 can provide an expected value.

According to the above embodiment as described above, the COMP reference potential circuit 520 is provided on the semiconductor integrated circuit. Thus, even when the VT variations of the PMOS transistor take place, the output signal (DET) 50 of the detection (DET) circuit 16 and the output signal (COMPINP) 534 of the COMP reference potential circuit 520 are similarly affected by the VT variations. Therefore, the output signal COMPINP of the COMP reference potential circuit 520 always reaches the intermediate value of the amplitude of the output signal (DET) 50 of the detection (DET) circuit 16. Even when the amplitude of the signal inputted to each of the input PIN(1) and PIN(2) is small, the output signal COMPOUT of the comparator 20 can provide an expected value.

Incidentally, the output (P0n2) 44 of the differential amplifier circuit (PAn) 14 is connected to the gate terminal of the PMOS transistor 48 of the detection (DET) circuit 16, and the output (P0n1) 510 of the differential amplifier circuit (PAn) 14 is connected to the gate terminal of the PMOS transistor 532 of the COMP reference potential circuit 520 in the above embodiment. In reverse, however, it may be feasible to connect the output (P0n1) 510 of the differential amplifier circuit (PAn) 14 to the gate terminal of the PMOS transistor 48 of the detection (DET) circuit 16 and connect the output (P0n2) 44 of the differential amplifier circuit (PAn) 14 to the gate terminal of the PMOS transistor 532 of the COMP reference potential circuit 520.

Figure 6:
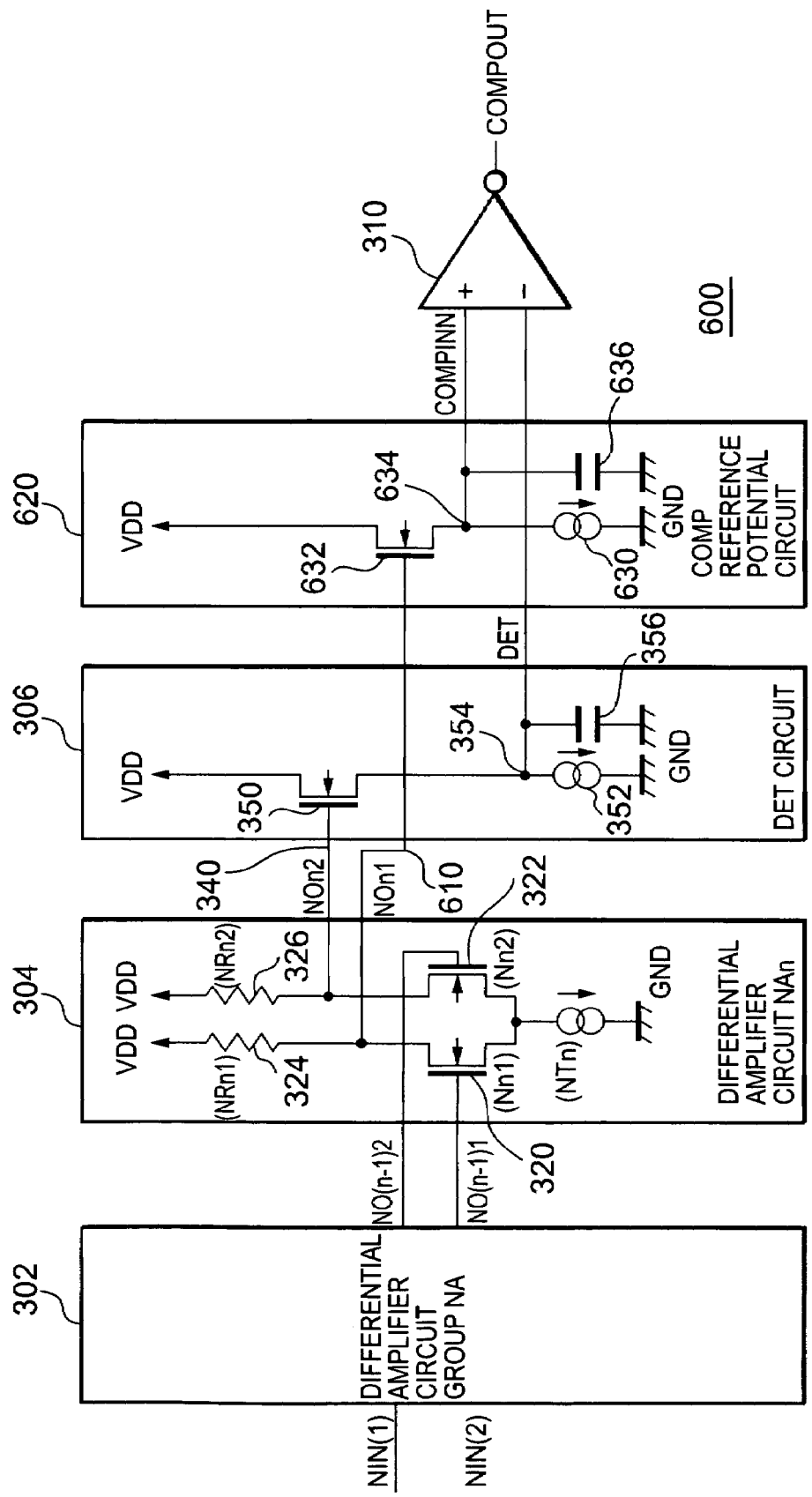
FIG. 6 is a circuit diagram depicting a still further embodiment of a semiconductor integrated circuit.

A still further embodiment of a semiconductor integrated circuit will next be described. Referring to FIG. 6, the semiconductor integrated circuit 600 includes a differential amplifier circuit group (NA) 302 and a final-stage differential amplifier circuit (NAn) 304, a detection (DET) circuit 306 connected to an output (N0n2) 340 of the final-stage differential amplifier circuit (NAn) 304 and a comparator 310. Their configurations may be identical to those identified by the same reference numerals shown in FIG. 3. Further, the present embodiment is different from the embodiment shown in FIG. 3 in that a COMP reference potential circuit 620 is connected to an output (N0n1) 610 of the differential amplifier circuit (NAn) 304, and the output of the COMP reference potential circuit 620 is connected to its corresponding input on the plus (+) side of the comparator 310. Since the present embodiment may be similar in other configuration, the description of its details is omitted.

The COMP reference potential circuit 620 includes a constant current circuit 630 having one terminal to which a ground GND is connected. The other terminal of the constant current circuit 630 is connected to its corresponding source terminal of an NMOS transistor 632. A gate terminal of the NMOS transistor 632 is connected to the output (N0n1) 610 of the differential amplifier circuit (NAn) 304 and a drain terminal thereof is connected to a power supply VDD to thereby form a source follower circuit. A connecting point 634 of the source terminal of the NMOS transistor 632 and the constant current circuit 630 forms the output 634 of the COMP reference potential circuit 620, which outputs an output signal (COMPINN), and is connected to the ground GND via a condenser 636. The output 634 of the COMP reference potential circuit 620 is connected to the input on the plus (+) side of the comparator 310. The output signal (COMPINN) results in a reference potential of the comparator 310.

At this time, a detect signal (DET) 354 of the detection (DET) circuit 306 is a signal having levels "H" and "L", corresponding to the output signal (N0n2) 340 of the differential amplifier circuit (NAn) 304, whereas the output signal (COMPINN) of the COMP reference potential circuit 620 is configured such that the condenser 636 lying in the COMP reference potential circuit 620 has a capacitance value larger than that of a condenser 356 provided in the detection circuit 306 and thereby only the large amplitude-side peak on the amplitude Low side of the output signal (N0n1) 610 of the differential amplifier circuit (NAn) 304 is detected.

When, for example, the total gain of the differential amplifier circuit group (NA) 302 and the differential amplifier circuit (NAn) 304 is set as 80 [dB], an ASK-modulated sine wave having a maximum amplitude of 30 [μV] and a minimum amplitude of 3 [μV] is inputted to its corresponding input NIN(1), and a signal antiphase to the signal at the NIN(1) is inputted to its corresponding input NIN(2) under such a configuration, signal waveforms amplified to a maximum amplitude of 300 [mV] and a minimum amplitude of 30 [mV] are respectively outputted to the output (N0n1) 610 and output (N0n2) 340 of the differential amplifier circuit (NAn) 304.

The output signal (N0n2) is inputted to the gate of an NMOS transistor 350 of the detection (DET) circuit 306.

By virtue of the source follower circuit of the detection (DET) circuit 306 and the condenser 356 thereof, the input signal is reduced by a VT potential of the NMOS transistor 350 and demodulated into a signal having an amplitude of 135 [mV], which in turn is outputted as a detect signal (DET) 354. At this time, the output potential of the detect signal (DET) results in the output signal (N0n2) 340 of the differential amplifier circuit (NAn) 304, i.e., ((gate potential of NMOS transistor 350)−(VT voltage of NMOS transistor)). The detect signal (DET) 354 is inputted to the minus (−) side input of the comparator 310.

The output signal (N0n1) 610 of the differential amplifier circuit (NAn) 304 is inputted to the gate terminal of the NMOS transistor 632 of the COMP reference potential circuit 620. By virtue of the source follower circuit of the COMP reference potential circuit 620 and the condenser 356 thereof, the High-side peak of the large amplitude signal of the output signal (N0n1) 610 is detected and reduced by a VT potential of the NMOS transistor 632, after which a COMPINN signal 634 having a constant potential is outputted.

At this time, the current value of the constant current circuit 630 of the COMP reference potential circuit 620 and the dimensions of the NMOS transistor 632 are adjusted to thereby increase the VT potential of the NMOS transistor 632 by 67.5 [mV] from the VT potential of the NMOS transistor 350 of the detection (DET) circuit 306. Consequently, the output signal (COMPINN) of the COMP reference potential circuit 620 falls into the middle of the amplitude of the output signal (DET) 354 of the detection (DET) circuit 306.

The detect signal (DET) 354 of the detection (DET) circuit 306 and the output signal (COMPINN) 634 of the COMP reference potential circuit 620 are sent to the comparator 310, where a signal antiphase to the detect signal (DET) 354 is brought to a signal between the power supply VDD and the ground GND, which in turn is outputted as a COMPOUT signal.

Owing to these configurations, even when VT variations of the NMOS transistor occur, the output signal (DET) 354 of the detection (DET) circuit 306 and the output signal (COMPINN) 634 of the COMP reference potential circuit 620 are both affected by similar VT variations. Therefore, the output signal (COMPINN) of the COMP reference potential circuit 620 is always brought to an intermediate value of the amplitude of the output signal (DET) 354 of the detection (DET) circuit 306 so that the output signal COMPOUT of the comparator 310 can provide an expected value.

According to the above embodiment as described above, the COMP reference potential circuit 620 is provided on the semiconductor integrated circuit. Thus, even when the VT variations of the NMOS transistor take place, the output signal (DET) 354 of the detection (DET) circuit 306 and the output signal (COMPINN) 634 of the COMP reference potential circuit 620 are similarly affected by the VT variations. Therefore, the output signal (COMPINN) 634 of the COMP reference potential circuit 620 always reaches the intermediate value of the amplitude of the output signal (DET) 354 of the detection (DET) circuit 306. Even when the amplitude of the signal inputted to each of the inputs NIN(1) and NIN(2) is small, the output signal COMPOUT of the comparator 310 can provide an expected value.

Incidentally, the output (N0n2) 340 of the differential amplifier circuit (NAn) 304 is connected to the gate terminal of the NMOS transistor 350 of the detection (DET) circuit 306, and the output (N0n1) 610 of the differential amplifier circuit (NAn) 304 is connected to the gate terminal of the NMOS transistor 632 of the COMP reference potential circuit 620 in the above embodiment. In reverse, however, it may be feasible to connect the output signal (N0n1) 610 of the differential amplifier circuit (NAn) 304 to the gate terminal of the NMOS transistor 350 of the detection (DET) circuit 306 and connect the output (N0n2) 340 of the differential amplifier circuit (NAn) 304 to the gate terminal of the NMOS transistor 632 of the COMP reference potential circuit 620.

Figure 7:
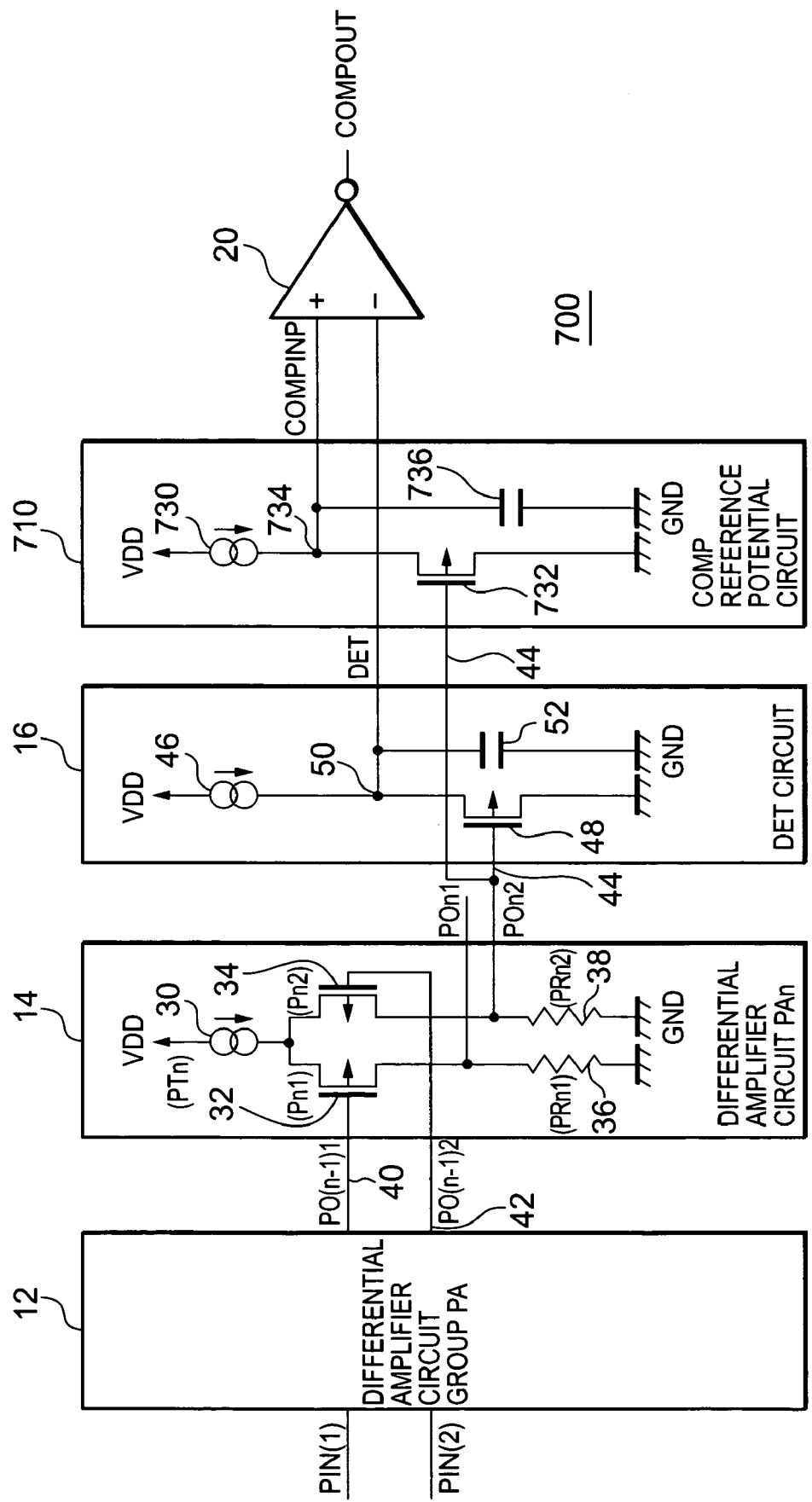
FIG. 7 is a circuit diagram showing a still further embodiment of a semiconductor integrated circuit.

A still further embodiment of a semiconductor integrated circuit will next be described. Referring to FIG. 7, the semiconductor integrated circuit 700 includes a differential amplifier circuit group (PA) 12 and a final-stage differential amplifier circuit (PAn) 14, a detection (DET) circuit 16 connected to an output (P0n2) of the final-stage differential amplifier circuit (PAn) 14 and a comparator 20. Their configurations may be identical to those identified by the same reference numerals shown in FIG. 5. Further, the present embodiment is different from the embodiment shown in FIG. 5 in that an output (P0n1) 44 of the differential amplifier circuit (PAn) 14 is connected to the detection (DET) circuit 16 and connected to a COMP reference potential circuit 710. Since the present embodiment may be similar in other configuration, the description of its details is omitted.

The COMP reference potential circuit 710 includes a constant current circuit 730 having one terminal to which a power supply VDD is connected. The other terminal of the constant current circuit 730 is connected to its corresponding source terminal of a PMOS transistor 732. A gate terminal of the PMOS transistor 732 is connected to the output (P0n2) 44 of the differential amplifier circuit (PAn) 14 and a drain terminal thereof is connected to a ground GND to thereby form a source follower circuit. A connecting point 734 of the source terminal of the PMOS transistor 732 and the constant current circuit 730 forms an output 734 of the COMP reference potential circuit 710 which outputs an output signal (COMPINP), and is connected to the ground GND via a condenser 736. The output 734 of the COMP reference potential circuit 710 is connected to the input on the plus (+) side of the comparator 20. The output signal (COMPINP) 734 results in a reference potential of the comparator 20.

At this time, an output signal (DET) 50 of the detection (DET) circuit 16 is a signal having levels "H" and "L", which is obtained by detecting the peak on the amplitude Low side of the output signal (P0n2) 44 of the differential amplifier circuit (PAn) 14 in accordance with the output signal (P0n2) 44 thereof, whereas the output signal (COMPINP) 734 of the COMP reference potential circuit 710 is configured such that the condenser 736 lying in the COMP reference potential circuit 710 has a capacitance value larger than that of a condenser 52 provided in the detection circuit 16 and thereby only the large amplitude-side peak on the amplitude Low side of the output signal (P0n2) 44 of the differential amplifier circuit (PAn) 14 is detected.

When, for example, the total gain of the differential amplifier circuit group (PA) 12 and the differential amplifier circuit (PAn) 14 is set as 80 [dB], an ASK-modulated sine wave having a maximum amplitude of 30 [μV] and a minimum amplitude of 3 [μV] is inputted to its corresponding input PIN(1), and a signal antiphase to the signal at the input PIN(1) is inputted to its corresponding input PIN(2) under such a configuration, a signal waveform amplified to a maximum amplitude of 300 [mV] and a minimum amplitude of 30 [mV] is outputted to the output (P0n2) 44 of the differential amplifier circuit (PAn) 14, which in turn is inputted to its corresponding gate terminal of a PMOS transistor 48 of the detection (DET) circuit 16.

By virtue of the source follower circuit of the detection (DET) circuit 16 and the condenser 52 thereof, the input signal is raised by a VT potential of the PMOS transistor 48 and demodulated into a signal having an amplitude of 135 [mV], which in turn is outputted to the minus (−) side input of the comparator 20 as a detect signal (DET) 50. At this time, the output potential of the detect signal (DET) 50 results in the output signal (P0n2) 44 of the differential amplifier circuit (PAn) 14, i.e., ((gate potential of PMOS transistor 48)+(VT voltage of PMOS transistor)).

The output signal (P0n2) 44 delivered from the differential amplifier circuit (PAn) 14 is inputted to the gate terminal of the PMOS transistor 732 of the COMP reference potential circuit 710. By virtue of the source follower circuit of the COMP reference potential circuit 710 and the condenser 736 thereof, the Low-side peak of the large amplitude signal of the output signal (P0n2) 44 is detected and raised by a VT potential of the PMOS transistor 732, after which a COMPINP signal having a constant potential is outputted to the output 734.

At this time, the current value of the constant current circuit 730 of the COMP reference potential circuit 710 and the dimensions of the PMOS transistor 732 are adjusted to thereby reduce the VT potential of the PMOS transistor 732 by 67.5 [mV] from the VT potential of the PMOS transistor 48 of the detection (DET) circuit 16. Consequently, the output signal (COMPINP) of the COMP reference potential circuit 710 falls into the middle of the amplitude of the output signal (DET) 50 of the detection (DET) circuit 16.

The detect signal (DET) 50 of the detection (DET) circuit 16 and the output signal (COMPINP) 734 of the COMP reference potential circuit 710 are sent to the comparator 20, where a signal antiphase to the detect signal (DET) 50 is brought to a signal between the power supply VDD and the ground GND, which in turn is outputted as a COMPOUT signal.

Owing to the configurations set in these ways, even when VT variations of the PMOS transistor take place, the output signal (DET) 50 of the detection (DET) circuit 16 and the output signal (COMPINP) 734 of the COMP reference potential circuit 710 are both affected by similar VT variations. Therefore, the output signal (COMPINP) 734 is always brought to an intermediate value of the amplitude of the output signal (DET) 50 of the detection (DET) circuit 16 so that the output signal (COMPOUT) of the comparator 20 can provide an expected value.

According to the above embodiment as described above, the COMP reference potential circuit 710 is provided on the semiconductor integrated circuit. Thus, even when the VT variations of the PMOS transistor take place, the output signal (DET) 50 of the detection (DET) circuit 16 and the output signal (COMPINP) 734 of the COMP reference potential circuit 710 are similarly affected by the VT variations. Therefore, the output signal COMPINP of the COMP reference potential circuit 710 always reaches the intermediate value of the amplitude of the output signal (DET) 50 of the detection (DET) circuit 16. Even when the amplitude of the signal inputted to each of the input PIN(1) and PIN(2) is small, the output signal COMPOUT of the comparator 20 can provide an expected value.

Incidentally, the output (P0$n$2) 44 of the differential amplifier circuit (PAn) 14 is connected to the gate terminal of the PMOS transistor 48 of the detection (DET) circuit 16 and the gate terminal of the PMOS transistor 732 of the COMP reference potential circuit 710 in the above embodiment. However, the other output (P0$n$1) of the differential amplifier circuit (PAn) may be connected to the respective gate terminals of the PMOS transistors 48 and 732.

Figure 8:
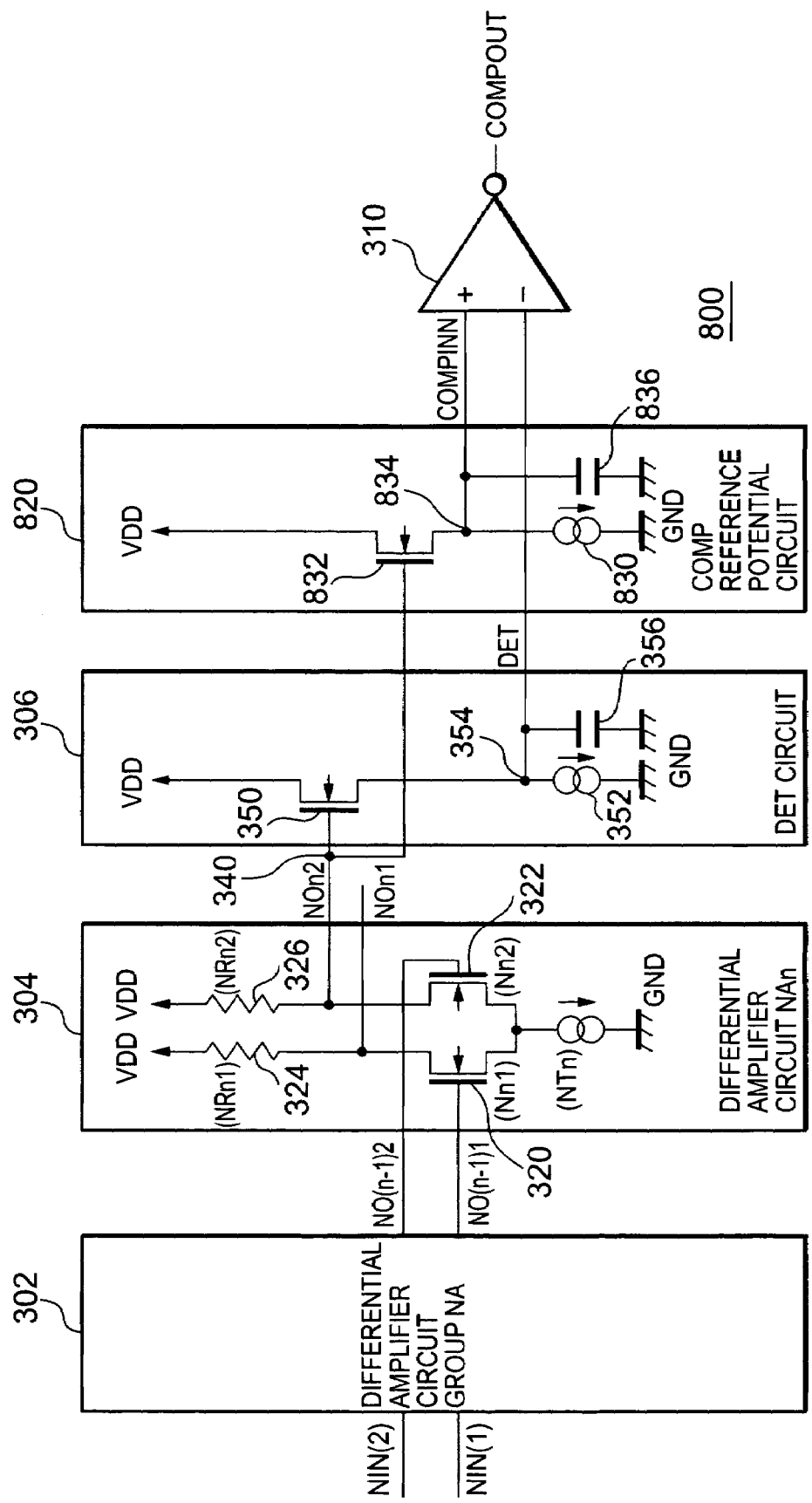
FIG. 8 is a circuit diagram illustrating a still further embodiment of a semiconductor integrated circuit.

A still further embodiment of a semiconductor integrated circuit will next be described. Referring to FIG. 8, the semiconductor integrated circuit 800 includes a differential amplifier circuit group (NA) 302 and a final-stage differential amplifier circuit (NAn) 304, a detection (DET) circuit 306 connected to an output (N0n2) 340 of the final-stage differential amplifier circuit (NAn) 304 and a comparator 310. Their configurations may be identical to those identified by the same reference numerals shown in FIG. 6. Further, the present embodiment is different from the embodiment shown in FIG. 6 in that a COMP reference potential circuit 820 is connected to the output (N0n2) 340 of the differential amplifier circuit (NAn) 304, and the output of the COMP reference potential circuit 820 is connected to its corresponding input on the plus (+) side of the comparator 310. Since the present embodiment may be similar in other configuration, the description of its details is omitted.

The COMP reference potential circuit 820 includes a constant current circuit 830 having one terminal to which a ground GND is connected. The other terminal of the constant current circuit 830 is connected to its corresponding source terminal of an NMOS transistor 832. A gate terminal of the NMOS transistor 832 is connected to the output (N0n2) 340 of the differential amplifier circuit (NAn) 304 and a drain terminal thereof is connected to a power supply VDD to thereby form a source follower circuit. A connecting point 834 of the source terminal of the NMOS transistor 832 and the constant current circuit 830 forms the output 834 of the COMP reference potential circuit 820, which outputs an output signal (COMPINN), and is connected to the ground GND via a condenser 836. The output 834 of the COMP reference potential circuit 820 is connected to the input on the plus (+) side of the comparator 310. The output signal (COMPINN) results in a reference potential of the comparator 310.

At this time, a detect signal (DET) 354 of the detection (DET) circuit 306 is a signal having levels "H" and "L", which is obtained by detecting the peak on the amplitude High side of the output signal (N0n2) 340 of the differential amplifier circuit (NAn) 304, whereas the output signal (COMPINN) of the COMP reference potential circuit 820 is configured in such a manner that the condenser 836 lying in the COMP reference potential circuit 820 has a capacitance value larger than that of a condenser 356 provided in the detection circuit 306 and thereby only the large amplitude-side peak on the amplitude Low side of the output signal (N0n2) 340 of the differential amplifier circuit (NAn) 304 is detected.

When, for example, the total gain of the differential amplifier circuit group (NA) 302 and the differential amplifier circuit (NAn) 304 is set as 80 [dB], an ASK-modulated sine wave having a maximum amplitude of 30 [$\mu$V] and a minimum amplitude of 3 [$\mu$V] is inputted to its corresponding input NIN(1), and a signal antiphase to the signal at the input NIN(1) is inputted to its corresponding input NIN(2) under such a configuration, a signal waveform amplified to a maximum amplitude of 300 [mV] and a minimum amplitude of 30 [mV] is outputted to the output (N0n2) 340 of the differential amplifier circuit (NAn) 304.

The output signal (N0n2) 340 is inputted to the gate of an NMOS transistor 350 of the detection (DET) circuit 306. By virtue of the source follower circuit of the detection (DET) circuit 306 and the condenser 356 thereof, the input signal is reduced by a VT potential of the NMOS transistor 350 and demodulated into a signal having an amplitude of 135 [mV], which in turn is outputted as a detect signal (DET) 354. At this time, the output potential of the detect signal (DET) results in the output signal (N0n2) 340 of the differential amplifier circuit (NAn) 304, i.e., ((gate potential of NMOS transistor 350)–(VT voltage of NMOS transistor)). The detect signal (DET) 354 is inputted to the minus (–) side input of the comparator 310.

The output signal (N0n2) 340 is inputted even to the COMP reference potential circuit 820. By virtue of the source follower circuit of the COMP reference potential circuit 820 and the condenser 836 thereof, the High-side peak of the large amplitude signal of the input signal (N0n2) 340 is detected and reduced by a VT potential of the NMOS transistor 832, after which a COMPINN signal 834 having a constant potential is outputted.

At this time, the current value of the constant current circuit 830 of the COMP reference potential circuit 820 and the dimensions of the NMOS transistor 832 are adjusted to thereby raise the VT potential of the NMOS transistor 832 by 67.5 [mV] from the VT potential of the NMOS transistor 350 of the detection (DET) circuit 306. Consequently, the output signal (COMPINN) 834 of the COMP reference potential circuit 820 falls into the middle of the amplitude of the output signal (DET) 354 of the detection (DET) circuit 306.

The detect signal (DET) 354 of the detection (DET) circuit 306 and the output signal (COMPINN) 834 of the COMP reference potential circuit 820 are delivered to the comparator 310, where a signal antiphase to the detect signal (DET) 354 is brought to a signal between the power supply VDD and the ground GND, which in turn is outputted as a COMPOUT signal.

Owing to these configurations, even when VT variations of the NMOS transistor occur, the output signal (DET) 354 of the detection (DET) circuit 306 and the output signal (COMPINN) 834 of the COMP reference potential circuit 820 are both affected by similar VT variations. Therefore, the output signal (COMPINN) of the COMP reference potential circuit 820 is always brought to an intermediate value of the amplitude of the output signal (DET) 354 of the detection (DET) circuit 306 so that the output signal COMPOUT of the comparator 310 can provide an expected value.

According to the above embodiment as mentioned above, the COMP reference potential circuit 820 is provided on the semiconductor integrated circuit. Thus, even when the VT variations of the NMOS transistor take place, the output signal (DET) 354 of the detection (DET) circuit 306 and the output signal (COMPINN) 834 of the COMP reference potential circuit 820 are similarly affected by the VT variations. Therefore, the output signal (COMPINN) 834 of the COMP reference potential circuit 820 always reaches the intermediate value of the amplitude of the output signal (DET) 354 of the detection (DET) circuit 306. Even when the amplitude of the signal inputted to each of the inputs NIN(1) and NIN(2) is small, the output signal COMPOUT of the comparator 310 can provide or bring about an expected value.

Incidentally, the output (N0n2) 340 of the differential amplifier circuit (NAn) 304 is connected to the gate terminal of the NMOS transistor 306 of the detection (DET) circuit 306 and the gate terminal of the NMOS transistor 832 of the COMP reference potential circuit 820 in the above embodiment. As an alternative to it, however, the output signal (N0n1) of the differential amplifier circuit (NAn) 304 may be connected to the respective gate terminals of the NMOS transistors 306 and 832.

Figure 9:
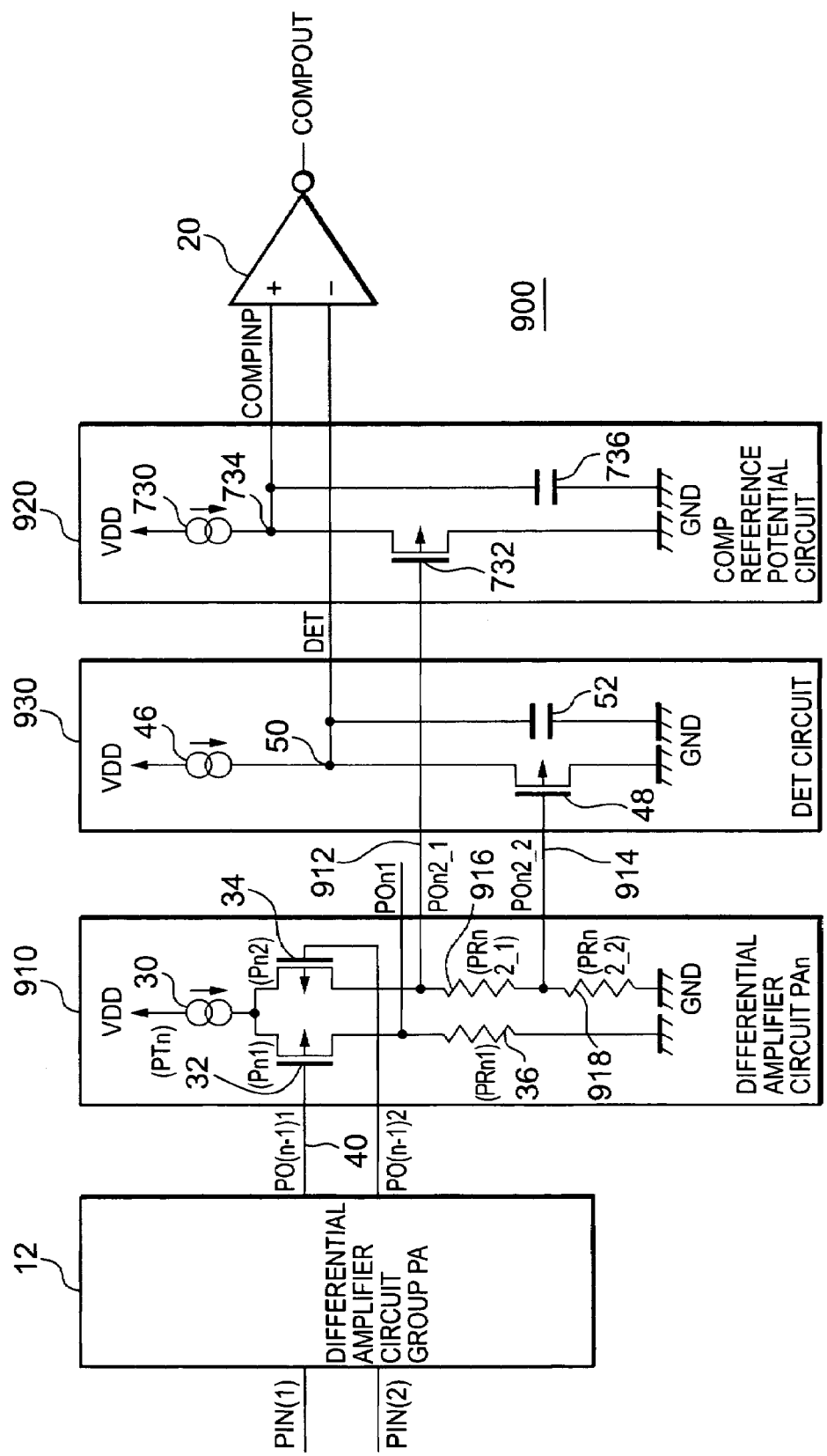
FIG. 9 is a circuit diagram depicting a still further embodiment of a semiconductor integrated circuit.

A still further embodiment of a semiconductor integrated circuit will next be explained. Referring to FIG. 9, the semiconductor integrated circuit 900 includes a differential amplifier circuit group (PA) 12 and a final-stage differential amplifier circuit (PAn) 910, a COMP reference potential circuit 920 connected to one output (P0n2) 912 of the differential amplifier circuit (PAn) 910, a detection (DET) circuit 930 connected to the other output (P0n2) 914 thereof and a comparator 20 connected to the respective outputs of the COMP reference potential circuit 920 and the detection (DET) circuit 930. The present embodiment is different from the embodiment shown in FIG. 7 in that the differential amplifier circuit (PAn) 910 is provided and the outputs 912 and 914 thereof are respectively connected to the COMP reference potential circuit 920 and the detection (DET) circuit 930.

As shown in the figure, the differential amplifier circuit (PAn) 910 has a configuration wherein a resistor (PRn2_1) 916 and a resistor (PRn2_2) 918 are connected in series between a drain terminal of a PMOS transistor (Pn2) 34 and a ground GND as an alternative to the resistor (PRn2) 38 in the differential amplifier circuit (PAn) 14 shown in FIG. 7. Other configurations of the differential amplifier circuit (PAn) 910 may be identical to the configurations identified by the same reference numerals shown in FIG. 7.

In the present embodiment, a connecting point 912 of the drain terminal of the PMOS transistor (Pn2) 34 and the resistor (PRn2_1) 916 forms the output (P0n2) 912 of the differential amplifier circuit (PAn) 910, whereas a connecting point of the resistor (PRn2_1) 916 and the resistor (PRn2_2) 918 forms the output (P0n2) 914 of the differential amplifier circuit (PAn) 910.

Although the detection (DET) circuit 930 employed in the present embodiment is different from the detection (DET) circuit 16 shown in FIG. 7 in that it is connected to the output (P0n2) 914 of the differential amplifier circuit (PAn) 910, the internal configurations of the detection (DET) circuit 930 may take configurations similar to those identified by the same reference numerals shown in FIG. 7 and similar connections. Although the COMP reference potential circuit 920 employed in the present embodiment is different from the COMP referential potential circuit 710 shown in FIG. 7 in that it is connected to the output (P0n2) 912 of the differential amplifier circuit (PAn) 914, the internal configurations of the COMP reference potential circuit 920 may take configurations similar to those identified by the same reference numerals and similar connections.

The detection (DET) circuit 930 detects the peak on the amplitude Low side of an output signal (P0n2) 914 of the differential amplifier circuit (PAn) 910 and outputs an output signal (DET) 50 having levels "H" and "L". On the other hand, the COMP reference potential circuit 920 is configured such that a condenser 736 provided therein is made up of a condenser having a capacitive value larger than that of a condenser 52 provided in the detection (DET) circuit 930, and thereby only the large amplitude-side peak on the amplitude Low side of an output signal (P0n2) 912 of the differential amplifier circuit (PAn) 910 is detected.

When, for example, the total gain of the differential amplifier circuit group (PA) 12 is set as 70 [dB], an ASK-modulated sine wave having a maximum amplitude of 30 [µV] and a minimum amplitude of 3 [µV] is inputted to its corresponding input PIN(1), and a signal antiphase to the signal at the input PIN(1) is inputted to its corresponding input PIN(2) under such a configuration, a signal waveform amplified to a maximum amplitude of 94 [mV] and a minimum amplitude of 9.4 [mV] is outputted to each of outputs (P0(n-1)1) and (P0(n-1)2) of the differential amplifier circuit group (PA) 12.

Assuming now that the gain of the differential amplifier circuit (PAn) 910 is 10 [dB], a current of 1 [µA] flows through a constant current circuit (PTn) 30, the resistance value of a resistor (PRn1) 32 is 400 [kΩ] and the resistance values of the resistors (PRn2_1) 916 and (PRn2_2) 918 are respectively 200 [kΩ], a signal waveform having a maximum amplitude of 300 [mV], a minimum amplitude of 30 [mV] and a bias operating potential of 200 [mV] is outputted to the output (P0n2) 912 of the differential amplifier circuit (PAn) 910. At this time, the peak potential on the Low side at the maximum amplitude ranges from (200 [mV]–300 [mV]/2) to 50 [mV], and the peak potential on the Low side at the minimum amplitude ranges from (200 [mV]–30 [mV]/2) to 185 [mV]. The output (P0n2_2) 914 of the differential amplifier circuit (PAn) 910 outputs a signal waveform equivalent to ½ in amplification factor and bias operating potential, respectively, with respect to the output signal (P0n2_1) 912. Thus, a signal waveform having a maximum amplitude of 150 [mV], a minimum amplitude of 15 [mV] and a bias operating potential of 100 [mV] is outputted therefrom. At this time, the peak potential on the Low side at the maximum amplitude is 25 [mV] and the peak potential on the Low side at the minimum amplitude is 92.5 [mV].

The output signal (P0n2_2) 914 outputted from the differential amplifier circuit (PAn) 910 is inputted to a gate terminal of a PMOS transistor 48 provided in the detection (DET) circuit 930. By virtue of a source follower circuit provided in the detection circuit 930 and the condenser 52 thereof, the input signal is raised by a VT potential of the PMOS transistor and demodulated into a signal having an amplitude of 67.5 [mV], which in turn is outputted as a detect signal (DET) 50. Since, at this time, the output potential of the detect signal (DET) 50 is brought to the output signal (P0n2_2) 914 of the differential amplifier circuit (PAn) 910, i.e., (gate potential of PMOS transistor 48)+(VT voltage of PMOS transistor), the level "H" signal potential of the detect signal (DET) 50 is (92.5 [mV]+VT voltage of PMOS transistor). The detect signal (DET) 50 is inputted to the input on the minus (–) side of the comparator 20.

The output signal (P0n2_1) 912 of the differential amplifier circuit (PAn) 910 is inputted to a gate terminal of a PMOS transistor 732 of COMP reference potential circuit 920. By means of a source follower circuit of the COMP reference potential circuit 920 and the condenser 736 thereof, the Low-side peak of the large amplitude signal of the input signal (P0n2_1) 912 is detected and raised by a VT potential of the PMOS transistor 732, after which a COMPINP signal 734 having a constant potential is outputted. Since, at this time, the output potential of the COMPINP signal 734 reaches the output signal (P0n2_1) 912 of the differential amplifier circuit (PAn) 910, i.e., (gate potential of PMOS transistor 732)+(VT voltage of PMOS transistor), its output potential results in (50 [mV]+VT voltage of PMOS transistor).

At this time, the source follower circuit of the detection (DET) circuit 930 and the source follower circuit of the COMP reference potential circuit 920 are configured on the semiconductor integrated circuit with the same circuit. Thus, since the PMOS transistor 48 of the detection (DET) circuit 930 and the PMOS transistor 732 of the COMP reference potential circuit 920 become respectively identical in rise in the VT potential in this case, the output signal (COMPINP) 734 of the COMP reference potential circuit 920 reaches the middle of the amplitude of the output signal (DET) 50 of the detection (DET) circuit 930.

The output signal (DET) 50 of the detection (DET) circuit 930 and the output signal (COMPINP) 734 of the COMP reference potential circuit 920 are respectively inputted to the comparator 20, where a signal antiphase to the detect signal (DET) is brought to a signal between the power supply VDD and the ground GND, which in turn is outputted as a COMPOUT signal.

With the setting of these configurations, even when VT variations of the PMOS transistor take place, the output signal (DET) 50 of the detection (DET) circuit 930 and the output signal (COMPINP) of the COMP reference potential circuit 920 are both affected by similar VT variations. Therefore, the output signal (COMPINP) of the COMP reference potential circuit 920 always reaches the intermediate value of the amplitude of the output signal (DET) of the detection (DET) circuit 930, and the output signal COMPOUT of the comparator 20 can provide an expected value.

According to the above embodiment as mentioned above, the differential amplifier circuit (PAn) 910 and the COMP reference potential circuit 920 are provided on the semiconductor integrated circuit. Thus, even when the VT variations of the PMOS transistor take place, the output signal (DET) of the detection circuit 930 and the output signal (COMPINP) of the COMP reference potential circuit 920 are similarly affected by the VT variations. Therefore, the output signal (COMPINP) of the COMP reference potential circuit 920 always reaches the intermediate value of the amplitude of the output signal (DET) of the detection circuit 930. Even when the amplitude of the signal inputted to each of the input PIN(1) and PIN(2) is small, the output signal COMPOUT of the comparator 20 can provide an expected value.

Figure 10:
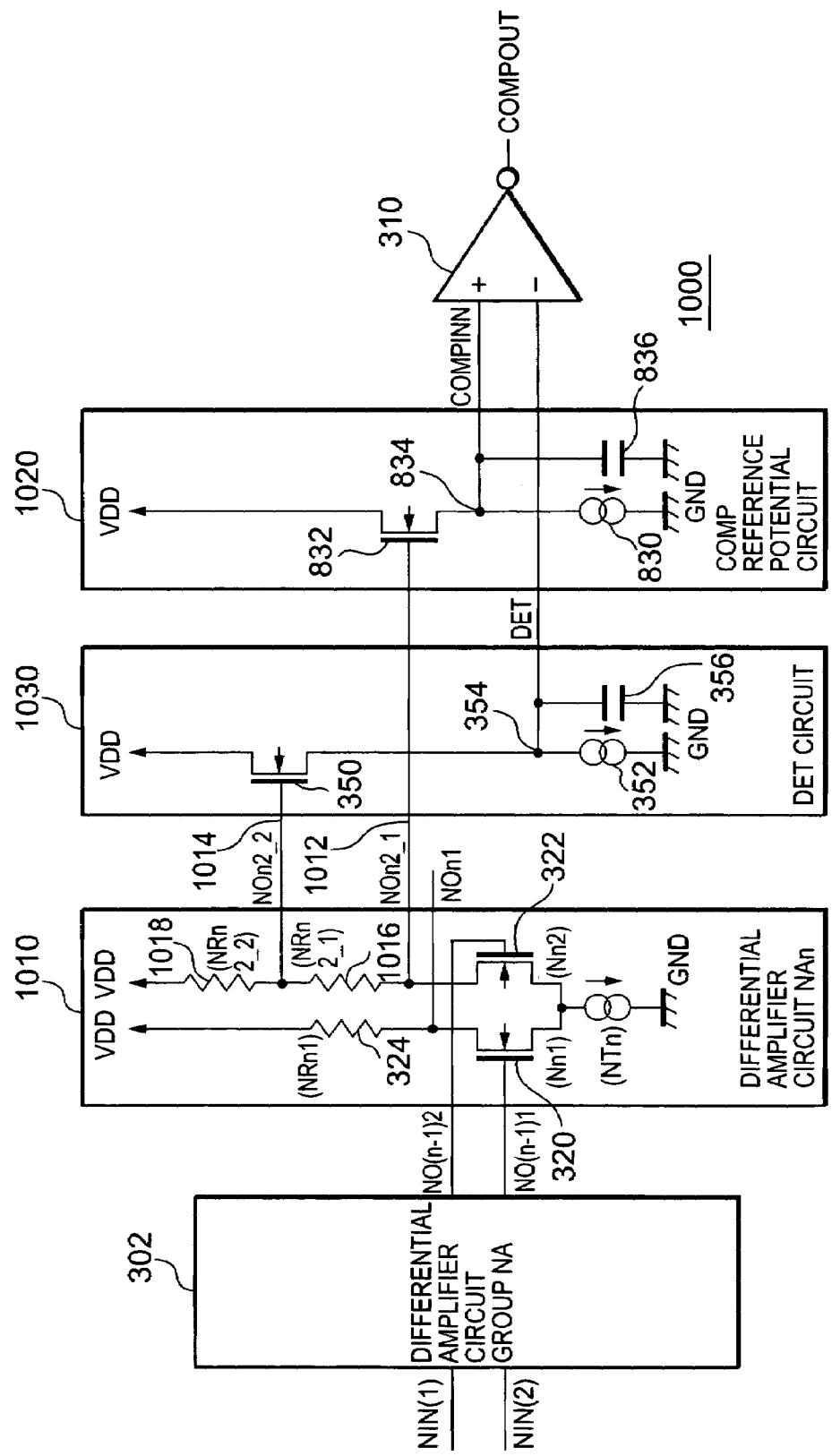
FIG. 10 is a circuit diagram showing a still further embodiment of a semiconductor integrated circuit.

A still further embodiment of a semiconductor integrated circuit will next be explained. Referring to FIG. 10, the semiconductor integrated circuit 1000 includes a differential amplifier circuit group (NA) 302 and a final-stage differential amplifier circuit (NAn) 1010, a COMP reference potential circuit 1020 connected to one output (N0n2) 1012 of the differential amplifier circuit (NAn) 1010, a detection (DET) circuit 1030 connected to the other output (N0n2) 1014 thereof and a comparator 310 connected to the respective outputs of the COMP reference potential circuit 1020 and the detection (DET) circuit 1030. The present embodiment is different from the embodiment shown in FIG. 8 in that the differential amplifier circuit (NAn) 1010 is provided and the outputs 1012 and 1014 thereof are respectively connected to the COMP reference potential circuit 1020 and the detection (DET) circuit 1030.

As shown in the figure, the differential amplifier circuit (NAn) 1010 has a configuration wherein a resistor (NRn2_1) 1016 and a resistor (NRn2_2) 1018 are connected in series between a drain terminal of an NMOS transistor (Nn2) 322 and a power supply VDD as an alternative to the resistor (NRn2) 326 in the differential amplifier circuit (NAn) 304 shown in FIG. 8. In the present embodiment, a connecting point 1012 of the drain terminal of the NMOS transistor (Nn2) 322 and the resistor (NRn2_1) 1016 forms the output (N0n2_1) 1012 of the differential amplifier circuit (NAn) 1010, whereas a connecting point of the resistor (NRn2_1) 1016 and the resistor (NRn_2) 1018 forms the output (N0n2_2) 1014 of the differential amplifier circuit (NAn) 1010. Other configurations of the differential amplifier circuit (NAn) 1010 may be identical to the configurations identified by the same reference numerals shown in FIG. 8.

The output (N0n2_1) 1012 of the differential amplifier circuit (NAn) 1010 is connected to its corresponding NMOS transistor 832 of the COMP reference potential circuit 1020. Further, the output (N0n2_2) 1014 thereof is connected to its corresponding NMOS transistor 350 provided in the detection (DET) circuit 1030. These COMP reference potential circuit 1020 and the detection (DET) circuit 1030 may respectively be similar in internal circuit configuration to the COMP reference potential circuit 820 and the detection (DET) circuit 306 shown in FIG. 8. An output 834 of the COMP reference potential circuit 1020 is connected to its corresponding input on the plus (+) side of the comparator 310, and an output 354 of the detection (DET) circuit 1030 is connected to its corresponding input on the minus (−) side of the comparator 310.

The detection (DET) circuit 1030 detects the peak on the amplitude Low side of an output signal (N0n2_2) 1014 of the differential amplifier circuit (NAn) 1010 and outputs a detect signal having levels "H" and "L". On the other hand, the COMP reference potential circuit 1020 is configured such that a condenser 836 is made up of a condenser having a capacitive value larger than that of a condenser 356 provided in the detection (DET) circuit 1030, and thereby only the large amplitude-side peak on the amplitude Low side of an output signal (N0n2_1) 1012 of the differential amplifier circuit (NAn) 1010 is detected.

When, for example, the total gain of the differential amplifier circuit group (NA) 302 is set as 70 [dB], an ASK-modulated sine wave having a maximum amplitude of 30 [μV] and a minimum amplitude of 3 [μV] is inputted to its corresponding input NIN(1), and a signal antiphase to the signal at the input NIN(1) is inputted to its corresponding input NIN(2) under such a configuration, a signal waveform amplified to a maximum amplitude of 94 [mV] and a minimum amplitude of 9.4 [mV] is outputted to each of outputs (N0(n-1)1) and (N0(n-1)2) of the differential amplifier circuit group (NA) 302.

Assuming now that the gain of the differential amplifier circuit (NAn) 1010 is 10 [dB], a current of 1 [μA] flows through a constant current circuit (NTn), the resistance value of a resistor (NRn1) 324 is 400 [kΩ] and the resistance values of the resistors (NRn2_1) 1016 and (NRn2_2) 1018 are respectively 200 [kΩ], a signal waveform having a maximum amplitude of 300 [mV], a minimum amplitude of 30 [mV] and a bias operating potential of (VDD−200 [mV]) is outputted to the output (N0n2) 1012 of the differential amplifier circuit (NAn) 1010. At this time, the peak potential on the Low side at the maximum amplitude ranges from ((VDD−200 [mV])−300 [mV]/2) to (VDD−50 [mV]), and the peak potential on the Low side at the minimum amplitude ranges from ((VDD)−200 [mV])−30 [mV]/2) to (VDD−185 [mV]).

The output (N0n2_2) 1014 of the differential amplifier circuit (NAn) 1010 outputs a signal waveform equivalent to ½ in amplification factor and bias operating potential, respectively, with respect to the output signal (N0n2_1) 1012. Thus, a signal waveform having a maximum amplitude of 150 [mV], a minimum amplitude of 15 [mV] and a bias operating potential of (VDD−100 [mV]) is outputted therefrom. At this time, the peak potential on the Low side at the maximum amplitude is (VDD−25 [mV]) and the peak potential on the Low side at the minimum amplitude is (VDD−92.5 [mV]).

The output signal (N0n2_2) 1014 outputted from the differential amplifier circuit (NAn) 1010 is inputted to a gate terminal of an NMOS transistor 350 provided in the detection (DET) circuit 1030. By virtue of a source follower circuit provided in the detection circuit 1030 and the condenser 356 thereof, the input signal is reduced by a VT potential of the NMOS transistor and demodulated into a signal having an amplitude of 67.5 [mV], which in turn is outputted as a detect signal (DET) 354. Since, at this time, the output potential of the detect signal (DET) 354 is brought to the output signal (N0n2_2) 1014 of the differential amplifier circuit (NAn) 1010, i.e., (gate potential of NMOS transistor 350)+(VT voltage of NMOS transistor), the level "H" signal potential of the detect signal (DET) 354 is ((VDD−92.5 [mV])−(VT voltage of NMOS transistor). The level "L" signal potential of the detect signal (DET) 354 is ((VDD−25 [mV])−(VT voltage of NMOS transistor). The detect signal (DET) 354 is inputted to the input on the minus (−) side of the comparator 310.

The output signal (N0n2_1) 1012 outputted from the differential amplifier circuit (NAn) 1010 is inputted to a gate terminal of an NMOS transistor 832 provided in the COMP reference potential circuit 1020. By means of a source follower circuit of the COMP reference potential circuit 1020 and the condenser 836 thereof, the High-side peak of the large amplitude signal of the input signal (N0n2_1) 1012 is detected and reduced by a VT potential of the NMOS transistor 832, after which a COMPINN signal 834 having a constant potential is outputted. Since, at this time, the output potential of the COMPINN signal 834 reaches the output signal (N0n2_1) 1012 of the differential amplifier circuit (NAn) 1010, i.e., (gate potential of NMOS transistor 832)+(VT voltage of NMOS transistor), its output potential results in ((VDD−50 [mV])+(VT voltage of NMOS transistor)).

At this time, the source follower circuit of the detection (DET) circuit 1030 and the source follower circuit of the COMP reference potential circuit 1020 are configured on the semiconductor integrated circuit with the same circuit. Thus, since the NMOS transistor 350 of the detection (DET) circuit 1030 and the NMOS transistor 832 of the COMP reference potential circuit 1020 become respectively identical in drop in the VT potential in this case, the output signal (COMPINN) 834 of the COMP reference potential circuit 1020 reaches the middle of the amplitude of the output signal (DET) 354 of the detection (DET) circuit 1030.

The output signal (DET) 354 of the detection (DET) circuit 1030 and the output signal (COMPINN) 834 of the COMP reference potential circuit 1020 are respectively inputted to the comparator 310, where a signal antiphase to the detect signal (DET) is brought to a signal between the power supply VDD and the ground GND, which in turn is outputted as a COMPOUT signal.

With the setting of these configurations, even when VT variations of the NMOS transistor take place, the output signal (DET) 354 of the detection (DET) circuit 1030 and the output signal (COMPINN) 834 of the COMP reference potential circuit 1020 are both affected by similar VT variations. Therefore, the output signal (COMPINN) of the COMP reference potential circuit 1020 always reaches the intermediate value of the amplitude of the output signal (DET) of the detection (DET) circuit 1030, and the output signal COMPOUT of the comparator 310 can provide an expected value.

According to the above embodiment as mentioned above, the differential amplifier circuit (NAn) 1010 and the COMP reference potential circuit 1020 are provided on the semiconductor integrated circuit. Thus, even when the VT variations of the NMOS transistor take place, the output signal (DET) of the detection circuit 1030 and the output signal (COMPINN) of the COMP reference potential circuit 1020 are similarly affected by the VT variations. Therefore, the output signal (COMPINN) of the COMP reference potential circuit 1020 always reaches the intermediate value of the amplitude of the output signal (DET) of the detection circuit 1030. Even when the amplitude of the signal inputted to each of the inputs NIN(1) and NIN(2) is small, the output signal COMPOUT of the comparator 310 can provide an expected value.

Figure 11:
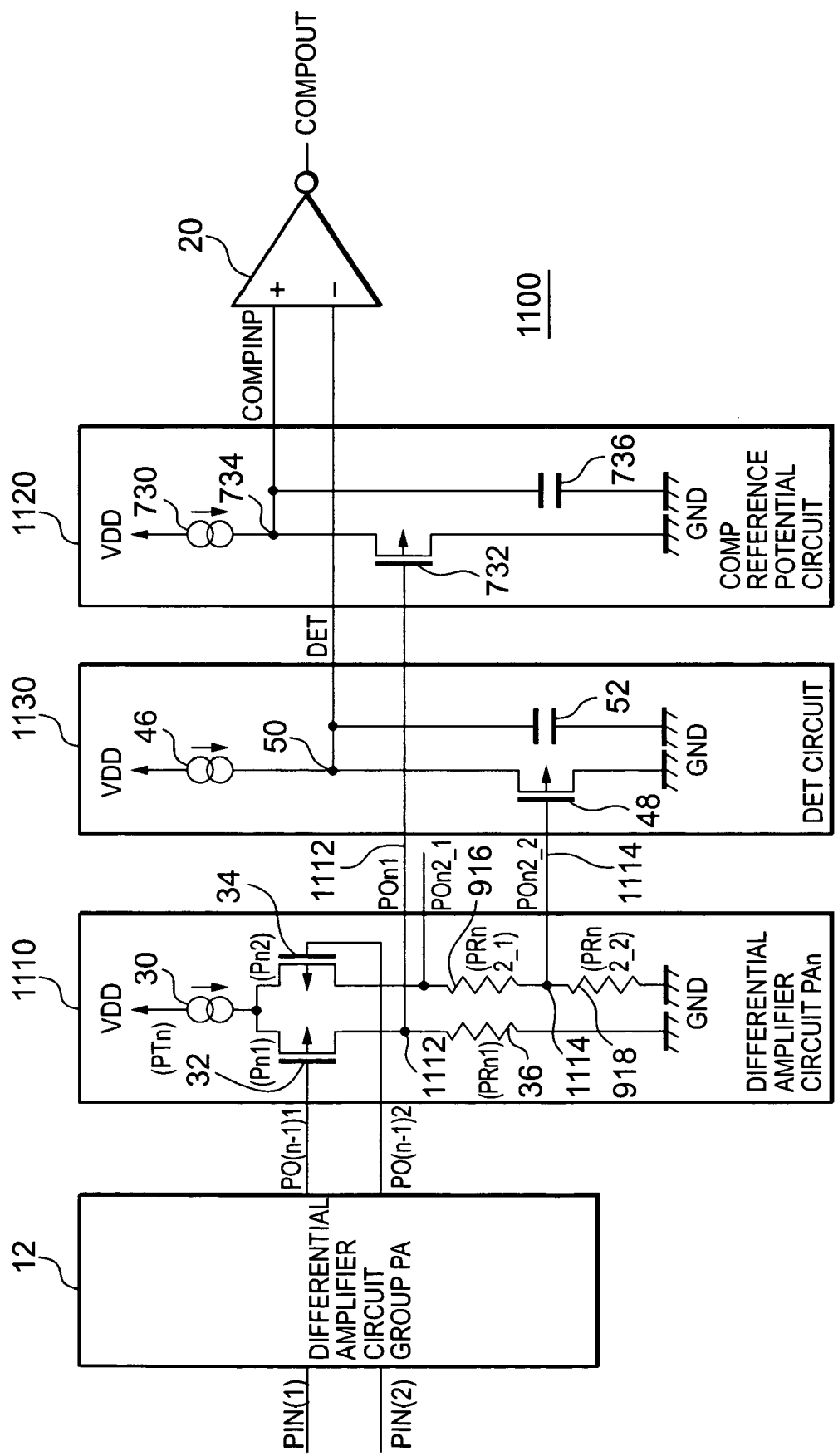
FIG. 11 is a circuit diagram illustrating a still further embodiment of a semiconductor integrated circuit.

A still further embodiment of a semiconductor integrated circuit will next be explained. Referring to FIG. 11, the semiconductor integrated circuit 1100 includes a differential amplifier circuit group (PA) 12 and a final-stage differential amplifier circuit (PAn) 1110, a COMP reference potential circuit 1120 connected to one output (P0n1) 1112 of the differential amplifier circuit (PAn) 1110, a detection (DET) circuit 1130 connected to the other output (P0n2_2) 1114 thereof and a comparator 20 connected to the respective outputs of the COMP reference potential circuit 1120 and the detection (DET) circuit 1130. The present embodiment is different from the embodiment shown in FIG. 9 in that the differential amplifier circuit (PAn) 1110 is provided and the outputs 1112 and 1114 thereof are respectively connected to the COMP reference potential circuit 1120 and the detection (DET) circuit 1130.

As shown in the figure, the differential amplifier circuit (PAn) 1110 is different in internal configuration from the differential amplifier circuit (PAn) 910 shown in FIG. 9 in that a connecting point 1012 of a drain terminal of a PMOS transistor (Pn2) 32 and a resistor (NRn1) 36 forms the output (P0n1) 1112 of the differential amplifier circuit (PAn) 1110, whereas a connecting point 1114 of a resistor (PRn2_1) 916 and a resistor (PRn2_2) 918 forms the output (P0n2_2) 1114 of the differential amplifier circuit (PAn) 1110. Since other configurations may be identical to the configurations identified by the same reference numerals in the differential amplifier circuit (PAn) 910, the description of their details is omitted. The output (P0n1) 1112 of the differential amplifier circuit (PAn) 1110 is connected to its corresponding gate terminal of a PMOS transistor 732 provided in the COMP reference potential circuit 1120. Further, the output (P0n2_2) 1114 thereof is connected to its corresponding gate terminal of a PMOS transistor 48 provided in the detection (DET) circuit 1130. The COMP reference potential circuit 1120 and the detection (DET) circuit 1130 may respectively take configurations identical to those identified by the same reference numerals in the COMP reference potential circuit 920 and the detection (DET) circuit 930 shown in FIG. 9. An output 730 of the COMP reference potential circuit 1120 is connected to its corresponding input on the plus (+) side of the comparator 20, and an output 50 of the detection (DET) circuit 1130 is connected to its corresponding input on the minus (−) side of the comparator 20.

The detection (DET) circuit 1130 detects the peak on the amplitude Low side of an output signal (P0n2_2) 1114 of the differential amplifier circuit (PAn) 1110 and outputs a detect signal having levels "H" and "L". On the other hand, the COMP reference potential circuit 1120 is configured such that a condenser 736 is made up of a condenser having a capacitive value larger than that of a condenser 52 provided in the detection (DET) circuit 1130, and only the large amplitude-side peak on the amplitude Low side of an output signal (P0n1) 1112 of the differential amplifier circuit (PAn) 1110 is detected.

When, for example, the total gain of the differential amplifier circuit group (PA) 12 is set as 70 [dB], an ASK-modulated sine wave having a maximum amplitude of 30 [μV] and a minimum amplitude of 3 [μV] is inputted to its corresponding input PIN(1), and a signal antiphase to the signal at the input PIN(1) is inputted to its corresponding input PIN(2) under such a configuration, a signal waveform amplified to a maximum amplitude of 94 [mV] and a minimum amplitude of 9.4 [mV] is outputted to each of outputs (P0(n-1)1) and (P0(n-1)2) of the differential amplifier circuit group (PA) 12.

Assuming now that the gain of the differential amplifier circuit (PAn) 1110 is 10 [dB], a current of 1 [μA] flows through a constant current circuit (PTn) 30, the resistance value of the resistor (PRn1) 36 is 400 [kΩ] and the resistance values of the resistors (PRn2_1) 916 and (PRn2_2) 918 are respectively 200 [kΩ], a signal waveform having a maximum amplitude of 300 [mV], a minimum amplitude of 30 [mV] and a bias operating potential of 200 [mV] is outputted to the output (P0n1) 1112 of the differential amplifier circuit (PAn) 1110. At this time, the peak potential on the Low side at the maximum amplitude ranges from (200 [mV])–300 [mV]/2) to 50 [mV], and the peak potential on the Low side at the minimum amplitude ranges from (200 [mV]–30 [mV]/2) to 185 [mV].

The output (P0n2_2) 1114 of the differential amplifier circuit (PAn) 1110 outputs a signal waveform equivalent to ½ in amplification factor and bias operating potential, respectively, with respect to the output signal (P0n1) 1112. Thus, a signal waveform having a maximum amplitude of 150 [mV], a minimum amplitude of 15 [mV] and a bias operating potential of 100 [mV] is outputted therefrom. At this time, the peak potential on the Low side at the maximum amplitude is 25 [mV] and the peak potential on the Low side at the minimum amplitude is 92.5 [mV].

The output signal (P0n2_2) 1114 outputted from the differential amplifier circuit (PAn) 1110 is inputted to the gate terminal of the PMOS transistor 48 provided in the detection (DET) circuit 1130. By virtue of a source follower circuit provided in the detection circuit 1130 and the condenser 52 thereof, the input signal is raised by a VT potential of the PMOS transistor and demodulated into a signal having an amplitude of 67.5 [mV], which in turn is outputted as a detect signal (DET) 50. Since, at this time, the output potential of the detect signal (DET) 50 is brought to the output signal (P0n2_2) 1114 of the differential amplifier circuit (PAn) 1110, i.e., (gate potential of PMOS transistor 48)+(VT voltage of PMOS transistor), the level "H" signal potential of the detect signal (DET) 50 is (92.5 [mV]+VT voltage of PMOS transistor). The level "L" signal potential of the detect signal (DET) 50 is (25 [mV]+VT voltage of PMOS transistor). The detect signal (DET) 50 is inputted to the input on the minus (−) side of the comparator 20.

The output signal (P0n1) 1112 outputted from the differential amplifier circuit (PAn) 1110 is inputted to the gate terminal of the PMOS transistor 732 provided in the COMP reference potential circuit 1120. By means of a source follower circuit of the COMP reference potential circuit 1120 and the condenser 736 thereof, the Low-side peak of the large amplitude signal of the input signal (P0n1) 1112 is detected and raised by a VT potential of the PMOS transistor 732, after which a COMPINP signal 730 having a constant potential is outputted. Since, at this time, the output potential of the COMPINP signal 730 reaches the output signal (P0n1) 1112 of the differential amplifier circuit (PAn) 1110, i.e., (gate potential of PMOS transistor 732)+(VT voltage of PMOS transistor), its output potential results in (50 [mV]+ VT voltage of PMOS transistor).

At this time, the source follower circuit of the detection (DET) circuit 1130 and the source follower circuit of the COMP reference potential circuit 1120 are configured on the semiconductor integrated circuit with the same circuit. Thus, since the PMOS transistor 48 of the detection (DET) circuit 1130 and the PMOS transistor 732 of the COMP reference potential circuit 1120 become respectively identical in rise in the VT potential in this case, the output signal (COMPINP) 730 of the COMP reference potential circuit 1120 reaches the middle of the amplitude of the output signal (DET) 50 of the detection (DET) circuit 1130.

The output signal (DET) 50 of the detection (DET) circuit 1130 and the output signal (COMPINP) 730 of the COMP reference potential circuit 1120 are respectively inputted to the comparator 20, where a signal antiphase to the detect signal (DET) is brought to a signal between the power supply VDD and the ground GND, which in turn is outputted as a COMPOUT signal.

With the setting of these configurations, even when VT variations of the PMOS transistor take place, the output signal (DET) 50 of the detection (DET) circuit 1130 and the output signal (COMPINP) 730 of the COMP reference potential circuit 1120 are both affected by similar VT variations. Therefore, the output signal (COMPINP) of the COMP reference potential circuit 1120 always reaches the intermediate value of the amplitude of the output signal (DET) of the detection (DET) circuit 1130, and the output signal COMPOUT of the comparator 20 can provide or bring about an expected value.

According to the above embodiment as mentioned above, the differential amplifier circuit (PAn) 1110 and the COMP reference potential circuit 1120 are provided on the semiconductor integrated circuit. Thus, even when the VT variations of the PMOS transistor take place, the output signal (DET) of the detection circuit 1130 and the output signal (COMPINP) of the COMP reference potential circuit 1120 are similarly affected by the VT variations. Therefore, the output signal (COMPINP) of the COMP reference potential circuit 1120 always reaches the intermediate value of the amplitude of the output signal (DET) of the detection circuit 1130. Even when the amplitude of the signal inputted to each of the input PIN(1) and PIN(2) is small, the output signal COMPOUT of the comparator 20 can provide an expected value.

Figure 12:
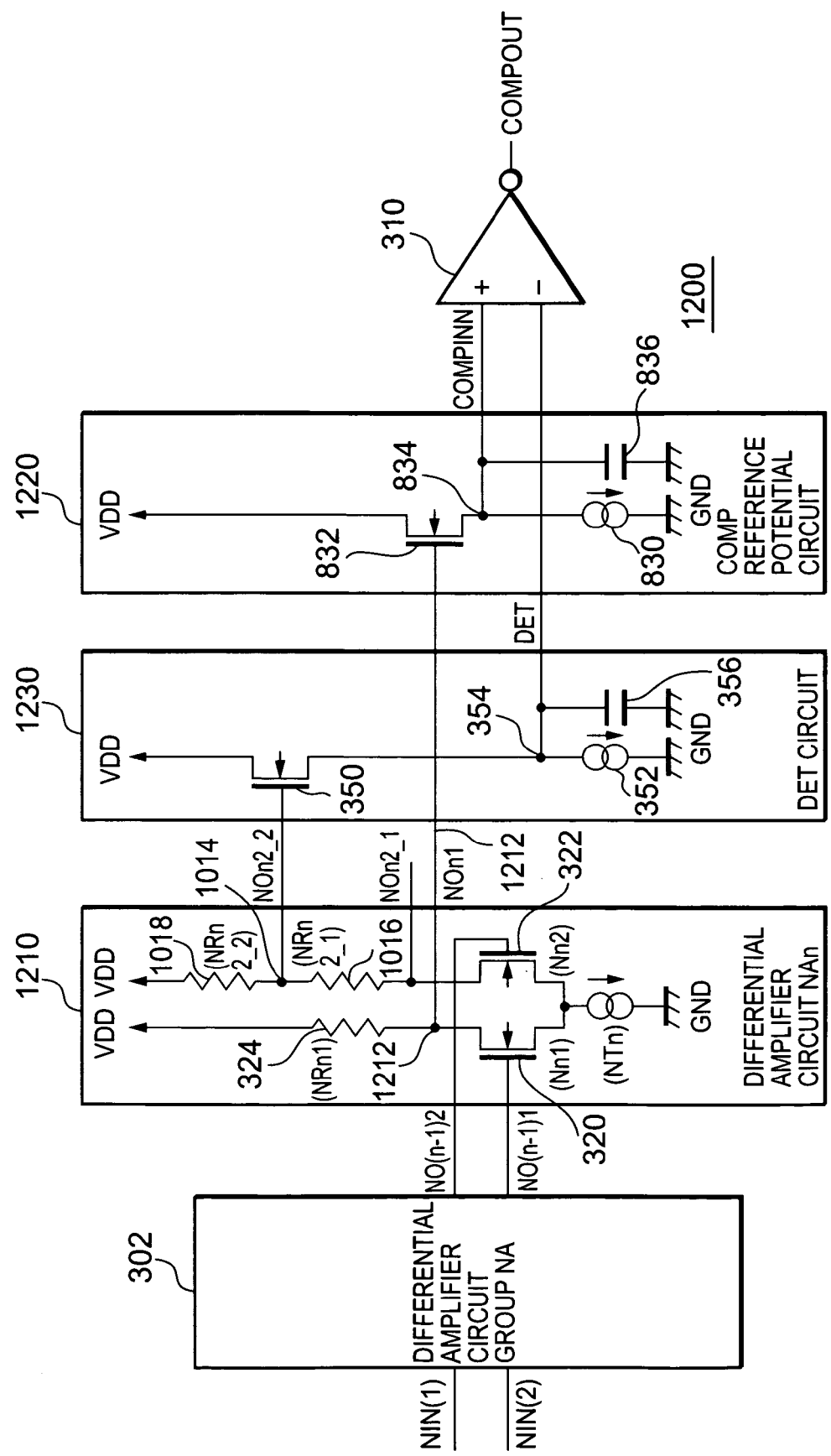
FIG. 12 is a circuit diagram depicting a still further embodiment of a semiconductor integrated circuit.
Figure 13:
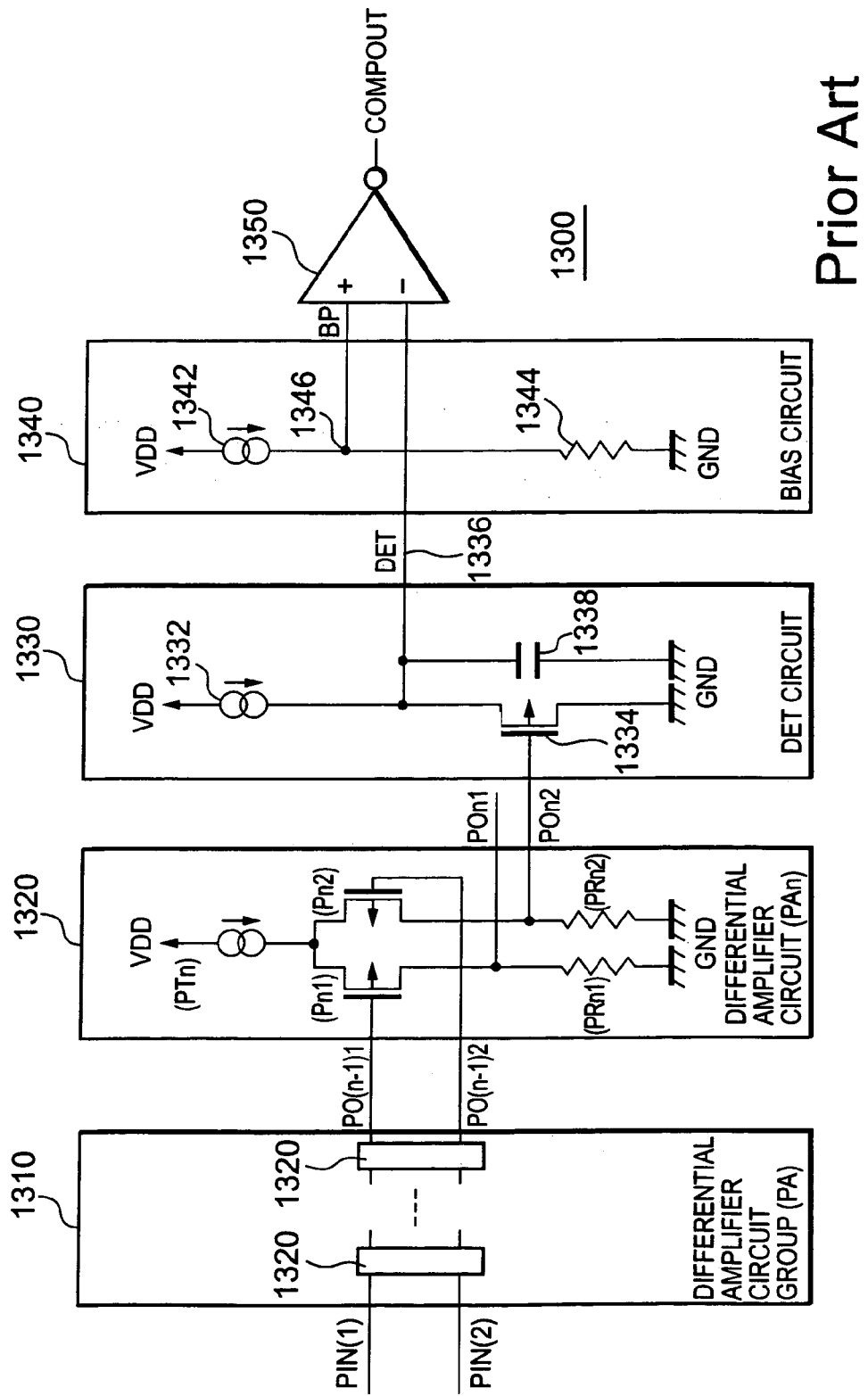
FIG. 13 is a circuit diagram showing a conventional configuration of a differential amplifier circuit.
Figure 14:
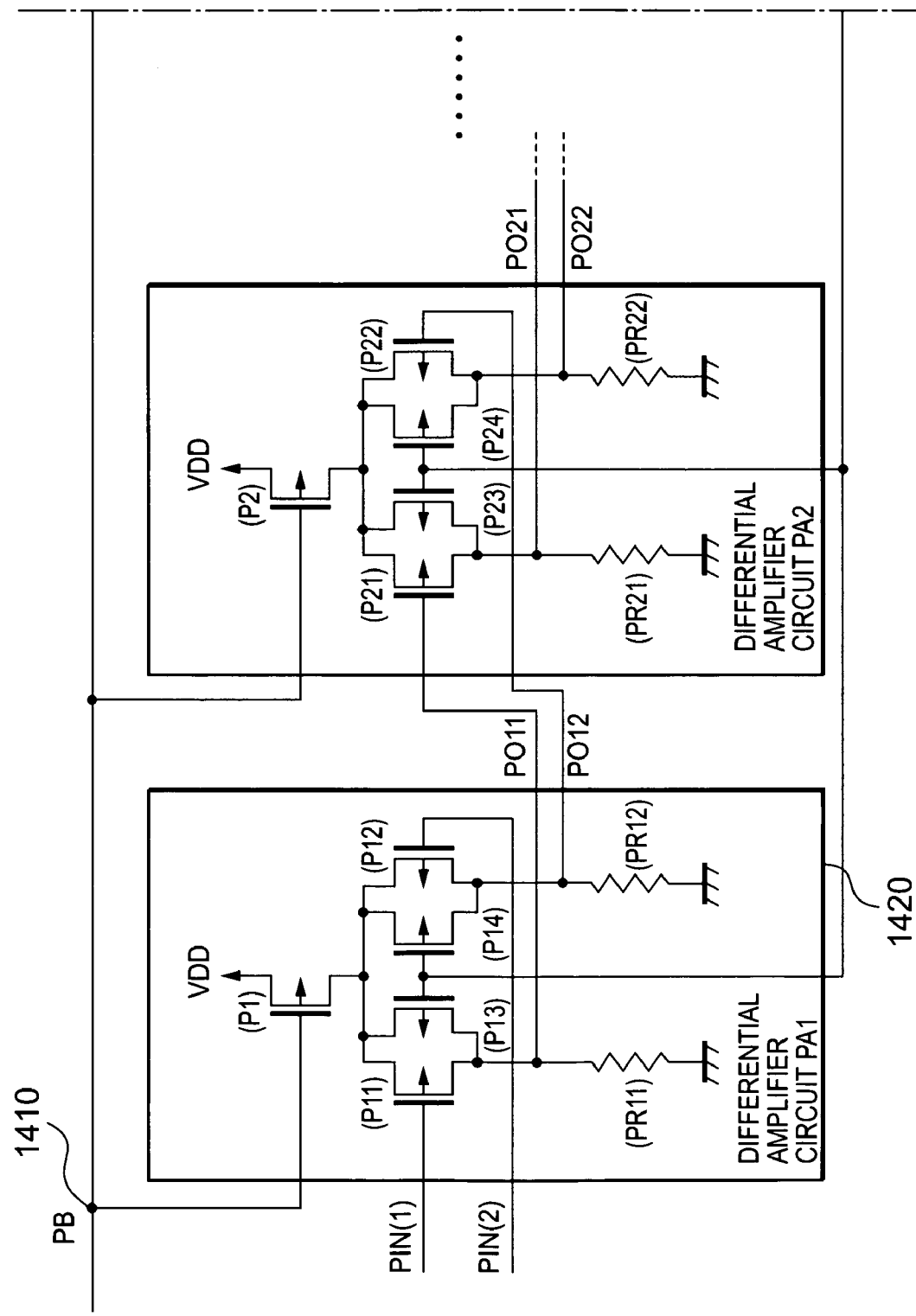
FIG. 14 is a circuit diagram depicting another embodiment of a semiconductor integrated circuit in combination with FIG. 15.
Figure 15:
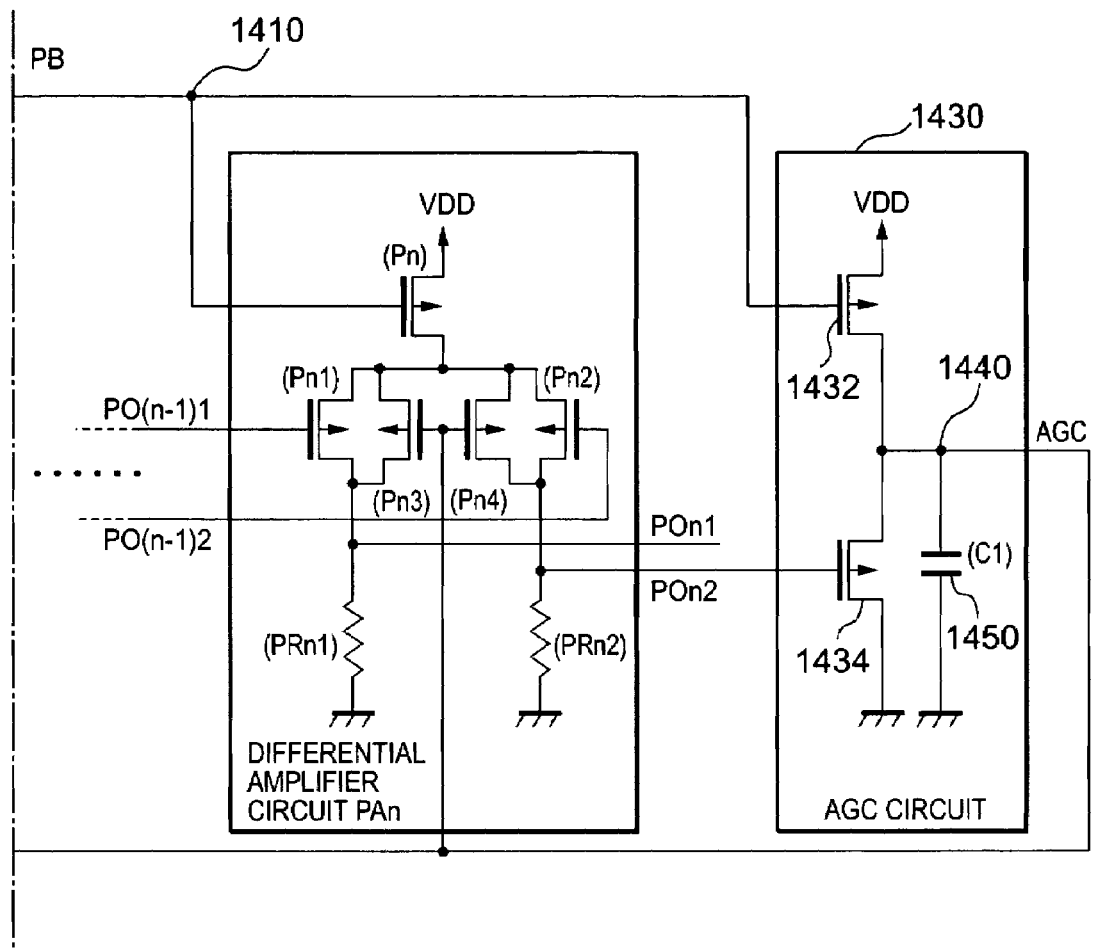
FIG. 15 is a circuit diagram showing a further embodiment of a semiconductor integrated circuit in combination with FIG. 14.
Figure 16:
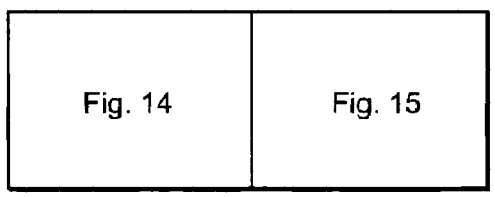
FIG. 16 is a diagram showing a combined state of FIGS. 15 and 16.

A still further embodiment of a semiconductor integrated circuit will next be explained. Referring to FIG. 12, the semiconductor integrated circuit 1200 includes a differential amplifier circuit group (NA) 302 and a final-stage differential amplifier circuit (NAn) 1210, a COMP reference potential circuit 1220 connected to one output (N0n1) 1212 of the differential amplifier circuit (NAn) 1210, a detection (DET) circuit 1230 connected to the other output (N0n2_2) 1014 thereof and a comparator 310 connected to the respective outputs of the COMP reference potential circuit 1220 and the detection (DET) circuit 1230. The present embodiment is different from the embodiment shown in FIG. 10 in that the differential amplifier circuit (NAn) 1210 is provided and the output 1212 thereof is connected to the COMP reference potential circuit 1220.

In the present embodiment as shown in the figure, a connecting point 1212 of a source terminal of an NMOS transistor 320 provided in the differential amplifier circuit (NAn) 1210 and a resistor (NRn1) 324 forms the output 1212 of the differential amplifier circuit (NAn) 1210, and the output 1212 thereof is connected to its corresponding gate terminal of an NMOS transistor 832 provided in the COMP reference potential circuit 1220. The differential amplifier circuit (NAn) 1210 may be identical in other configuration to the differential amplifier circuit (NAn) 1010 shown in FIG. 10.

The COMP reference potential circuit 1220 and the detection (DET) circuit 1230 may respectively take internal configurations similar to those identified by the same reference numerals in the COMP reference potential circuit 1020 and the detection (DET) circuit 1030 shown in FIG. 10. However, the COMP reference potential circuit 1220 is different from the COMP reference potential circuit 1020 in that it is connected to the output (N0n1) 1212 of the differential amplifier circuit 1210.

Similarly even in the present embodiment, the detection (DET) circuit 1230 detects the peak on the amplitude Low side of an output signal (N0n2_2) 1014 of the differential amplifier circuit (NAn) 1210 and outputs a detect signal having levels "H" and "L". On the other hand, the COMP reference potential circuit 1220 is configured in such a manner that a condenser 836 is made up of a condenser having a capacitive value larger than that of a condenser 356 provided in the detection circuit 1230, and only the large amplitude-side peak on the amplitude Low side of the output signal (N0n2_2) 1014 of the differential amplifier circuit (NAn) 1210 is detected.

When, for example, the total gain of the differential amplifier circuit group (NA) 302 is set as 70 [dB], an ASK-modulated sine wave having a maximum amplitude of 30 [μV] and a minimum amplitude of 3 [μV] is inputted to its corresponding input NIN(1), and a signal antiphase to the signal at the input NIN(1) is inputted to its corresponding input NIN(2) under such a configuration, a signal waveform amplified to a maximum amplitude of 94 [mV] and a minimum amplitude of 9.4 [mV] is outputted to each of outputs (N0(n-1)1) and (N0(n-1)2) of the differential amplifier circuit group (NA) 302.

Assuming now that the gain of the differential amplifier circuit (NAn) 1210 is 10 [dB], a current of 1 [μA] flows through a constant current circuit (NTn), the resistance value of the resistor (NRn1) 324 is 400 [kΩ] and the resistance values of resistors (NRn2_1) 1016 and (NRn2_2) 1018 are respectively 200 [kΩ], a signal waveform having a maximum amplitude of 300 [mV], a minimum amplitude of 30 [mV] and a bias operating potential of (VDD−200 [mV]) is outputted to the output (N0n1) 1212 of the differential amplifier circuit (NAn) 1210. At this time, the peak potential on the Low side at the maximum amplitude ranges from ((VDD)−(200 [mV])−300 [mV]/2) to (VDD−50 [mV]), and the peak potential on the Low side at the minimum amplitude ranges from ((VDD)−(200 [mV])−30 [mV]/2) to (VDD−185 [mV]).

The output (N0n2_2) 1014 of the differential amplifier circuit (NAn) 1210 outputs a signal waveform equivalent to ½ in amplification factor and bias operating potential, respectively, with respect to the output signal (N0n1) 1212. Thus, a signal waveform having a maximum amplitude of 150 [mV], a minimum amplitude of 15 [mV] and a bias operating potential of (VDD−100 [mV]) is outputted therefrom. At this time, the peak potential on the Low side at the maximum amplitude is (VDD−25 [mV]) and the peak potential on the Low side at the minimum amplitude is (VDD−92.5 [mV]).

The output signal (N0n2_2) 1014 outputted from the differential amplifier circuit (NAn) 1210 is inputted to its corresponding gate terminal of an NMOS transistor 350 provided in the detection (DET) circuit 1230. By virtue of a source follower circuit provided in the detection circuit 1230 and the condenser 356 thereof, the input signal is reduced by a VT potential of the NMOS transistor and demodulated into a signal having an amplitude of 67.5 [mV], which in turn is outputted as a detect signal (DET) 354. Since, at this time, the output potential of the detect signal (DET) 354 is brought to the output signal (N0n2_2) 1014 of the differential amplifier circuit (NAn) 1210, i.e., (gate potential of NMOS transistor 350)+(VT voltage of NMOS transistor), the level "H" signal potential of the detect signal (DET) 354 is ((VDD−92.5 [mV])−(VT voltage of NMOS transistor). The level "L" signal potential of the detect signal (DET) 354 is ((VDD−25 [mV])−(VT voltage of NMOS transistor). The detect signal (DET) 354 is inputted to the input on the minus (−) side of the comparator 310.

The output signal (N0n1) 1212 outputted from the differential amplifier circuit (NAn) 1210 is inputted to the gate terminal of the NMOS transistor 832 provided in the COMP reference potential circuit 1220. By virtue of a source follower circuit of the COMP reference potential circuit 1220 and the condenser 836 thereof, the High-side peak of the large amplitude signal of the input signal (N0n1) 1212 is detected and reduced by a VT potential of the NMOS transistor 832, after which a COMPINN signal 834 having a constant potential is outputted. Since, at this time, the output potential of the COMPINN signal 834 reaches an output signal (N0n2_1) 1012 of the differential amplifier circuit (NAn) 1010, i.e., (gate potential of NMOS transistor 832)+(VT voltage of NMOS transistor), its output potential results in ((VDD−50 [mV])+VT voltage of NMOS transistor)).

At this time, the source follower circuit of the detection (DET) circuit 1230 and the source follower circuit of the COMP reference potential circuit 1220 are configured on the semiconductor integrated circuit with the same circuit. Thus, since the NMOS transistor 350 of the detection (DET) circuit 1230 and the NMOS transistor 832 of the COMP reference potential circuit 1220 become respectively identical in drop in the VT potential in this case, the output signal (COMPINN) 834 of the COMP reference potential circuit 1220 is brought to the middle of the amplitude of the output signal (DET) 354 of the detection (DET) circuit 1230.

The output signal (DET) 354 of the detection (DET) circuit 1230 and the output signal (COMPINN) 834 of the COMP reference potential circuit 1220 are respectively inputted to the comparator 310, where a signal antiphase to the detect signal (DET) is brought to a signal between the power supply VDD and the ground GND, which in turn is outputted as a COMPOUT signal.

With the setting of these configurations, even when VT variations of the NMOS transistor take place, the output signal (DET) 354 of the detection (DET) circuit 1230 and the output signal (COMPINN) 834 of the COMP reference potential circuit 1220 are both affected by similar VT variations. Therefore, the output signal (COMPINN) of the COMP reference potential circuit 1220 always reaches the intermediate value of the amplitude of the output signal (DET) of the detection (DET) circuit 1230, and the output signal COMPOUT of the comparator 310 can provide or bring about an expected value.

According to the above embodiment as mentioned above, the differential amplifier circuit (NAn) 1210 and the COMP reference potential circuit 1220 are provided on the semiconductor integrated circuit. Thus, even when the VT variations of the NMOS transistor take place, the output signal (DET) of the detection circuit 1230 and the output signal (COMPINN) of the COMP reference potential circuit 1220 are similarly affected by the VT variations. Therefore, the output signal (COMPINN) of the COMP reference potential circuit 1220 always reaches the intermediate value of the amplitude of the output signal (DET) of the detection circuit 1230. Even when the amplitude of the signal inputted to each of the inputs NIN(1) and NIN(2) is small, the output signal COMPOUT of the comparator 310 can provide an expected value.

Figure 17:
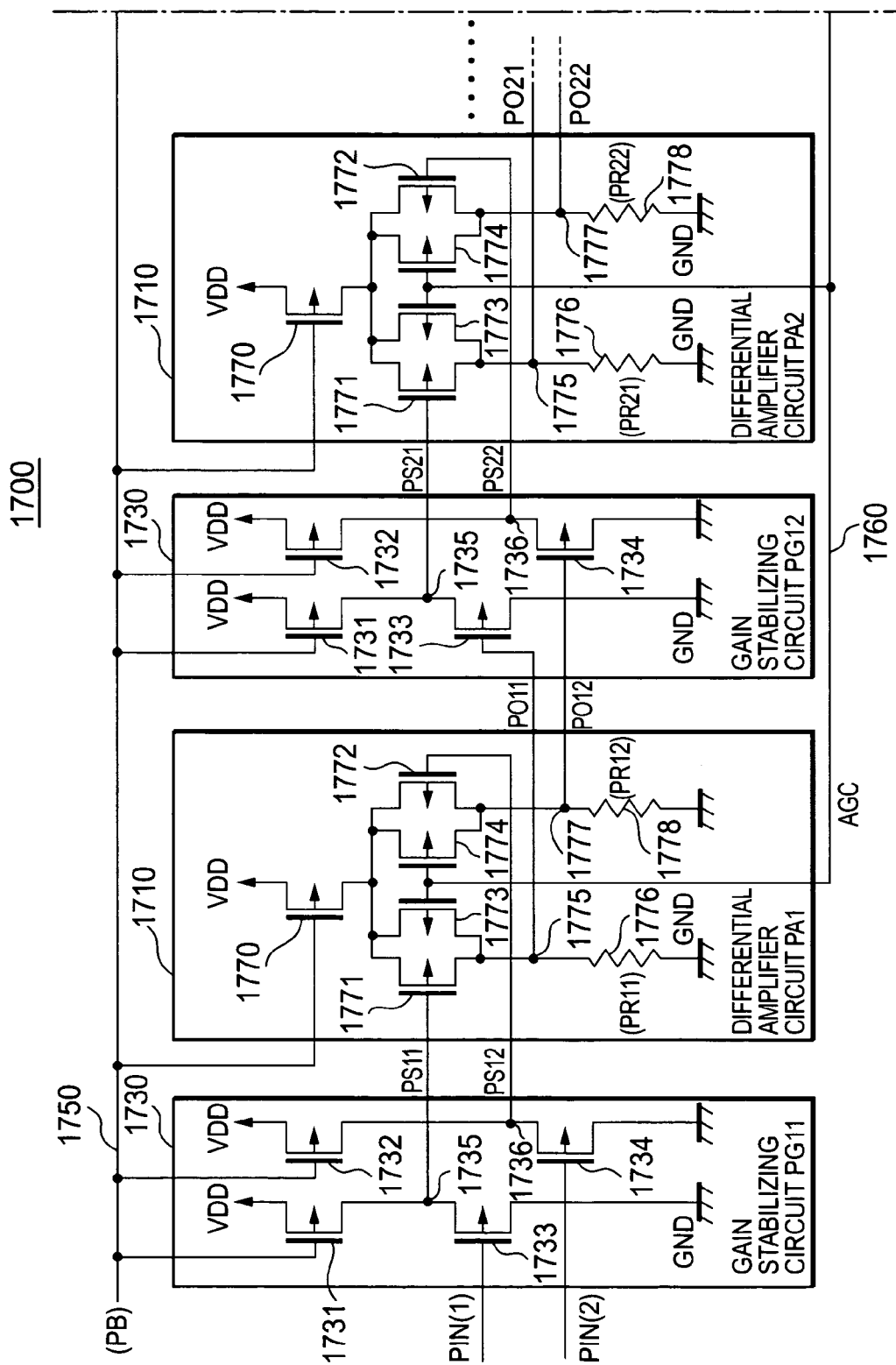
FIG. 17 is a circuit diagram illustrating a still further embodiment of a semiconductor integrated circuit in combination with FIG. 18.
Figure 18:
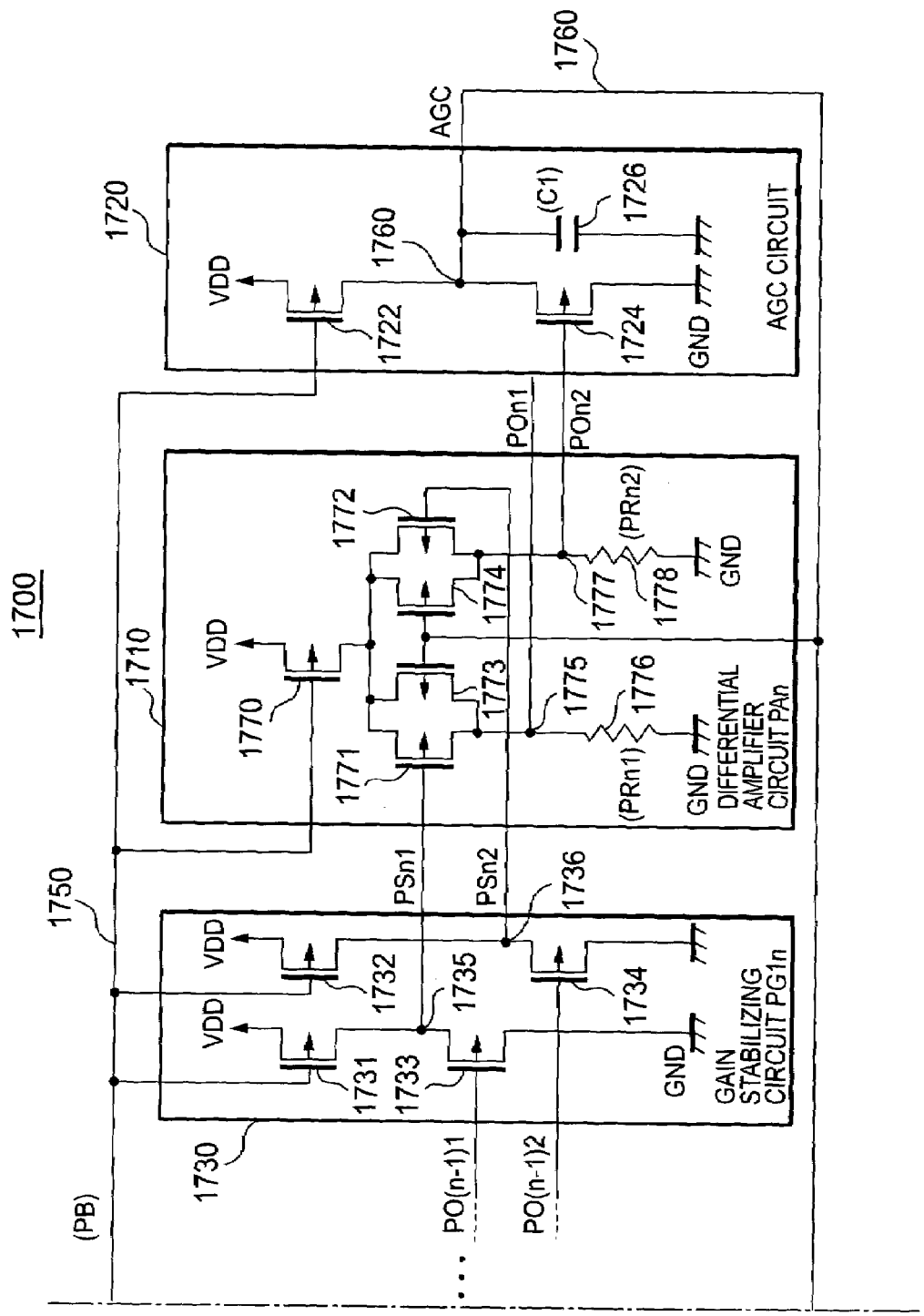
FIG. 18 is a circuit diagram depicting a still further embodiment of a semiconductor integrated circuit in combination with FIG. 17.

A still further embodiment of a semiconductor integrated circuit will next be explained. The semiconductor integrated circuit according to the present embodiment is shown in FIGS. 17 and 18. Incidentally, both figures are combined together as shown in FIG. 19. As shown in FIGS. 17 and 18, the semiconductor integrated circuit 1700 according to the present embodiment includes a plurality of differential amplifier circuits (PA1 through PAn) 1710 (where n: whole number indicative of the number of connecting stages of differential amplifier circuits PA). An output (P0n2) of the final-stage differential amplifier circuit PAn is connected to an automatic gain control (AGC) circuit 1720. Further, gain stabilizing circuits (PG11 through PG1n) 1730 are connected to their corresponding inputs of the differential amplifier circuits (PA1 through PAn) 1710 of the respective stages. Respective outputs ((PS11, PS12) through (PSn1, PSn2)) of the respective gain stabilizing circuits (PG11 through PG1n) 1730 are connected to their corresponding next-stage differential amplifier circuits (PA1 through PAn) 1710. An input PIN(1) and an input PIN(2) are connected to the first-stage gain stabilizing circuit (PG11) 1730.

A connecting line 1750 for inputting a bias signal (PB) is connected to these gain stabilizing circuits (PG11 through PG1n) 1730, differential amplifier circuits (PA1 through PAn) 1710 and automatic gain control (AGC) circuit 1720. Further, an output 1760 of the automatic gain control (AGC) circuit 1720 is connected to the respective differential amplifier circuits (PA1 through PAn) 1710 so that a gain control signal (AGC) is supplied thereto respectively.

One gain stabilizing circuit (PG11) 1730 will be explained as a representative of the gain stabilizing circuits (PG11 (PG12 through PG1n)). The gain stabilizing circuit (PG11) has PMOS transistors 1731 and 1732 of which the source terminals are respectively connected to a power supply VDD and the gate terminals are respectively connected to the bias signal (PB) input 1750. The drain of one PMOS transistor 1731 is further connected to the source of a PMOS transistor 1733. The drain of the other PMOS transistor 1732 is connected to the source of a PMOS transistor 1734. The drains of the PMOS transistors 1732 and 1734 are respectively connected to a ground GND. Gate terminals of the PMOS transistors 1733 and 1734 are respectively connected to an input PIN(1) and an input PIN(2). Connecting points 1735 and 1736 of source terminals of these PMOS transistors 1733 and 1734 respectively constitute outputs ((PS11), (PS12)) of the gain stabilizing circuit (PG11) and are respectively connected to the differential amplifier circuit (PA1) of the same stage.

Incidentally, the gain stabilizing circuits (PG12 through PG1n) starting forward from the following stage also have configurations similar to the gain stabilizing circuit (PG11) but are different from one another in that outputs (P011 through P0(n-1)1) and (P012 through P0(n-1)2) of the differential amplifier circuits 1710 placed in pre-stages respectively are connected to their corresponding gate terminals of the PMOS transistors 1733 and 1734 disposed in the gain stabilizing circuits (PG12 through PG1n).

The differential amplifier circuit (PA1) 1710 connected to the outputs (PS11) 1735 and (PS12) 1736 of the gain stabilizing circuit PG11 include PMOS transistors 1771 and 1772 whose gate terminals are connected with these outputs 1735 and 1736 respectively. The differential amplifier circuit (PA1) includes a PMOS transistor 1770 having a source terminal to which the power supply VDD is connected and a gate terminal to which the bias signal input (PB) 1750 is connected, and the PMOS transistors 1771, 1772, 1773 and 1774 respectively having source terminals to which a drain terminal of the PMOS transistor 1770 is connected.

Drain terminals of the PMOS transistors 1771 and 1773 are interconnected with each other. A connecting point 1775 of the drain terminals thereof is connected to the ground GND via a resistor (PR11) 1776 and constitutes an output 1775 of the differential amplifier circuit (PA1) 1710 that outputs an output (P011). Also drain terminals of the PMOS transistors 1772 and 1774 are connected to each other. A connecting point 1777 of the drain terminals thereof is connected to the ground GND via a resistor (PR12) 1778 and constitutes an output 1777 of the differential amplifier circuit (PA1) 1710 that outputs an output (P012). Further, gate terminals of the PMOS transistors 1773 and 1774 are interconnected with each other and further connected with a connecting line 1760 inputted with an AGC signal.

These differential amplifier circuits (PA1 through PAn) 1710 respectively output outputs P011(P021 through P0n1) from their corresponding nodes 1775 to which the drain terminals of the PMOS transistors 1771 and 1773 are connected, and respectively output outputs P012(P022 through P0n2) from their corresponding nodes 1777 to which the drain terminals of the PMOS transistors 1772 and 1774 are connected.

An output signal P0n2 outputted from the output 1777 of the differential amplifier circuit (PAn) 1710 laid out at the last stage shown in FIG. 18 is inputted to the automatic gain control (AGC) circuit 1720. The automatic gain control (AGC) circuit 1720 includes a PMOS transistor 1722 having a source terminal to which the power supply VDD is connected and a gate terminal to which the bias signal input (BP) 1750 is connected, and a PMOS transistor 1724 having a source terminal connected to a drain terminal of the PMOS transistor 1722. A gate terminal of the PMOS transistor 1724 is connected to its corresponding output (P0n2) 1777 of the differential amplifier circuit (PAn) 1710, and a drain terminal thereof is connected to the ground GND. A node 1760 to which the drain terminal of the PMOS transistor 1722 and the source terminal of the PMOS transistor 1724 are connected, is connected to the ground GND via a condenser 1726, and constitutes an output 1760 that outputs a gain control signal (AGC). The gain control signal (AGC) is supplied to the respective differential amplifier circuits (PA1 through PAn) 1710.

The operation of the semiconductor integrated circuit 1700 according to the present embodiment will be explained under the above configuration. A sine wave is first inputted to the input PIN(1). A sine wave antiphase to the sine wave at the input PIN(1) is inputted to the input PIN(2). Further, a signal amplified by each of the differential amplifier circuits (PA1 through PAn) 1710 is transmitted to the automatic gain control (AGC) circuit 1720 as an output signal (P0n2) of the final-stage differential amplifier circuit (PAn) 1710. At this time, the input signals PIN(1) and PIN(2) are inputted to their corresponding gate terminals of the PMOS transistors 1733 and 1734 of the gain stabilizing circuit (PG11). Output signals (P011 through P0(n-1)1) and (P012 through P0(n-1)2) of the differential amplifier circuits 1710 are inputted to their corresponding gate terminals of the PMOS transistors 1733 and 1734 of the gain stabilizing circuits (PG12 through PG1n).

In the gain stabilizing circuits (PG11 through PG1n) 1730, these input signals are respectively varied by VT variations in a manner similar to an AGC potential to be described later and raised by VT potentials of PMOSs, which in turn are respectively outputted from the gain stabilizing circuits (PG11 through PG1n) 1730 as outputs (PS11 through PSn1) and outputs (PS12 through PSn2).

The signals (PS11 through PSn1) and signals (PS12 through PSn2) outputted from the gain stabilizing circuits (PG11 through PG1n) are inputted to their corresponding gate terminals of the PMOS transistors 1771 and 1772 of the differential amplifier circuits (PA1 through PAn). The output signal (P0n2) 1777 of the final-stage differential amplifier circuit (PAn) 1710 is raised by a PMOS's VT potential by means of the PMOS transistor 1724 of the AGC circuit 1720 and the Low-side peak of the amplified sine wave is detected by the condenser 1726, after which a gain control signal AGC is outputted to the output 1760. The gain control signal (AGC) is inputted to the gate terminals of the PMOS transistors 1773 and 1774 of the differential amplifier circuits (PA1 through PAn) 1710.

When the potential (AGC potential) of the gain control signal (AGC) 1760 is sufficiently higher than the potentials of the signals inputted to the gate terminals of the PMOS transistors 1771 and 1772 in the differential amplifier circuits (PA1 through PAn) 1710, the currents equivalent to ½ of current values defined by the PMOS transistors 1770 respectively flow into the PMOS transistors 1771 and 1772. The gains and potentials of the output signals (P011 through P0n1) and (P012 through P0n2) are determined based on the current values of the PMOS transistors 1771 and 1772 and the resistance values of the resistors (PR11 through PRn1) 1776 and resistors (PR12 through PRn2) 1778.

When the gain control signal (AGC) 1760 becomes low, the current flows into each of the PMOS transistors 1773 and 1774. Therefore, the currents that flow through the PMOS transistors 1771 and 1772 become small and hence the gains of the output signals (P011 through P0n1) and (P012 through P0n2) become low. At this time, their output potentials remain unchanged. Thus, gain control is carried out by the gain control signal (AGC) 1760 regardless of the magnitudes of the amplitudes of the input signals PIN(1) and PIN(2), whereby a stable output signal is obtained.

According to the above embodiment as mentioned above, the semiconductor integrated circuit 1700 is provided with the gain stabilizing circuits (PG11 through PG1n) 1730 respectively. Therefore, even when the VTs of PMOSs vary and the AGC potential varies with the variations, the input PIN(1) and input PIN(2) and the output signals (P011 through P0(n-1)1) 1775 and (P012 through P0(n-1)2) 1777 of the differential amplifier circuits 1710 are changed by VT variations in the gain stabilizing circuits (PG11 through PG1n) 1730 in a manner similar to the AGC potential. The so-changed signals are respectively outputted as the outputs (PS11 through PSn1) and (PS12 through PSn2) and inputted to the gate terminals of the PMOS transistors 1771 and 1772 of the differential amplifier circuits (PA1 through PAn) 1710, so that a stable output can be obtained.

Figure 20:
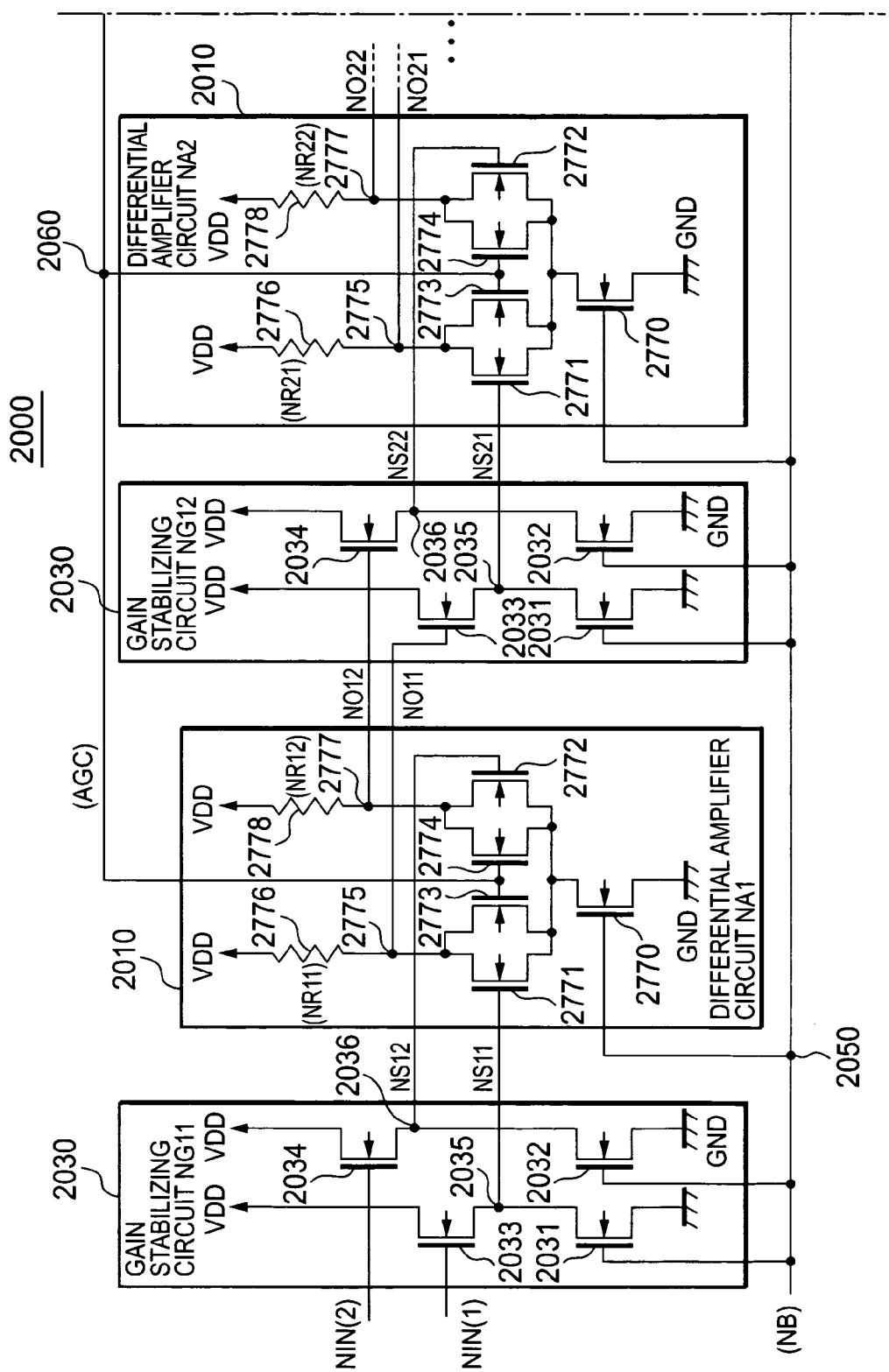
FIG. 20 is a circuit diagram illustrating a still further embodiment of a semiconductor integrated circuit in combination with FIG. 21.
Figure 21:
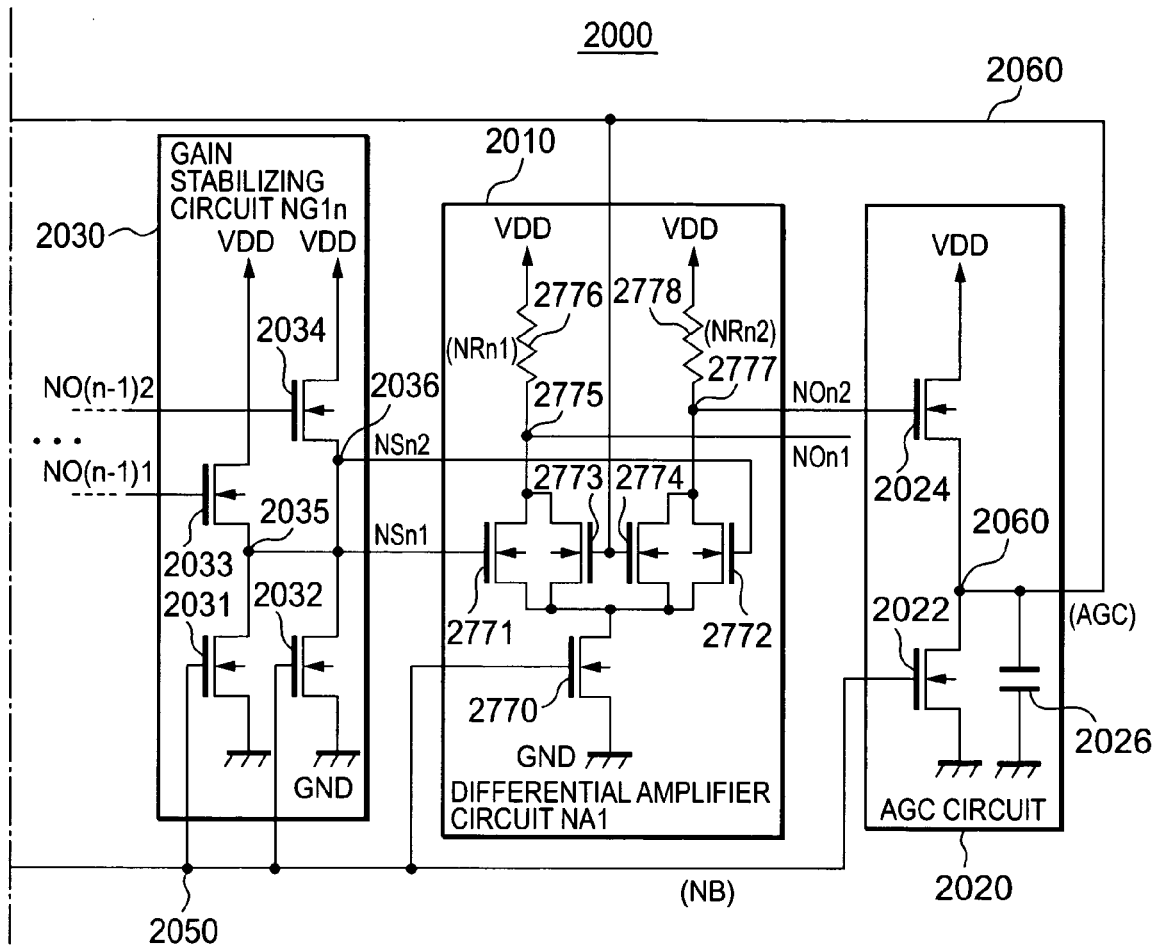
FIG. 21 is a circuit diagram depicting a still further embodiment of a semiconductor integrated circuit in combination with FIG. 20.
Figure 22:
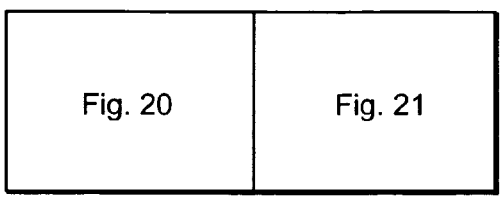
FIG. 22 is a diagram showing a combined state of FIGS. 20 and 21.

A still further embodiment of a semiconductor integrated circuit will next be explained. The semiconductor integrated circuit according to the present embodiment is shown in FIGS. 20 and 21. Incidentally, both figures are combined together as shown in FIG. 22. As shown in FIGS. 20 and 21, the semiconductor integrated circuit 2000 according to the present embodiment includes a plurality of differential amplifier circuits (NA1 through NAn) 2010 (where n: whole number indicative of the number of connecting stages of differential amplifier circuits NA). An output (N0n2) of the final-stage differential amplifier circuit NAn is connected to an automatic gain control (AGC) circuit 2020. Further, gain stabilizing circuits (NG11 through NG1n) 2030 are connected to their corresponding inputs of the differential amplifier circuits (NA1 through NAn) 2010 of the respective stages. Respective outputs ((NS11, NS12) through (NSn1, NSn2)) of the respective gain stabilizing circuits (NG11 through NG1n) 2030 are connected to their corresponding next-stage differential amplifier circuits (NA1 through NAn) 2010. An input NIN(1) and an input NIN(2) are connected to the first-stage gain stabilizing circuit (NG11) 2030.

A connecting line 2050 for inputting a bias signal (NB) is connected to these gain stabilizing circuits (NG11 through NG1n) 2030, differential amplifier circuits (NA1 through NAn) 2010 and automatic gain control (AGC) circuit 2020. Further, an output 2060 of the automatic gain control (AGC) circuit 2020 is connected to the respective differential amplifier circuits (NA1 through NAn) 2010 so that a gain control signal (AGC) is supplied thereto respectively.

One gain stabilizing circuit (NG11) 2030 will be explained as a representative of the gain stabilizing circuits (NG11(NG12 through NG1n)). The gain stabilizing circuit (NG11) has PMOS transistors 2031 and 2032 of which the source terminals are respectively connected to a ground GND and the gate terminals are respectively connected to the bias signal (NB) input 2050. The drain of one NMOS transistor 2031 is further connected to the source of an NMOS transistor 2033. The drain of the other NMOS transistor 2032 is connected to the source of an NMOS transistor 2034. The drains of the NMOS transistors 2032 and 2034 are respectively connected to a power supply VDD. Gate terminals of the NMOS transistors 2033 and 2034 are respectively connected to an input NIN(1) and an input NIN(2). Connecting points 2035 and 2036 of source terminals of these NMOS transistors 2033 and 2034 respectively constitute outputs ((NS11), (NS12)) of the gain stabilizing circuit (NG11) and are respectively connected to the differential amplifier circuit (NA1) 2010 of the same stage.

Incidentally, the gain stabilizing circuits (NG12 through NG1n) 2030 starting forward from the following stage also have configurations similar to the gain stabilizing circuit (NG11) but are different from one another in that outputs (N011 through N0(n-1)1) and (N012 through N0(n-1)2) of the differential amplifier circuits 2010 placed in pre-stages respectively are connected to their corresponding gate terminals of the NMOS transistors 2033 and 2034 disposed in the gain stabilizing circuits (NG12 through NG1n).

The differential amplifier circuit (NA1) 2010 connected to the outputs (NS11) 2035 and (NS12) 2036 of the gain stabilizing circuit NG11 includes NMOS transistors 2771 and 2772 whose gate terminals are connected with these outputs 2035 and 2036 respectively. The differential amplifier circuit (NA1) 2010 includes an NMOS transistor 2770 having a source terminal connected to the ground GND and a gate terminal to which the bias signal input (NB) 2050 is connected, and the NMOS transistors 2771, 2772, 2773 and 2774 respectively having source terminals to which a drain terminal of the NMOS transistor 2770 is connected.

Drain terminals of the NMOS transistors 2771 and 2773 are interconnected with each other. A connecting point 2775 of the drain terminals thereof is connected to the power supply VDD via a resistor (NR11) 2776 and constitutes an output 2775 of the differential amplifier circuit (NA1) 2010 that outputs an output (N011). Also drain terminals of the NMOS transistors 2772 and 2774 are connected to each other. A connecting point 2777 of the drain terminals thereof is connected to the power supply VDD via a resistor (NR12) 2778 and constitutes an output 2777 of the differential amplifier circuit (NA1) 2010 that outputs an output (N012). Further, gate terminals of the NMOS transistors 2773 and 2774 are interconnected with each other and further connected with a connecting line 2060 inputted with an AGC signal.

These differential amplifier circuits (NA1 through NAn) 2010 respectively output outputs N011 (N021 through N0n1) from their corresponding nodes 2775 to which the drain terminals of the NMOS transistors 2771 and 2773 are connected, and respectively output outputs N012 (N022 through N0n2) from their corresponding nodes 2777 to which the drain terminals of the NMOS transistors 2772 and 2774 are connected.

An output signal N0n2 outputted from the output 2777 of the differential amplifier circuit (NAn) 2010 laid out at the last stage shown in FIG. 21 is inputted to the automatic gain control (AGC) circuit 2020. The automatic gain control (AGC) circuit 2020 includes an NMOS transistor 2022 having a source terminal to which the ground GND is connected and a gate terminal to which the bias signal input (NP) 2050 is connected, and an NMOS transistor 2024 having a source terminal connected to a drain terminal of the NMOS transistor 2022. A gate terminal of the NMOS transistor 2024 is connected to its corresponding output (N0n2) 2777 of the differential amplifier circuit (NAn) 2010, and a drain terminal thereof is connected to the power supply VDD. A node 2060 to which the drain terminal of the NMOS transistor 2022 and the source terminal of the NMOS transistor 2024 are connected, is connected to the ground GND via a condenser 2026, and constitutes an output 2060 that outputs a gain control signal (AGC). The gain control signal (AGC) is supplied to the respective differential amplifier circuits (NA1 through NAn) 2010.

The operation of the semiconductor integrated circuit 2000 according to the present embodiment will be explained under the above configuration. A sine wave is first inputted to the input NIN(1). A sine wave antiphase to the sine wave at the input NIN(1) is inputted to the input NIN(2). Further, a signal amplified by each of the differential amplifier circuits (NA1 through NAn) 2010 is transmitted to the automatic gain control (AGC) circuit 2020 as an output signal (N0n2) of the final-stage differential amplifier circuit (NAn) 2010. At this time, the input signals NIN(1) and NIN(2) are inputted to their corresponding gate terminals of the NMOS transistors 2033 and 2034 of the gain stabilizing circuit (NG11). Output signals (N011 through N0(n-1)1) and (N012 through N0(n-1)2) of the differential amplifier circuits 2010 are inputted to their corresponding gate terminals of the MMOS transistors 2033 and 2034 of the gain stabilizing circuits (NG12 through NG1n).

In the gain stabilizing circuits (NG11 through NG1n) 2030, these input signals are respectively varied by VT variations in a manner similar to an AGC potential to be described later and reduced by VT potentials of NMOSs, which in turn are respectively outputted from the gain stabilizing circuits (NG11 through NG1n) 2030 as outputs (NS11 through NSn1) and outputs (NS12 through NSn2).

The signals (NS11 through NSn1) and signals (NS12 through NSn2) outputted from the gain stabilizing circuits (NG11 through NG1n) are inputted to their corresponding gate terminals of the NMOS transistors 2771 and 2772 of the differential amplifier circuits (NA1 through NAn). The output signal (N0n2) 2777 of the final-stage differential amplifier circuit (NAn) 2010 is reduced by a PMOS's VT potential by means of the NMOS transistor 2024 of the AGC circuit 2020 and the High-side peak of the amplified sine wave is detected by the condenser 2026, after which a gain control signal AGC is outputted to the output 2060. The gain control signal (AGC) is inputted to the gate terminals of the NMOS transistors 2773 and 2774 of the differential amplifier circuits (NA1 through NAn) 2010.

When the potential (AGC potential) of the gain control signal (AGC) 2060 is sufficiently lower than the potentials of the signals inputted to the gate terminals of the NMOS transistors 2771 and 2772 in the differential amplifier circuits (NA1 through NAn) 2010, the currents equivalent to ½ of current values defined by the NMOS transistors 2770 respectively flow into the NMOS transistors 2771 and 2772. The gains and potentials of the output signals (N011 through N0n1) and (N012 through N0n2) are respectively determined based on the current values of the NMOS transistors 2771 and 2772 and the resistance values of the resistors (NR11 through NRn1) 2776 and resistors (NR12 through NRn2) 2778.

When the gain control signal (AGC) 2060 becomes low, the current flows into each of the NMOS transistors 2773 and 2774. Therefore, the currents that flow through the NMOS transistors 2771 and 2772 become small and hence the gains of the output signals (N011 through N0n1) and (N012 through N0n2) become low. At this time, their output potentials remain unchanged. Thus, gain control is carried out by the gain control signal (AGC) 2060 regardless of the magnitudes of the amplitudes of the input signals NIN(1) and NIN(2), whereby a stable output signal is obtained.

According to the above embodiment as mentioned above, the semiconductor integrated circuit 2000 is provided with the gain stabilizing circuits (NG11 through NG1n) 2030 respectively. Therefore, even when the VTs of NMOSs vary and the AGC potential varies with the variations, the input NIN(1) and input NIN(2) and the output signals (N011 through N0(n-1)1) 2775 and (N012 through N0(n-1)2) 2777 of the differential amplifier circuits 2010 are changed by VT variations in the gain stabilizing circuits (NG11 through NG1n) 2030 in a manner similar to the AGC potential. The so-changed signals are respectively outputted as the outputs (NS11 through NSn1) and (NS12 through NSn2) and inputted to the gate terminals of the NMOS transistors 2771 and 2772 of the differential amplifier circuits (NA1 through NAn) 2010, so that a stable output can be obtained.

Figure 23:
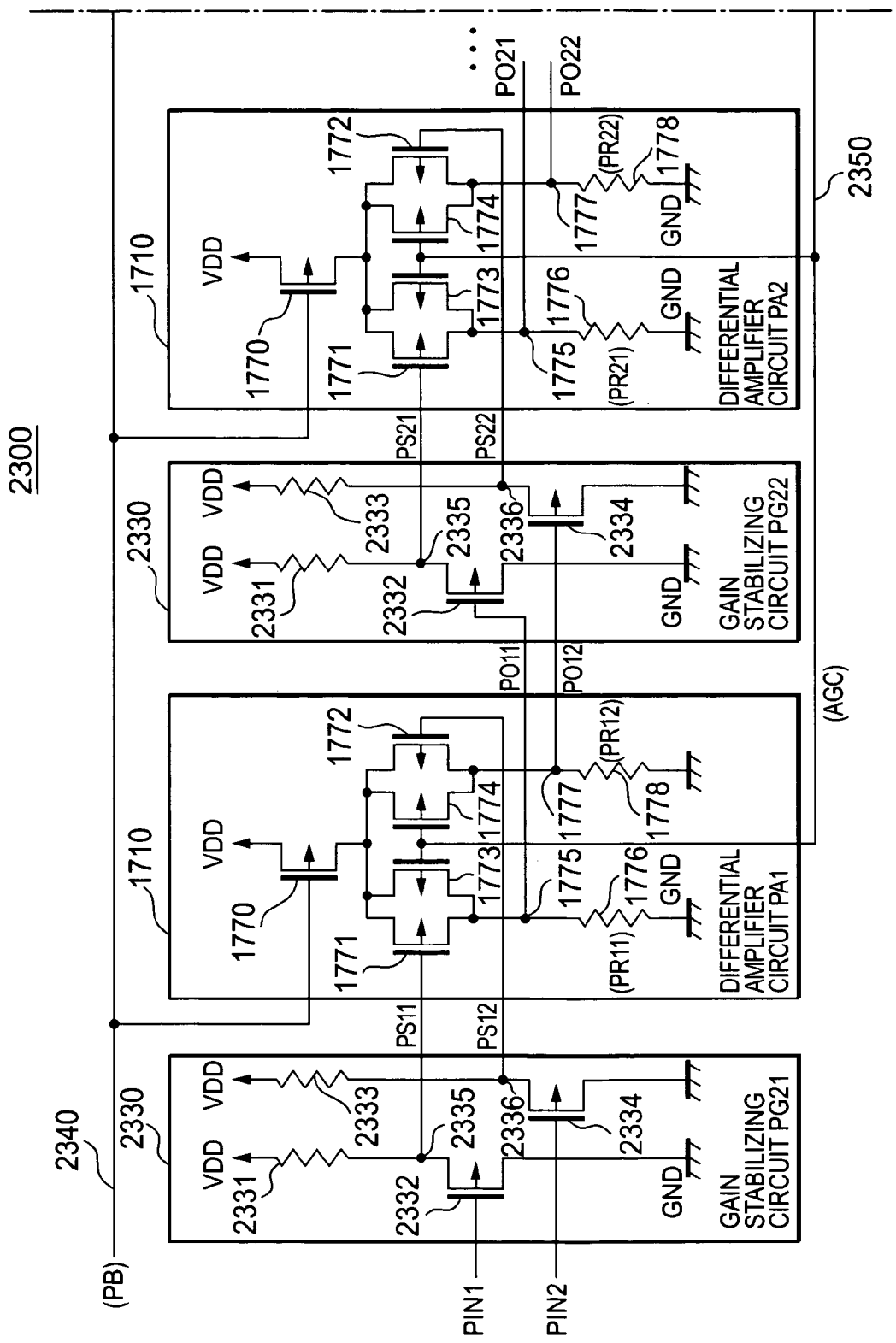
FIG. 23 is a circuit diagram depicting a still further embodiment of a semiconductor integrated circuit in combination with FIG. 24.
Figure 24:
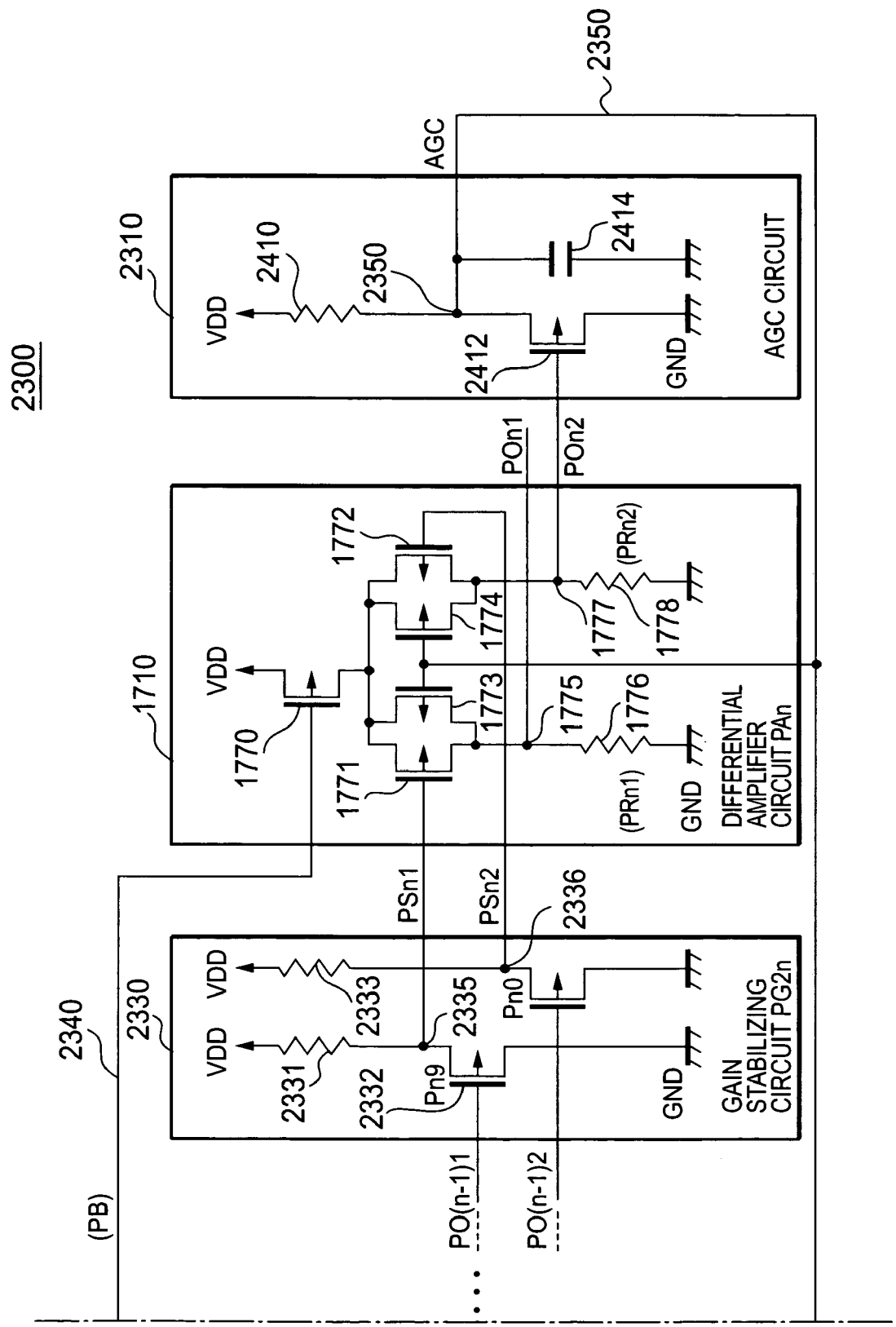
FIG. 24 is a circuit diagram showing a still further embodiment of a semiconductor integrated circuit in combination with FIG. 23.

A still further embodiment of a semiconductor integrated circuit will next be explained. The semiconductor integrated circuit according to the present embodiment is shown in FIGS. 23 and 24. Incidentally, both figures are combined together as shown in FIG. 25. As shown in FIGS. 23 and 24, the semiconductor integrated circuit 2300 according to the present embodiment includes a plurality of differential amplifier circuits (PA1 through PAn) 1710 (where n: whole number indicative of the number of connecting stages of differential amplifier circuits PA). An output (P0n2) of the final-stage differential amplifier circuit PAn is connected to an automatic gain control (AGC) circuit 2310. Further, gain stabilizing circuits (PG21 through PG2n) 2330 are connected to their corresponding inputs of the differential amplifier circuits (PA1 through PAn) 1710 of the respective stages. Respective outputs ((PS11, PS12) through (PSn1, PSn2)) of the respective gain stabilizing circuits (PG21 through PG2n) 2330 are connected to their corresponding next-stage differential amplifier circuits (PA1 through PAn) 1710. An input PIN(1) and an input PIN(2) are connected to the first-stage gain stabilizing circuit (PG21) 2330.

Incidentally, since the differential amplifier circuits (PA1 through PAn) 1710 laid out at the respective stages may take configurations identical to those designated at the same reference numerals shown in FIGS. 17 and 18, the description of their details is omitted. A connecting line 2340 for inputting a bias signal (PB) is connected to the gain stabilizing circuits (PG21 through PG2n) 2330 and the differential amplifier circuits (PA1 through PAn) 1710. Further, an output 2350 of the automatic gain control (AGC) circuit 2310 is connected to the respective differential amplifier circuits (PA1 through PAn) 1710.

One gain stabilizing circuit (PG21) 2330 will be explained as a representative of the gain stabilizing circuits (PG21(PG22 through PG2n)) 2330. The gain stabilizing circuit (PG21) 2330 has a PMOS transistor 2332 of which the source terminal is connected to a power supply VDD via a resistor 2331 and the drain terminal is connected to a ground GND, and a PMOS transistor 2334 of which the source terminal is connected to the power supply VDD via a resistor 2333 and the drain terminal is connected to the ground GND. Gate terminals of the PMOS transistors 2332 and 2334 are respectively connected to the input PIN(1) and the input PIN(2). Connecting points 2335 and 2336 of the source terminals of these PMOS transistors 2332 and 2334 and the resistors 2331 and 2333 respectively constitute outputs ((PS11), (PS12)) of the gain stabilizing circuit (PG21) 2330 and are respectively connected to the differential amplifier circuit (PA1) 1710 of the same stage.

Incidentally, the gain stabilizing circuits (PG22 through PG2n) starting forward from the following stage also have configurations similar to the gain stabilizing circuit (PG21) but are different from one another in that outputs (P011 through P0(n-1)1) and (P012 through P0(n-1)2) of the differential amplifier circuits 1710 placed in pre-stages respectively are connected to their corresponding gate terminals of the PMOS transistors 2332 and 2334 disposed in the gain stabilizing circuits (PG22 through PG2n). The differential amplifier circuit (PA1) 1710 connected to the outputs (PS11) 2335 and (PS12) 2336 of the gain stabilizing circuit PG21 includes PMOS transistors 1771 and 1772 whose gate terminals are connected with these outputs 2335 and 2336 respectively.

An output signal P0n2 outputted from the output 1777 of the differential amplifier circuit (PAn) 1710 laid out at the last stage shown in FIG. 24 is inputted to the automatic gain control (AGC) circuit 2310. The automatic gain control (AGC) circuit 2310 includes a PMOS transistor 2412 having a source terminal connected to the power supply VDD via a resistor 2410 and a drain terminal connected to the ground GND. A connecting point 2350 of the source terminal of the PMOS transistor 2412 and the resistor 2410 is connected to the ground GND via a condenser 2414 and constitutes an output 2350 of the automatic gain control (AGC) circuit 2310. The output 2350 is connected to the differential amplifier circuits (PA1 through PAn) 1710 so that a gain control signal (AGC) is supplied thereto respectively.

The operation of the semiconductor integrated circuit 2300 according to the present embodiment will be explained under the above configuration. A sine wave is first inputted to the input PIN(1). A sine wave antiphase to the sine wave at the input PIN(1) is inputted to the input PIN(2). Further, a signal amplified by each of the differential amplifier circuits (PA1 through PAn) 1710 is transmitted to the automatic gain control (AGC) circuit 2310 as an output signal (P0n2) of the final-stage differential amplifier circuit (PAn) 1710. At this time, the input signals PIN(1) and PIN(2) are inputted to their corresponding gate terminals of the PMOS transistors 2332 and 2334 of the gain stabilizing circuit (PG21) 2330. Output signals (P011 through P0(n-1)1) and (P012 through P0(n-1)2) of the differential amplifier circuits 1710 are inputted to their corresponding gate terminals of the PMOS transistors 2332 and 2334 of the gain stabilizing circuits (PG22 through PG2n) 2330.

In the gain stabilizing circuits (PG21 through PG2n) 2330, these input signals are respectively varied by VT variations in a manner similar to an AGC potential to be described later and raised by VT potentials of PMOSs, which in turn are respectively outputted from the gain stabilizing circuits (PG21 through PG2n) 2330 as outputs (PS11 through PSn1) and outputs (PS12 through PSn2). These signals (PS11 through PSn1) and signals (PS12 through PSn2) are inputted to their corresponding gate terminals of the PMOS transistors 1771 and 1772 of the differential amplifier circuits (PA1 through PAn) 1710. The output signal (P0n2) 1777 of the final-stage differential amplifier circuit (PAn) 1710 is increased by a PMOS's VT potential by means of the PMOS transistor 2412 of the AGC circuit 2310 and the Low-side peak of the amplified sine wave is detected by the condenser 2414, after which a gain control signal AGC is outputted to the output 2350. The gain control signal (AGC) is inputted to the gate terminals of the PMOS transistors 1773 and 1774 of the differential amplifier circuits (PA1 through PAn) 1710.

When the potential (AGC potential) of the gain control signal (AGC) 2350 is sufficiently higher than the potentials of the signals inputted to the gate terminals of the PMOS transistors 1771 and 1772 in the differential amplifier circuits (PA1 through PAn) 1710, the currents equivalent to ½ of current values defined by the PMOS transistors 1770 respectively flow into the PMOS transistors 1771 and 1772. The gains and potentials of the output signals (P011 through P0n1) and (P012 through P0n2) are respectively determined based on the current values of the PMOS transistors 1771 and 1772 and the resistance values of the resistors (PR11 through PRn1) 1776 and resistors (PR12 through PRn2) 1778.

When the gain control signal (AGC) 2350 becomes low, the current flows into each of the PMOS transistors 1773 and 1774. Therefore, the currents that flow through the PMOS transistors 1771 and 1772 become small and hence the gains of the output signals (P011 through P0n1) and (P012 through P0n2) become low. At this time, their output potentials remain unchanged. Thus, gain control is carried out by the gain control signal (AGC) 2350 regardless of the magnitudes of the amplitudes of the input signals PIN(1) and PIN(2), whereby a stable output signal is obtained.

According to the above embodiment as mentioned above, the semiconductor integrated circuit 2300 is provided with the gain stabilizing circuits (PG21 through PG2n) 2330 respectively. Therefore, even when the VTs of PMOSs vary and the AGC potential varies with the variations, the input PIN(1) and input PIN(2) and the output signals (P011 through P0(n-1)1) 1775 and (P012 through P0(n-1)2) 1777 of the differential amplifier circuits 1710 are changed by VT variations in the gain stabilizing circuits (PG21 through PG2n) 2330 in a manner similar to the AGC potential. The so-changed signals are respectively outputted as the outputs (PS11 through PSn1) and (PS12 through PSn2) and inputted to the gate terminals of the PMOS transistors 1771 and 1772 of the differential amplifier circuits (PA1 through PAn) 1710, so that a stable output can be obtained.

Figure 26:
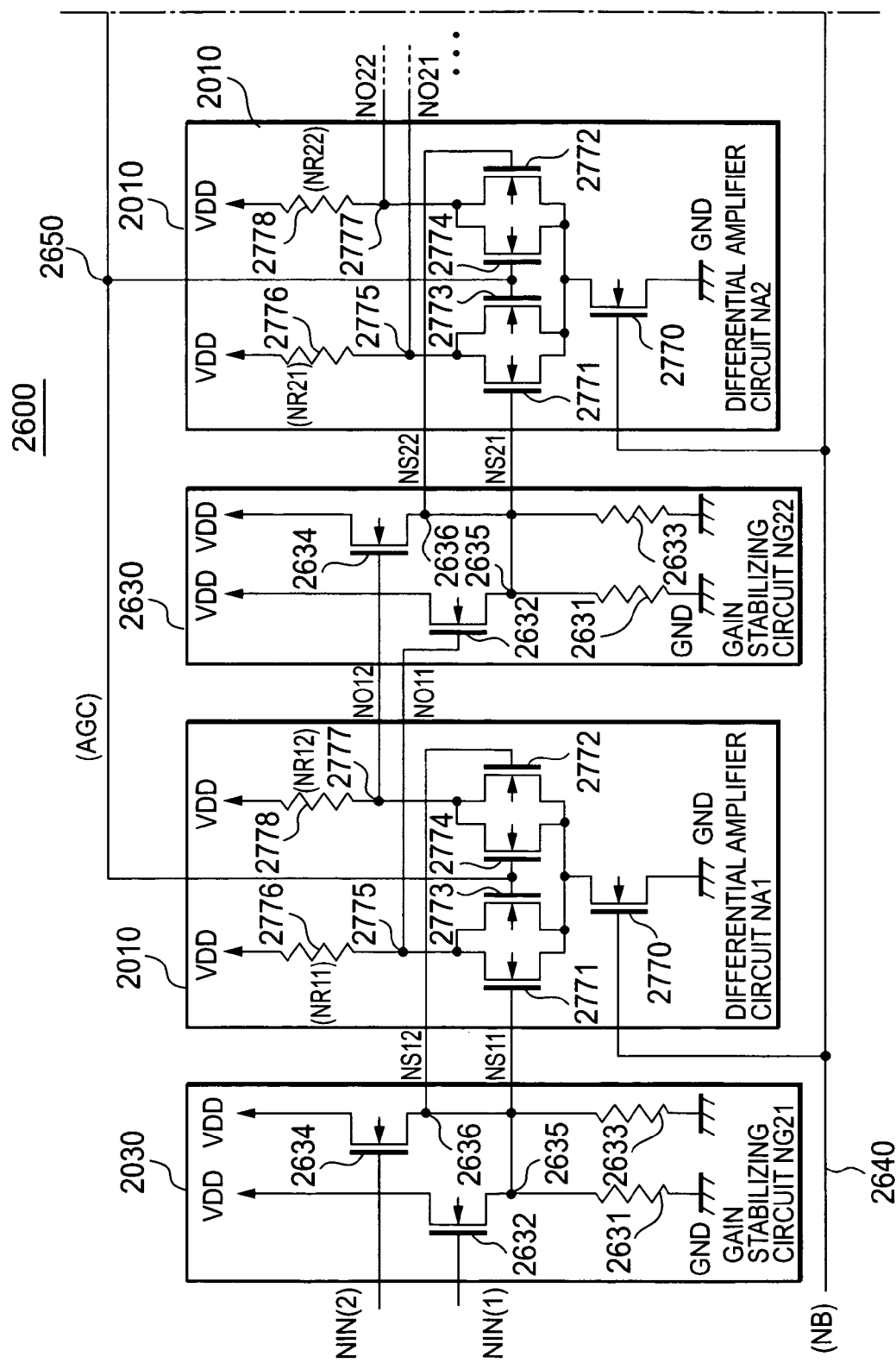
FIG. 26 is a circuit diagram depicting a still further embodiment of a semiconductor integrated circuit in combination with FIG. 27.
Figure 27:
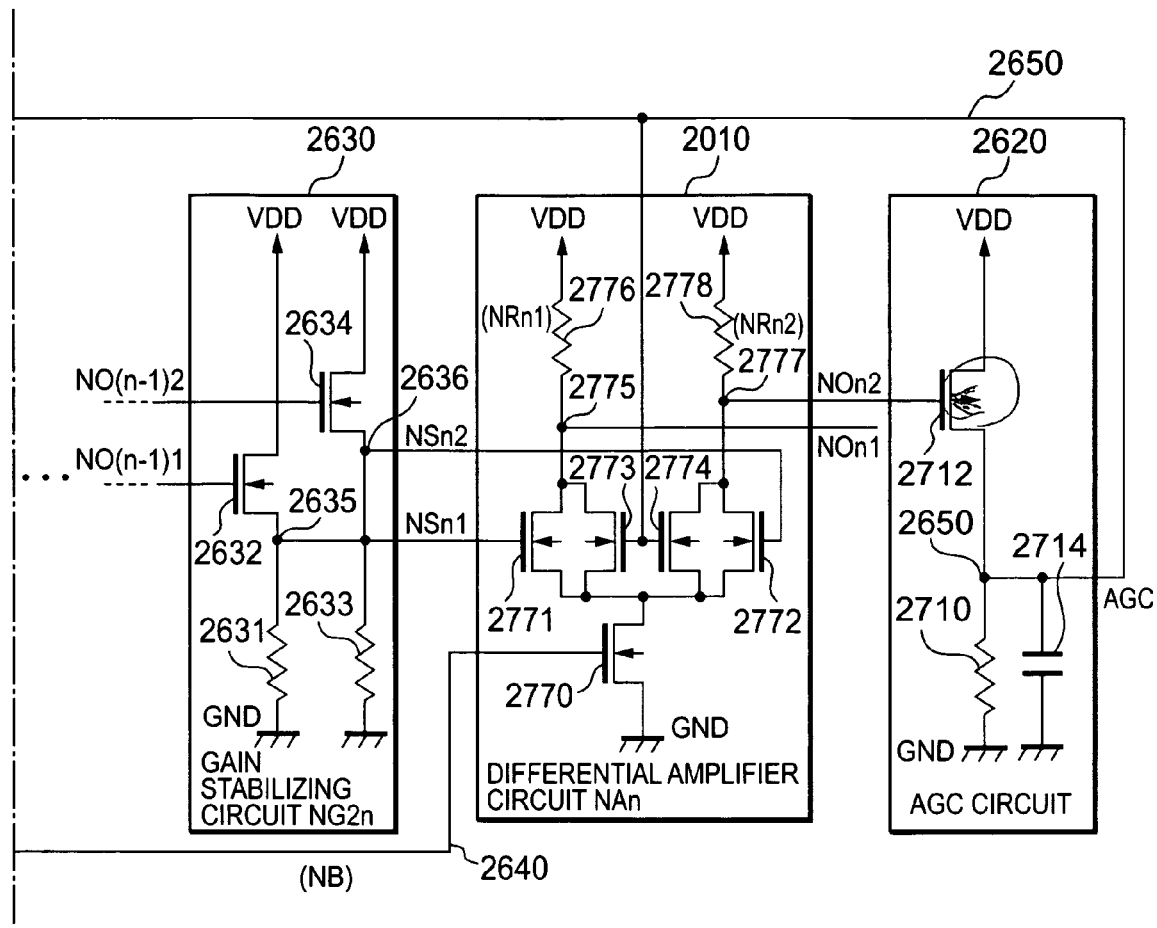
FIG. 27 is a circuit diagram illustrating a still further embodiment of a semiconductor integrated circuit in combination with FIG. 26.
Figure 28:
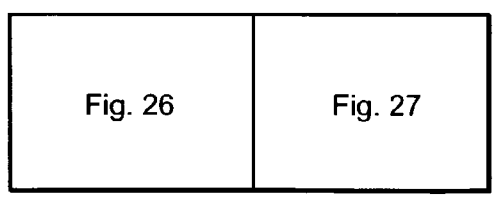
FIG. 28 is a diagram showing a combined state of FIGS. 26 and 27.

A still further embodiment of a semiconductor integrated circuit will next be explained. The semiconductor integrated circuit according to the present embodiment is shown in FIGS. 26 and 27. Incidentally, both figures are combined together as shown in FIG. 28. As shown in FIGS. 26 and 27, the semiconductor integrated circuit 2600 according to the present embodiment includes a plurality of differential amplifier circuits (NA1 through NAn) 2010 (where n: whole number indicative of the number of connecting stages of differential amplifier circuits NA). An output (N0n2) of the final-stage differential amplifier circuit NAn is connected to an automatic gain control (AGC) circuit 2620. Further, gain stabilizing circuits (NG21 through NG2n) 2630 are connected to their corresponding inputs of the differential amplifier circuits (NA1 through NAn) 2010 of the respective stages. Respective outputs ((NS11, NS12) through (NSn1, NSn2)) of the respective gain stabilizing circuits (NG21 through NG2n) 2630 are connected to their corresponding next-stage differential amplifier circuits (NA1 through NAn) 2010. An input NIN(1) and an input NIN(2) are connected to the first-stage gain stabilizing circuit (NG21) 2630.

Incidentally, since the differential amplifier circuits (NA1 through NAn) 2010 laid out at the respective stages may take configurations identical to those designated at the same reference numerals shown in FIGS. 20 and 21, the description of their details is omitted. A connecting line 2640 for inputting a bias signal (NB) is connected to the gain stabilizing circuits (NG21 through NG2n) 2630 and the differential amplifier circuits (NA1 through NAn) 2010. Further, an output 2650 of the automatic gain control (AGC) circuit 2620 is connected to the respective differential amplifier circuits (NA1 through NAn) 2010.

One gain stabilizing circuit (NG21) 2630 will be explained as a representative of the gain stabilizing circuits (NG21 (NG22 through NG2n)). The gain stabilizing circuit (NG21) has an NMOS transistor 2632 of which the source terminal is connected to a ground GND via a resistor 2631 and the drain terminal is connected to a power supply VDD, and an NMOS transistor 2634 of which the source terminal is connected to the ground GND via a resistor 2633 and the drain terminal is connected to the power supply VDD. Gate terminals of the NMOS transistors 2632 and 2634 are respectively connected to the input NIN(1) and the input NIN(2). Connecting points 2635 and 2636 of the drain terminals of these NMOS transistors 2632 and 2634 respectively constitute outputs ((NS11), (NS12)) of the gain stabilizing circuit (NG21) and are respectively connected to the differential amplifier circuit (NA1) 2010 of the same stage.

Incidentally, the gain stabilizing circuits (NG22 through NG2n) 2630 starting forward from the following stage also have configurations similar to the gain stabilizing circuit (NG21) but are different from one another in that outputs (N011 through N0(n-1)1) and (N012 through N0(n-1)2) of the differential amplifier circuits 2010 placed in pre-stages respectively are connected to their corresponding gate terminals of the NMOS transistors 2632 and 2634 disposed in the gain stabilizing circuits (NG22 through NG2n). The differential amplifier circuit (NA1) 2010 connected to the outputs (NS11) 2635 and (NS12) 2636 of the gain stabilizing circuit NG21 includes NMOS transistors 2771 and 2772 whose gate terminals are connected with these outputs 2635 and 2636 respectively.

An output signal N0n2 outputted from the output 2777 of the differential amplifier circuit (NAn) 2010 laid out at the last stage shown in FIG. 27 is inputted to the automatic gain control (AGC) circuit 2620. The automatic gain control (AGC) circuit 2620 includes an NMOS transistor 2712 having a source terminal connected to the ground GND via a resistor 2710 and a drain terminal connected to the power supply VDD. A connecting point 2650 of the source terminal of the NMOS transistor 2712 and the resistor 2710 is connected to the ground GND via a condenser 2714 and constitutes an output 2650 of the automatic gain control (AGC) circuit 2620. The output 2650 is connected to the differential amplifier circuits (NA1 through NAn) 2010 so that a gain control signal (AGC) is supplied thereto respectively.

The operation of the semiconductor integrated circuit 2600 according to the present embodiment will be explained under the above configuration. A sine wave is first inputted to the input NIN(1). A sine wave antiphase to the sine wave at the input NIN(1) is inputted to the input NIN(2). Further, a signal amplified by each of the differential amplifier circuits (NA1 through NAn) 2010 is transmitted to the automatic gain control (AGC) circuit 2620 as an output signal (N0n2) of the final-stage differential amplifier circuit (NAn) 2010. At this time, the input signals NIN(1) and NIN(2) are inputted to their corresponding gate terminals of the NMOS transistors 2632 and 2634 of the gain stabilizing circuit (NG21) Output signals (N011 through N0(n-1)1) and (N012 through N0(n-1)2) of the differential amplifier circuits 2010 are inputted to their corresponding gate terminals of the NMOS transistors 2632 and 2634 of the gain stabilizing circuits (NG22 through NG2n).

In the gain stabilizing circuits (NG21 through NG2n) 2630, these input signals are respectively varied by VT variations in a manner similar to an AGC potential to be described later and reduced by VT potentials of NMOSs, which in turn are respectively outputted from the gain stabilizing circuits (NG21 through NG2n) 2630 as outputs (NS11 through NSn1) and outputs (NS12 through NSn2).

The signals (NS11 through NSn1) and signals (NS12 through NSn2) outputted from the gain stabilizing circuits (NG21 through NG2n) are inputted to their corresponding gate terminals of the NMOS transistors 2771 and 2772 of the differential amplifier circuits (NA1 through NAn). The output signal (N0n2) 2777 of the final-stage differential amplifier circuit (NAn) 2010 is reduced by an NMOS's VT potential by means of the NMOS transistor 2712 of the AGC circuit 2620 and the High-side peak of the amplified sine wave is detected by the condenser 2714, after which a gain control signal AGC is outputted to the output 2650. The gain control signal (AGC) is inputted to the gate terminals of the NMOS transistors 2773 and 2774 of the differential amplifier circuits (NA1 through NAn) 2010.

When the potential (AGC potential) of the gain control signal (AGC) 2650 is sufficiently lower than the potentials of the signals inputted to the gate terminals of the NMOS transistors 2771 and 2772 in the differential amplifier circuits (NA1 through NAn) 2010, the currents equivalent to ½ of current values defined by the NMOS transistors 2770 respectively flow into the NMOS transistors 2771 and 2772.

The gains and potentials of the output signals (N0l1 through N0n1) and (N0l2 through N0n2) are respectively determined based on the current values of the NMOS transistors 2771 and 2772 and the resistance values of the resistors (NR11 through NRn1) 2776 and resistors (NR12 through NRn2) 2778.

When the gain control signal (AGC) 2650 becomes low, the current flows into each of the NMOS transistors 2773 and 2774. Therefore, the currents that flow through the NMOS transistors 2771 and 2772 become small and hence the gains of the output signals (N0l1 through N0n1) and (N0l2 through N0n2) become low. At this time, their output potentials remain unchanged. Thus, gain control is carried out by the gain control signal (AGC) 2650 regardless of the magnitudes of the amplitudes of the input signals NIN(1) and NIN(2), whereby a stable output signal is obtained.

According to the above embodiment as mentioned above, the semiconductor integrated circuit 2600 is provided with the gain stabilizing circuits (NG21 through NG2n) 2630 respectively. Therefore, even when the VTs of NMOSs vary and the AGC potential varies with the variations, the input NIN(1) and input NIN(2) and the output signals (N0l1 through N0(n-1)1) 2775 and (N0l2 through N0(n-1)2) 2777 of the differential amplifier circuits 2010 are changed by VT variations in the gain stabilizing circuits (NG21 through NG2n) 2030 in a manner similar to the AGC potential. The so-changed signals are respectively outputted as the outputs (NS11 through NSn1) and (NS12 through NSn2) and inputted to the gate terminals of the NMOS transistors 2771 and 2772 of the differential amplifier circuits (NA1 through NAn) 2010, so that a stable output can be obtained.

Although the embodiment shown in FIGS. 17 and 18 is configured so as to have the differential amplifier circuits ((PA1) through (PAn)) 1710, the gain stabilizing circuits ((PG11) through (PG1n)) 1730 and the AGC circuit 1720, the semiconductor integrated circuit 1700 may be provided with the AGC circuit 2310 shown in FIG. 24 as an alternative to the AGC circuit 1720. As an alternative to the gain stabilizing circuits 1730 employed in the embodiment shown in FIGS. 17 and 18, the semiconductor integrated circuit 1700 may be provided with the gain stabilizing circuits ((PG21) through (PG2n)) 2330 shown in FIGS. 23 and 24.

Although the embodiment shown in FIGS. 20 and 21 is configured so as to include the differential amplifier circuits ((NA1) through (NAn)), the gain stabilizing circuits ((NG11) through (NG1n)) and the AGC circuit 2020, the semiconductor integrated circuit 2000 may be provided with the AGC circuit 2620 shown in FIG. 27 as an alternative to the AGC circuit 2020. As an alternative to the gain stabilizing circuits 2030 employed in the embodiment shown in FIGS. 20 and 21, the semiconductor integrated circuit 2000 may be provided with the gain stabilizing circuits ((NG21) through (NG2n)) 2630 shown in FIGS. 26 and 27.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor integrated circuit, comprising:

a plurality of differential amplifier circuits which amplify input signals, said differential amplifier circuits being connected in series respectively;

a detection which detects an output signal outputted from the final-stage differential amplifier circuit of the plurality of differential amplifier circuits and outputs a detect signal therefrom;

a bias circuit which generates a bias signal;

a source follower circuit which inputs the bias signal and outputs a signal for compensating for a variation in threshold value of the detection circuit; and a comparator which compares the detect signal outputted from the detection circuit and the output signal of the source follower circuit.

2. A semiconductor integrated circuit according to claim 1, wherein the detection circuit includes a first constant current source circuit and a first transistor both series-connected between a power supply node and a ground node via a first common connecting node, a capacitive element is connected between the first common connecting node and the ground node, the first common connecting node forms the output of the detection circuit and outputs the detect signal, the output signal of the final-stage differential amplifier circuit is supplied to the first transistor, and the source follower circuit includes a second constant current source circuit and a second transistor of the same conduction type as that of the first transistor, which are connected in series between the power supply node and the ground node via a second common connecting node, and the second common connecting node forms the output of the source follower circuit and outputs an output signal to the comparator.

3. A semiconductor integrated circuit according to claim 2, wherein the first constant current source circuit is connected between the power supply node and the first common connecting node, the first transistor is a P channel type MOS transistor having a first control electrode supplied with the output signal of the final-stage differential amplifier circuit, a first electrode connected to the first common connecting node, and a second electrode connected to the ground node, the second constant current source circuit is connected between the power supply node and the second common connecting node, and the second transistor is a P channel type MOS transistor having a second control electrode supplied with the bias signal, a third electrode connected to the second common connecting node and a fourth electrode connected to the ground node.

4. A semiconductor integrated circuit according to claim 2, wherein the first constant current source circuit is connected between the ground node and the first common connecting node, the first transistor is an N channel type MOS transistor having a first control electrode supplied with the output signal of the final-stage differential amplifier circuit, a first electrode connected to the first common connecting node and a second electrode connected to the power supply node, the second constant current source circuit is connected between the ground node and the second common connecting node, and the second transistor is an N channel type MOS transistor having a second control electrode supplied with the bias signal, a third electrode connected to the second common connecting node and a fourth electrode connected to the power supply node.

* * * * *